(12) United States Patent
Bando et al.

(10) Patent No.: US 10,056,309 B2
(45) Date of Patent: Aug. 21, 2018

(54) ELECTRONIC DEVICE

(71) Applicant: Renesas Electronics Corporation, Koutou-ku, Tokyo (JP)

(72) Inventors: Koji Bando, Tokyo (JP); Akira Muto, Tokyo (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 15/655,617

(22) Filed: Jul. 20, 2017

(65) Prior Publication Data

US 2018/0047649 A1 Feb. 15, 2018

(30) Foreign Application Priority Data

Aug. 10, 2016 (JP) .................. 2016-157973

(51) Int. Cl.
*H01L 23/053* (2006.01)
*H01L 23/057* (2006.01)
(Continued)

(52) U.S. Cl.
CPC .......... *H01L 23/053* (2013.01); *H01L 23/057* (2013.01); *H01L 23/4334* (2013.01); *H01L 23/49513* (2013.01); *H01L 23/49524* (2013.01); *H01L 23/49562* (2013.01); *H01L 23/49575* (2013.01); *H01L 23/50* (2013.01); *H01L 24/32* (2013.01); *H01L 24/33* (2013.01); *H01L 24/40* (2013.01); *H01L 24/48* (2013.01);
(Continued)

(58) Field of Classification Search
CPC ... H01L 23/053; H01L 23/057; H01L 23/495; H01L 25/07; H01L 25/18
See application file for complete search history.

(56) References Cited

U.S. PATENT DOCUMENTS

2005/0218489 A1 10/2005 Satou et al.
2010/0078783 A1 4/2010 Otremba
(Continued)

FOREIGN PATENT DOCUMENTS

| JP | 2005-294464 A | 10/2005 |
| JP | 2011-216822 A | 10/2011 |
| JP | 2015-050356 A | 3/2015 |

OTHER PUBLICATIONS

Extended European search report for European Patent Application No. 17182397.4, dated Dec. 20, 2017.

*Primary Examiner* — Mark Prenty
(74) *Attorney, Agent, or Firm* — Shapiro, Gabor and Rosenberger, PLLC

(57) ABSTRACT

Each of first and second semiconductor devices mounted on a substrate includes an emitter terminal electrically connected with a front surface electrode of a semiconductor chip and exposed from a main surface of a sealing body located on a front surface side of the semiconductor chip. Each of the first and second semiconductor devices includes a collector terminal electrically connected with a back surface electrode of the semiconductor chip and exposed from the main surface of the sealing body located on a back surface side of the semiconductor chip. The collector terminal of the first semiconductor device is electrically connected with the emitter terminal of the second semiconductor device via a conductor pattern formed on an upper surface of the substrate.

18 Claims, 29 Drawing Sheets

(51) Int. Cl.

| | |
|---|---|
| *H01L 23/495* | (2006.01) |
| *H01L 23/50* | (2006.01) |
| *H01L 23/00* | (2006.01) |
| *H01L 25/07* | (2006.01) |
| *H01L 25/18* | (2006.01) |
| *H01L 23/433* | (2006.01) |
| *H01L 25/11* | (2006.01) |
| *H02M 7/00* | (2006.01) |
| *H01L 23/31* | (2006.01) |
| *H01L 29/739* | (2006.01) |
| *H01L 29/78* | (2006.01) |
| *H01L 29/861* | (2006.01) |
| *H01L 23/373* | (2006.01) |

(52) U.S. Cl.
CPC ............ *H01L 24/73* (2013.01); *H01L 25/072* (2013.01); *H01L 25/115* (2013.01); *H01L 25/18* (2013.01); *H02M 7/003* (2013.01); *H01L 23/3107* (2013.01); *H01L 23/3735* (2013.01); *H01L 29/7395* (2013.01); *H01L 29/7802* (2013.01); *H01L 29/8611* (2013.01); *H01L 2224/05554* (2013.01); *H01L 2224/32245* (2013.01); *H01L 2224/33181* (2013.01); *H01L 2224/40101* (2013.01); *H01L 2224/40137* (2013.01); *H01L 2224/48091* (2013.01); *H01L 2224/48175* (2013.01); *H01L 2224/73213* (2013.01); *H01L 2224/73215* (2013.01); *H01L 2224/73263* (2013.01); *H01L 2224/73265* (2013.01); *H01L 2924/12036* (2013.01); *H01L 2924/13055* (2013.01); *H01L 2924/13091* (2013.01)

(56) References Cited

U.S. PATENT DOCUMENTS

| | | |
|---|---|---|
| 2011/0241198 A1 | 10/2011 | Azuma |
| 2011/0278643 A1 | 11/2011 | Sato |
| 2012/0241953 A1 | 9/2012 | Yamada et al. |
| 2015/0060940 A1 | 3/2015 | Muto et al. |
| 2016/0013163 A1* | 1/2016 | Muto ................ H01L 23/49562 257/140 |
| 2018/0047649 A1* | 2/2018 | Bando ................ H01L 23/053 |

* cited by examiner

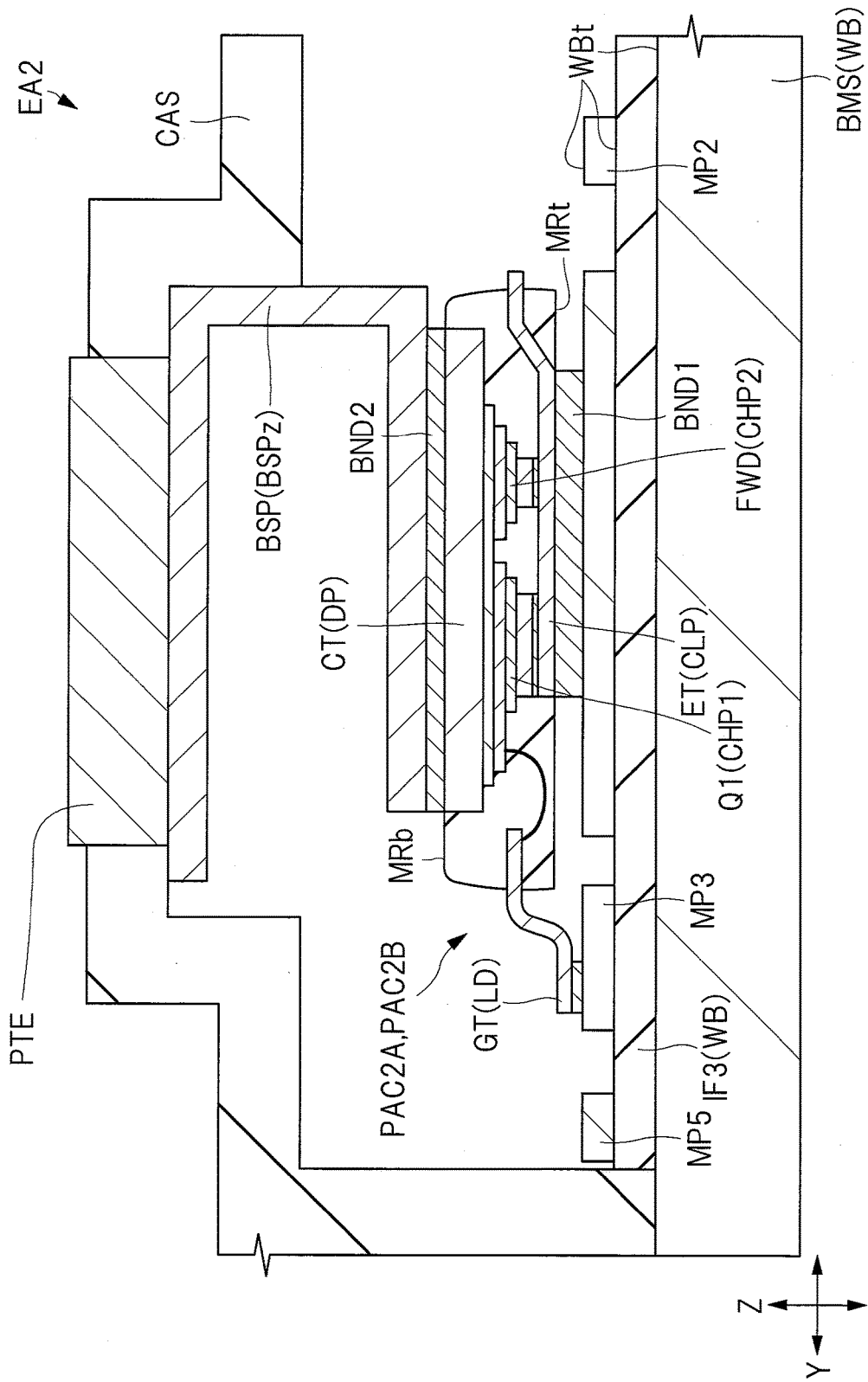

ELECTRONIC DEVICE

CROSS-REFERENCE TO RELATED APPLICATION

The present application claims priority from Japanese Patent Application No. 2016-157973 filed on Aug. 10, 2016, the content of which is hereby incorporated by reference into this application.

TECHNICAL FIELD OF THE INVENTION

The present invention relates to an electronic device (semiconductor module) and, for example, relates to a technique effectively applied to an electronic device in which a plurality of semiconductor devices are mounted on a substrate.

BACKGROUND OF THE INVENTION

Japanese Patent Application Laid-open No. 2015-50356 (Patent Document 1) discloses such a semiconductor device that a plurality of semiconductor devices are mounted on a circuit board, and that a semiconductor chip forming an insulated gate bipolar transistor (IGBT) and a semiconductor chip forming a diode are sealed in the semiconductor device.

Japanese Patent Application Laid-open No. 2011-216822 (Patent Document 2) describes a semiconductor module in which extraction electrodes are connected with front and back surface sides of a semiconductor element.

Japanese Patent Application Laid-open No. 2005-294464 (Patent Document 3) describes a semiconductor device in which a plurality of semiconductor chips each having a field effect transistor are mounted on a conductor pattern.

SUMMARY OF THE INVENTION

A power conversion circuit such as an inverter circuit is incorporated in an electric power supply system that drives air conditioning devices, automobiles, various industrial equipment, and the like. An example of configuration of this power conversion circuit includes an electronic device (a power conversion device, a semiconductor module) in which a plurality of semiconductor chips having transistors (power transistors) operating as switch elements are mounted on one substrate and electrically connected with each other.

An aspect of an electronic device includes a configuration in which a plurality of semiconductor chips directly mounted on a substrate are connected with each other via conductive members such as wirings or wires on the substrate. This configuration is effective for reducing a size of the electronic device. However, since a step of connecting a conductive member such as a wire to an electrode of the semiconductor chip or a step of sealing a periphery of the semiconductor chip is performed on the substrate of the electronic device, there is still a room for improvement from the viewpoint of manufacturing efficiency or reliability.

Accordingly, the inventors of the present application have studied a mode in which a plurality of semiconductor packages (semiconductor devices) each resin-sealing a semiconductor chip are mounted on a substrate (hereinafter referred to as a package mounting method) in pace of a mode in which a plurality of semiconductor chips are directly mounted on a substrate (hereinafter referred to as a bare chip mounting method). In a case of the package mounting method, the step of connecting the conductive member such as a wire to the electrode of the semiconductor chip or the step of sealing the periphery of the semiconductor chip is performed in advance before mounting the semiconductor package on the substrate. Therefore, from the viewpoint of manufacturing efficiency or reliability of the electronic device, the package mounting method is preferable to the bare chip mounting method.

However, when the improvement in performance of the package mounting method is considered, there is still a room for further improvement somewhere else. For example, an external terminal of the electronic device is connected with the electrode of a semiconductor chip via a terminal of the semiconductor package. Therefore, depending on a layout etc. of the semiconductor package, electrical characteristics of an internal circuit in the electronic device can be improved.

Other problems and novel features will be understood from the description in this specification and the accompanying drawings.

An electronic device according to an embodiment includes first and second semiconductor devices mounted on a first surface of a substrate. Each of the first and second semiconductor devices includes a semiconductor chip having a front surface, a front surface electrode formed on the front surface, a back surface opposite the front surface, and a back surface electrode formed on the back surface. Also, each of the first and second semiconductor devices includes a sealing body having a first main surface and a second main surface opposite the first main surface, and sealing the semiconductor chip. Also, each of the first and second semiconductor devices includes: a front surface terminal electrically connected with the front surface electrode of the semiconductor chip and exposed from the first main surface of the sealing body located on a front surface side of the semiconductor chip; and a back surface terminal electrically connected with the back surface electrode of the semiconductor chip and exposed from the second main surface of the sealing body located on a back surface side of the semiconductor chip. Additionally, the back surface electrode of the first semiconductor device is electrically connected with the front surface electrode of the second semiconductor device via a first conductor pattern formed on the first surface of the substrate.

According to the above embodiment, the performance of the semiconductor device can be improved.

BRIEF DESCRIPTIONS OF THE DRAWINGS

FIG. 32 is a cross-sectional view taken along line C-C in FIG. 29.

DESCRIPTIONS OF THE PREFERRED EMBODIMENTS

Figure 1:
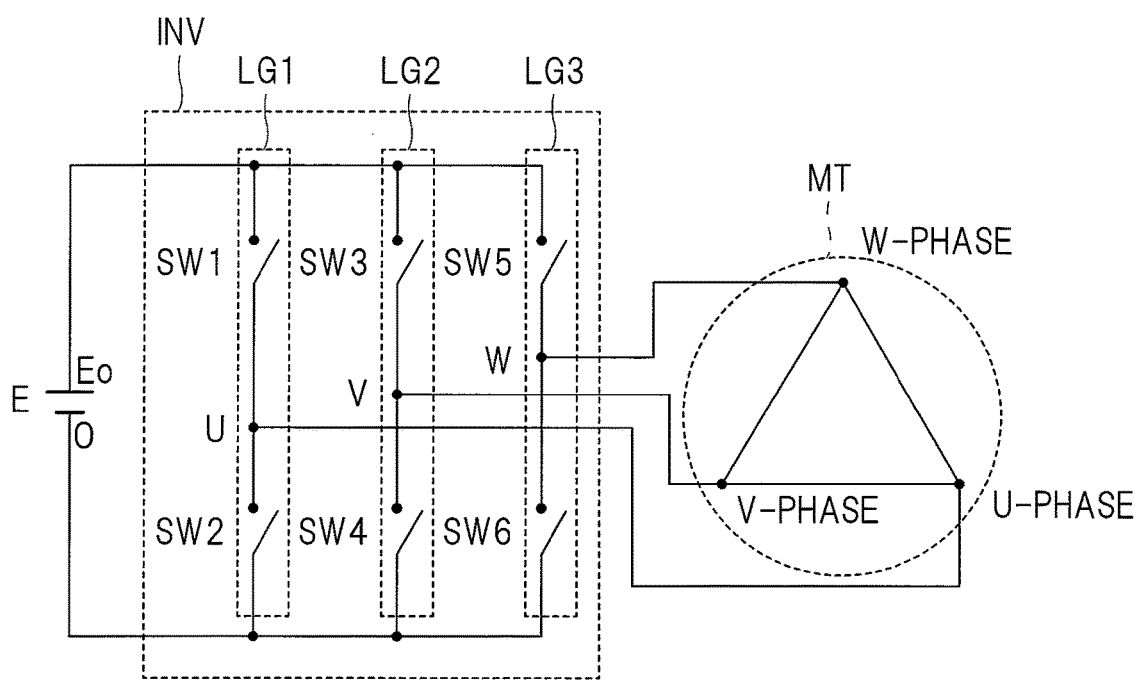
FIG. 1 is a circuit diagram in which a three-phase inverter circuit is arranged between a direct current power supply and a three-phase induction motor.

Description of Format, Basic Terms, and Description of Usage in the Present Application In this application, embodiments will be described in a plurality of sections or the like when required as a matter of convenience. However, these sections are not independent and irrelevant to each other unless otherwise stated, and the one relates to the entire or a part of the other as a detail, a modification example or the like regardless of the order of descriptions. In addition, the description of the same or similar portions is not repeated in principle. Further, the components in the embodiments are not always indispensable unless otherwise stated or except for the case where the components are logically limited to that number and the components are apparently indispensable from the context.

Similarly, in the description of the embodiments, the phrase "X made of A" for a material, a composition or the like is not intended to exclude those containing elements other than A unless otherwise specified and except for the case where it clearly contains only A from the context. For example, as for a component, it means "X containing A as a main component". For example, a "silicon member" or the like is not limited to pure silicon and it is obvious that the silicon member includes a member made of silicon germanium (SiGe) alloy, a member made of multicomponent alloy containing silicon as a main component, and a member containing other additives or the like. In addition, gold plating, a Cu layer, nickel plating or the like includes a member containing gold, Cu, nickel or the like as a main component as well as a pure one unless otherwise indicated clearly.

In addition, when referring to a specific value or amount, a value or amount larger or smaller than the specific value or amount is also applicable unless otherwise stated or except for the case where the value or amount is logically limited to the specific value or amount and the value or amount is apparently limited to the specific value or amount from the context.

Further, in the drawings for the embodiments, the same or similar components are denoted by the same or similar reference character or reference number, and the descriptions thereof are not repeated in principle.

In the accompanying drawings, a hatching or the like may be omitted even in a cross section if hatching makes the drawing more complicated or if it can be clearly distinguished from a gap. In connection with this, an outline (s) of a background may be omitted even if it is a hole closed in a plane, as long as it can be clearly understood from the explanation or the like. Furthermore, hatching and a dot pattern may be used in order to clarify that it is not a gap or to clearly indicate a boundary of a region, even if it is not a cross section.

First Embodiment

In the present embodiment, a power conversion device which is a semiconductor module having an inverter circuit (power conversion circuit) will be described as an example of an electronic device in which a plurality of semiconductor devices are mounted on a substrate.

The inverter circuit is a circuit that converts a direct current power to alternate current power. For example, when plus and minus currents of a direct current power supply are alternately outputted, a direction of the current is reversed in accordance with the alternate output. In this case, since the direction of the current alternately reverses, the output is considered to be alternate current power. This is the principle of the inverter circuit. Here, the alternate current power includes various forms represented by single-phase alternate current power and three-phase alternate current power. In this first embodiment, a three-phase inverter circuit which converts a direct current power to a three-phase alternate current power will be described as an example. However, a technical idea in this first embodiment is not limited to application to the three-phase inverter circuit, and can be widely applied to, for example, a single-phase inverter circuits.

Configuration of Three-Phase Inverter Circuit

FIG. 1 is a circuit diagram in which a three-phase inverter circuit INV is arranged between a direct current power supply and a three-phase induction motor MT. As shown in FIG. 1, the three-phase inverter circuit INV including six switches SW1 to SW6 is used in order to convert from a direct current power supply E to three-phase alternate current power. More specifically, as shown in FIG. 1, the three-phase inverter circuit INV includes: a leg LG1 in which the switch SW1 and the switch SW2 are connected in series; a leg LG2 in which the switch SW3 and the switch SW4 are connected in series; and a leg LG3 in which the switch SW5 and the switch SW6 are connected in series, and the leg LG1 to the leg LG3 are connected in parallel. At this occasion, the switch SW1, the switch SW3, and the switch SW5 constitute upper arms, and the switch SW2, the switch SW4, and the switch SW6 constitute lower arms. A point U between the switch SW1 and the switch SW2 and a U-phase of the three-phase induction motor MT are connected with each other. Likewise, a point V between the switch SW3 and the switch SW4 and a V-phase of the three-phase induction motor MT are connected with each other, and a point W between the switch SW5 and the switch SW6 and a W-phase of the three-phase induction motor MT are connected with each other. In this way, a three-phase inverter circuit INV is configured.

Circuit Operation

Figure 2:
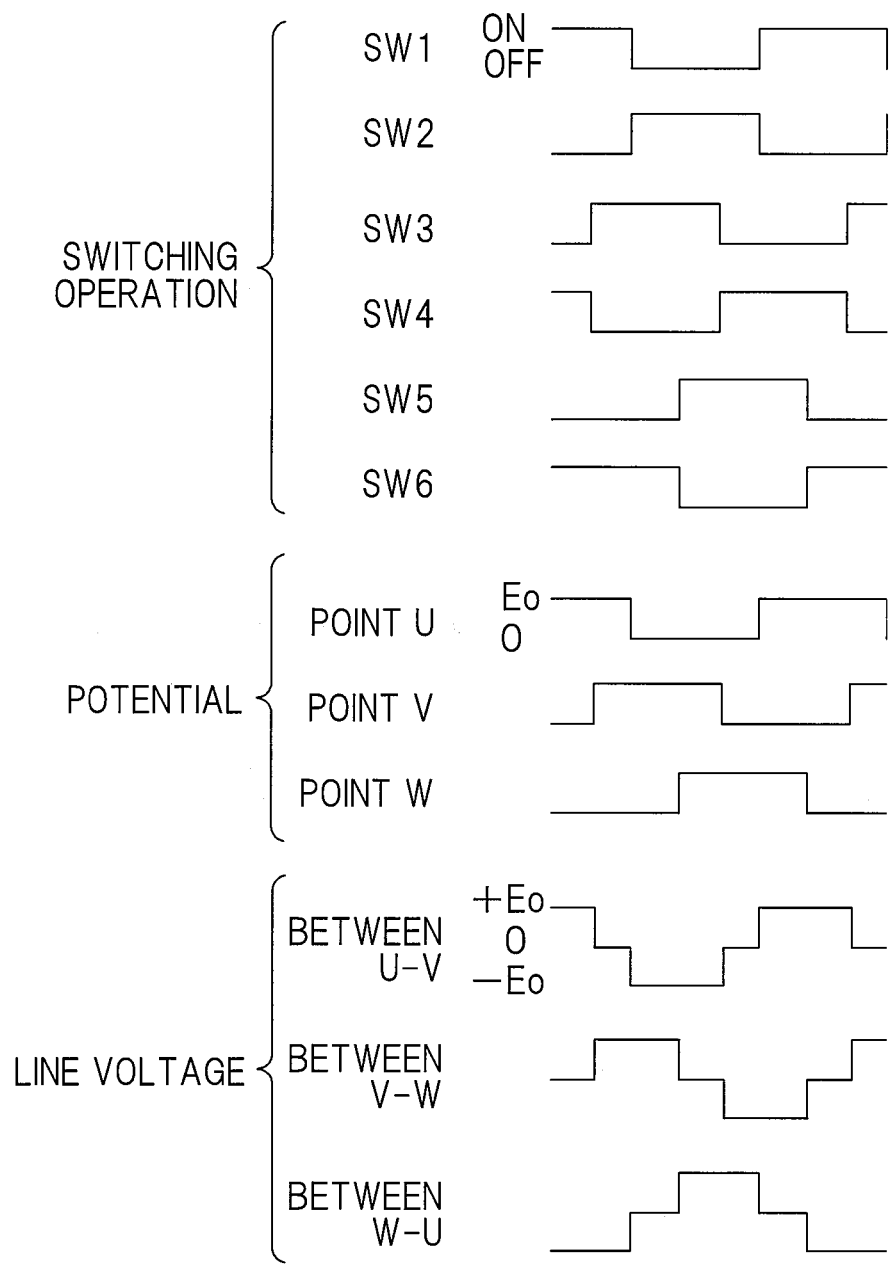
FIG. 2 is a timing chart for explaining an operation of the three-phase inverter circuit.

Subsequently, an operation of the three-phase inverter circuit INV having the above configuration will be described. FIG. 2 is a timing chart for explaining the operation of the three-phase inverter circuit INV. As shown in FIG. 2, in three-phase inverter circuit INV, the leg LG1 (see FIG. 1) constituted by the switch SW1 and the switch SW2 operates as follows. For example, when the switch SW1 is in an ON state, the switch SW2 is in an OFF state. When the switch SW1 is in an OFF state, the switch SW2 is in an ON state. Each of the leg LG2 (see FIG. 1) constituted by the switch SW3 and the switch SW4 and the leg LG3 constituted by the switch SW5 and the switch SW6 (see FIG. 1) also operates in the same manner as the leg LG1. More specifically, when the switch SW3 is in an ON state, the switch SW4 is in an OFF state. When the switch SW3 is in an OFF state, the switch SW4 is in an ON state. On the other hand, when the switch SW5 is in an ON state, the switch SW6 is in an OFF state. When the switch SW5 is in an OFF state, the switch SW6 is in an ON state.

As shown in FIG. 2, the switching operations of three sets of switch pairs (i.e., the legs LG1, LG2, and LG3 as shown in FIG. 1) are performed so as to have a phase difference of 120 degrees from one another. At this occasion, each potential of the point U, the point V, and the point W changes to 0 and $E_0$ according to the switching operations of the three sets of switch pairs. For example, a line voltage between the U-phase and the V-phase is obtained by subtracting the potential of the V-phase from the potential of the U-phase, and so draws a voltage waveform changing at $+E_0$, 0, and $-E_0$. A line voltage between the V-phase and the W-phase has a voltage waveform whose phase is shifted by 120 degrees with respect to that of the line voltage between the U-phase and the V-phase. Further, the line voltage between W-phase and U-phase is a voltage waveform whose phase is shifted by 120 degrees with respect to that of the line voltage between V-phase and W-phase. By performing the switching operation with the switches SW1 to SW6 in this manner, each line voltage becomes a stepwise alternate current voltage waveform, and an alternate current voltage waveform of each line voltage has a phase difference of 120 degrees. Therefore, according to the three-phase inverter circuit INV, the direct current power supplied from the direct current electric power supply E can be converted into the three-phase alternate current power.

Example of Configuration of Circuit

Figure 3:
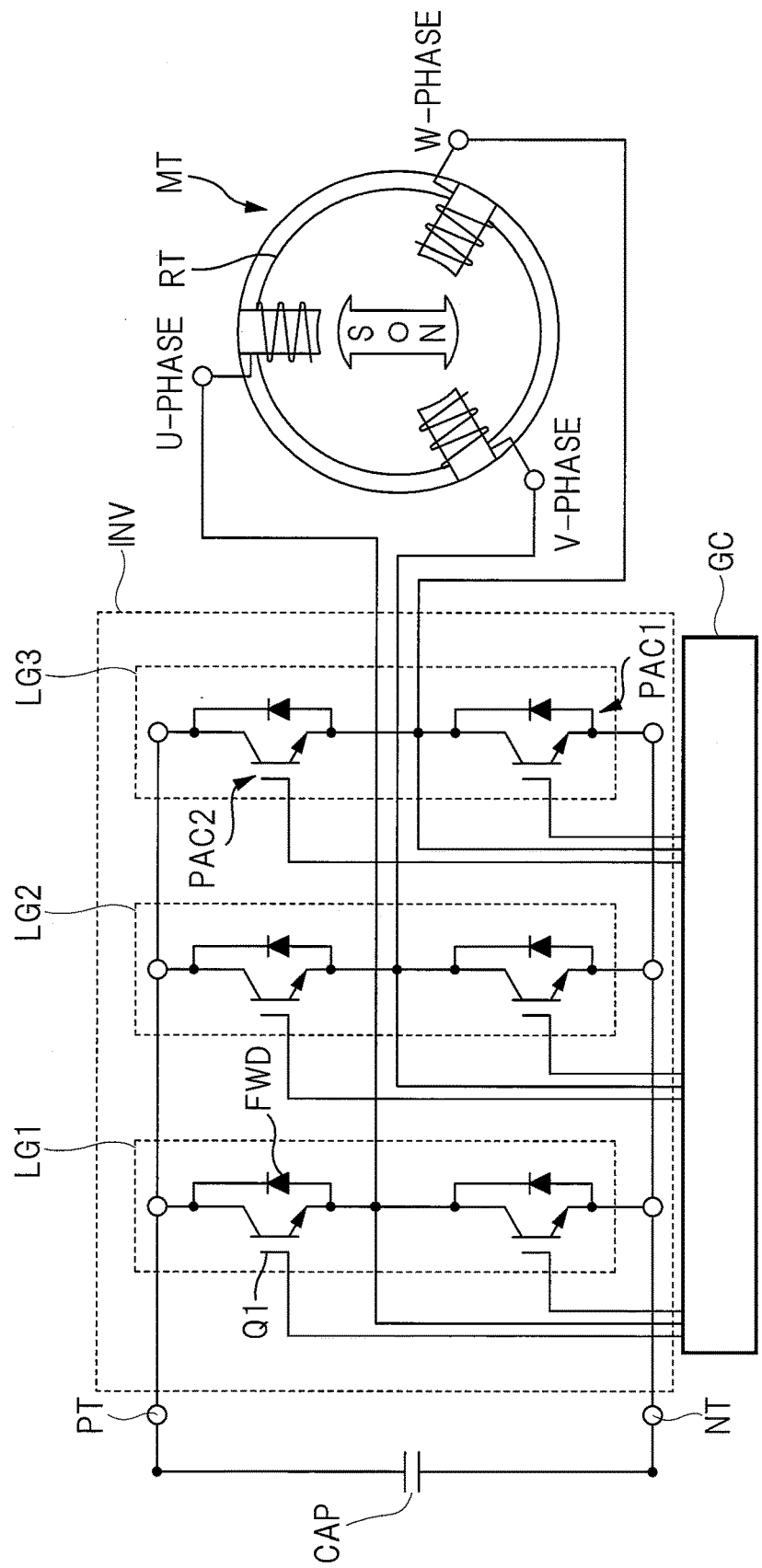
FIG. 3 is a circuit diagram showing a configuration of a motor circuit including an inverter circuit and a three-phase induction motor and according to a first embodiment.

The electronic device according to this first embodiment is used for a driving circuit of a three-phase induction motor used in, for example, automobiles, air conditioning devices (air conditioners), industrial equipment, or the like. This driving circuit includes an inverter circuit, and this inverter circuit is circuit having a function of converting direct current power into alternate current power. FIG. 3 is a circuit diagram showing a configuration of a motor circuit including an inverter circuit and a three-phase induction motor according to this first embodiment.

In FIG. 3, the motor circuit has a three-phase induction motor MT and an inverter circuit INV. The three-phase induction motor MT is configured to be driven by three-phase voltages different in phase. The three-phase induction motor MT uses a three-phase alternate current called U-phase, V-phase and W-phase having phases shifted by 120 degrees from one another to generate a rotating magnetic field around the rotor RT which is a conductor. In this case, a magnetic field rotates around rotor RT. This means that a magnetic flux crossing the rotor RT, which is the conductor, changes. As a result, electromagnetic induction occurs in rotor RT which is the conductor, and an induction current flows in the rotor RT. A flow of the induction current in the rotating magnetic field means that a force is applied to the rotor RT according to Fleming's left hand rule, and this force causes the rotor RT to rotate. In this way, the three-phase induction motor MT can rotate the rotor RT by using the three-phase alternate current. Therefore, the three-phase induction motor MT requires the three-phase alternate current. Thus, in the motor circuit, the three-phase alternate current is supplied to the three-phase induction motor by using the inverter circuit INV which produces an alternate current from a direct current.

An actual example of a configuration of the inverter circuit INV will be described below. As shown in FIG. 3, for example, the inverter circuit INV according to this first embodiment is provided with a transistor Q1 and a diode FWD corresponding to a three-phase. More specifically, in the actual inverter circuit INV, for example, each of the switch SW1 to the switch SW6 as shown in FIG. 1 is constituted by constituent elements in which the transistor Q1 and the diode FWD are connected in anti-parallel with each other as shown in FIG. 3. More specifically, in FIG. 3, each of the upper arm and the lower arm of the leg LG1, the upper arm and the lower arm of the leg LG2, the upper arm and the lower arm of the leg LG3 is constituted by constituent elements in which the transistor Q1 and the diode FWD are connected in anti-parallel with each other.

The transistor Q1 as shown in FIG. 3 is a power transistor (power circuit transistor) incorporated in a circuit in which a large current flows, such as a power conversion circuit. For example, in the example of the present embodiment, the transistor Q1 is an IGBT. In a modification, a power MOSFET (Metal Oxide Semiconductor Field Effect Transistor) may be used as a switching element of the inverter circuit INV. This power MOSFET is a voltage driven type in which an ON/OFF operation is controlled by a voltage applied to the gate electrode, and so has an advantage of being able to perform the high-speed switching operation. On the other hand, the power MOSFET has a property that, as a breakdown voltage becomes higher, an ON resistance becomes higher and a calorific value increases. This is because the breakdown voltage of the power MOSFET is ensured by increasing a thickness of a low concentration epitaxial layer (drift layer), but as the thickness of the low concentration epitaxial layer is becomes greater, the resistance increases as a side effect.

There is also a bipolar transistor that can handle high power as a switching element. But, since the bipolar transistor is a current driven type that controls the ON/OFF operation by using a base current, the bipolar transistor has a property that a switching speed of the bipolar transistor is generally lower than that of the aforementioned power MOSFET.

Therefore, in applications requiring a high power and high-speed switching, it is preferable to use an IGBT as a switching element. This IGBT is composed of a combination of a power MOSFET and a bipolar transistor, and is a semiconductor element having both high-speed switching characteristics of the power MOSFET and high breakdown voltage of the bipolar transistor. More specifically, since the high power and the high-speed switching are made possible, the IGBT can be said to be a semiconductor element that is suitable for applications requiring the high current and high-speed switching. Therefore, the IGBT is adopted as the transistor Q1 constituting the switching element in the inverter circuit INV in this first embodiment.

In the inverter circuit INV according to this first embodiment, the transistor Q1 and the diode FWD are connected in anti-parallel between a positive potential terminal (high side terminal) PT to which a relatively high potential is supplied and each phase (U-phase, V-phase, W-phase) of the three-phase induction motor MT. The transistor Q1 and the diode FWD are connected in anti-parallel between each phase of the three-phase induction motor MT and a negative potential terminal (low side terminal) NT to which a relatively low potential is supplied. More specifically, two transistors Q1 and two diodes FWD are provided for a single phase, and six transistors Q1 and six diodes FWD are provided in the three phases. A gate control circuit GC is connected with a gate electrode of each transistor Q1, and the switching operation of the transistor Q1 is controlled by this gate control circuit GC. In the inverter circuit INV configured as described above, the switching operation of the transistor Q1 is controlled by the gate control circuit GC, so that the direct current power is converted into the three-phase alternate current power, and this three-phase alternate current power is supplied to the three-phase induction motor MT.

In the inverter circuit INV according to this first embodiment, the transistor Q1 is used as a switching element, and in addition, the diode FWD is provided so as to be connected in anti-parallel with this transistor Q1. Simply from the viewpoint of realizing the switch function by the switching element, the transistor Q1 serving as the switching element is necessary, but the diode FWD is considered to be unnecessary. With regard to this point, when an inductance is included in a load connected with the inverter circuit INV, it is necessary to provide the diode FWD.

If the load is a pure resistance including no inductance, the diode FWD is unnecessary because there is no energy to reflux.

However, when a circuit in which the load includes an inductance such as a motor is connected, there is a mode in which a load current flows in an opposite direction to the ON-state switch. That is, when the load includes an inductance, energy may return from the inductance of the load back to the inverter circuit INV (the current may flow backward).

Since the transistor Q1, which is the IGBT, alone does not have a function capable of allowing this circulation electric current to pass through, it is necessary to connect the diode FWD in anti-parallel with the transistor Q1. Namely, when the inverter circuit INV has a load including an inductance similarly to the motor control, the energy stored in the inductance ($\frac{1}{2}LI^2$) must always be discharged if the transistor Q1 is turned off. However, the reflux current for releasing the energy stored in the inductance cannot be made to flow by the transistor Q1 alone. Therefore, in order to reflux the energy stored in this inductance, the diode FWD is connected in anti-parallel with the transistor Q1. In other words, the diode FWD has the function of flowing the reflux current to release the electric energy stored in the inductance. For the foregoing, it is necessary to provide the diode FWD in anti-parallel with the transistor Q1 which is switching element in the inverter circuit connected with the load including the inductance. This diode FWD is called a freewheel diode.

In a case of the inverter circuit INV according to this first embodiment, for example, as shown in FIG. 3, a capacitive element CAP is connected between a positive potential terminal PT and a negative potential terminal NT. For example, this capacitive element CAP has a function for smoothing a switching noise in the inverter circuit INV and stabilizing a system voltage. In the example as shown in FIG. 3, the capacitive element CAP is provided outside the inverter circuit INV, but the capacitive element CAP may be provided inside the inverter circuit INV.

Aspect of Implementation of Electronic Device

Figure 4:
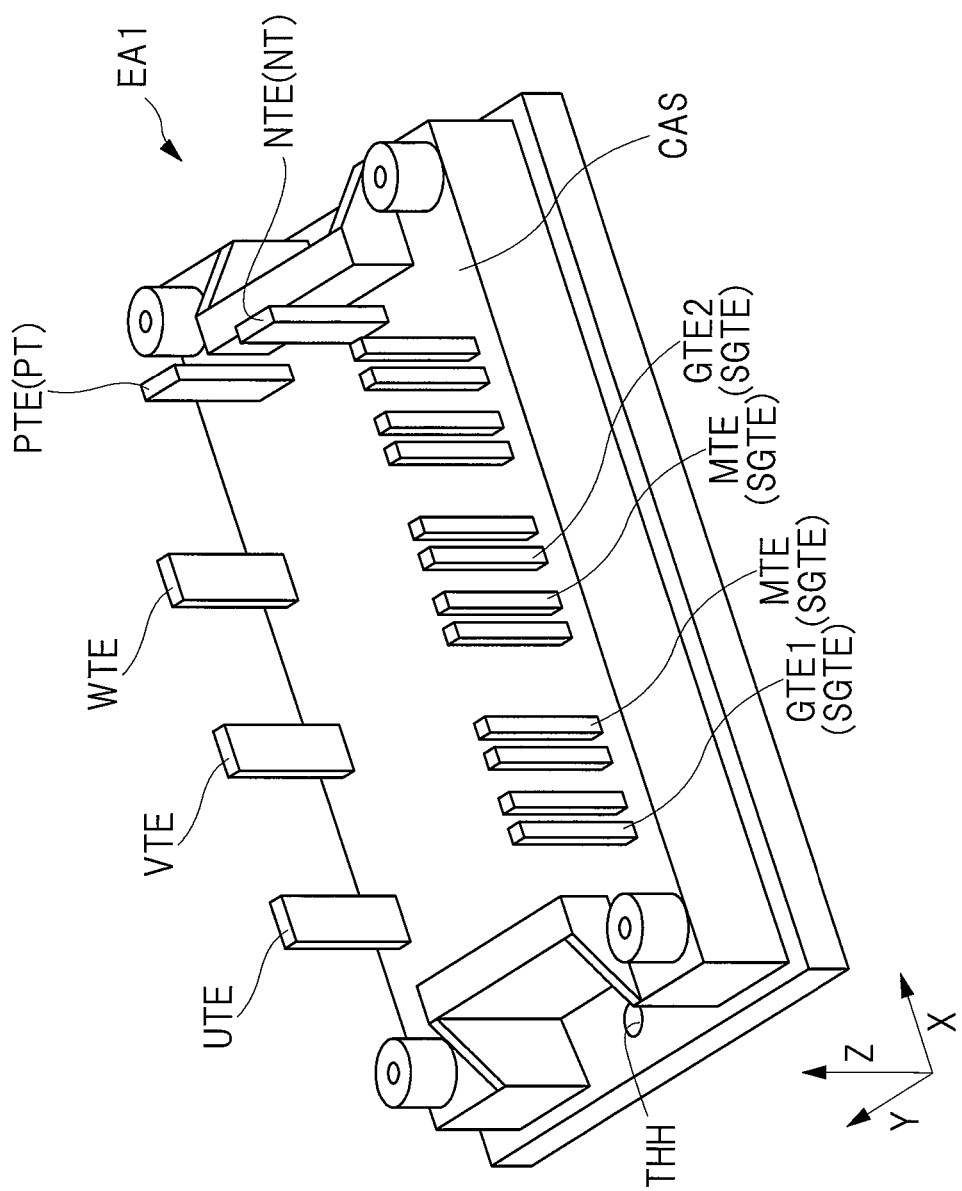
FIG. 4 is a perspective view showing an appearance of an electronic device according to the first embodiment.
Figure 5:
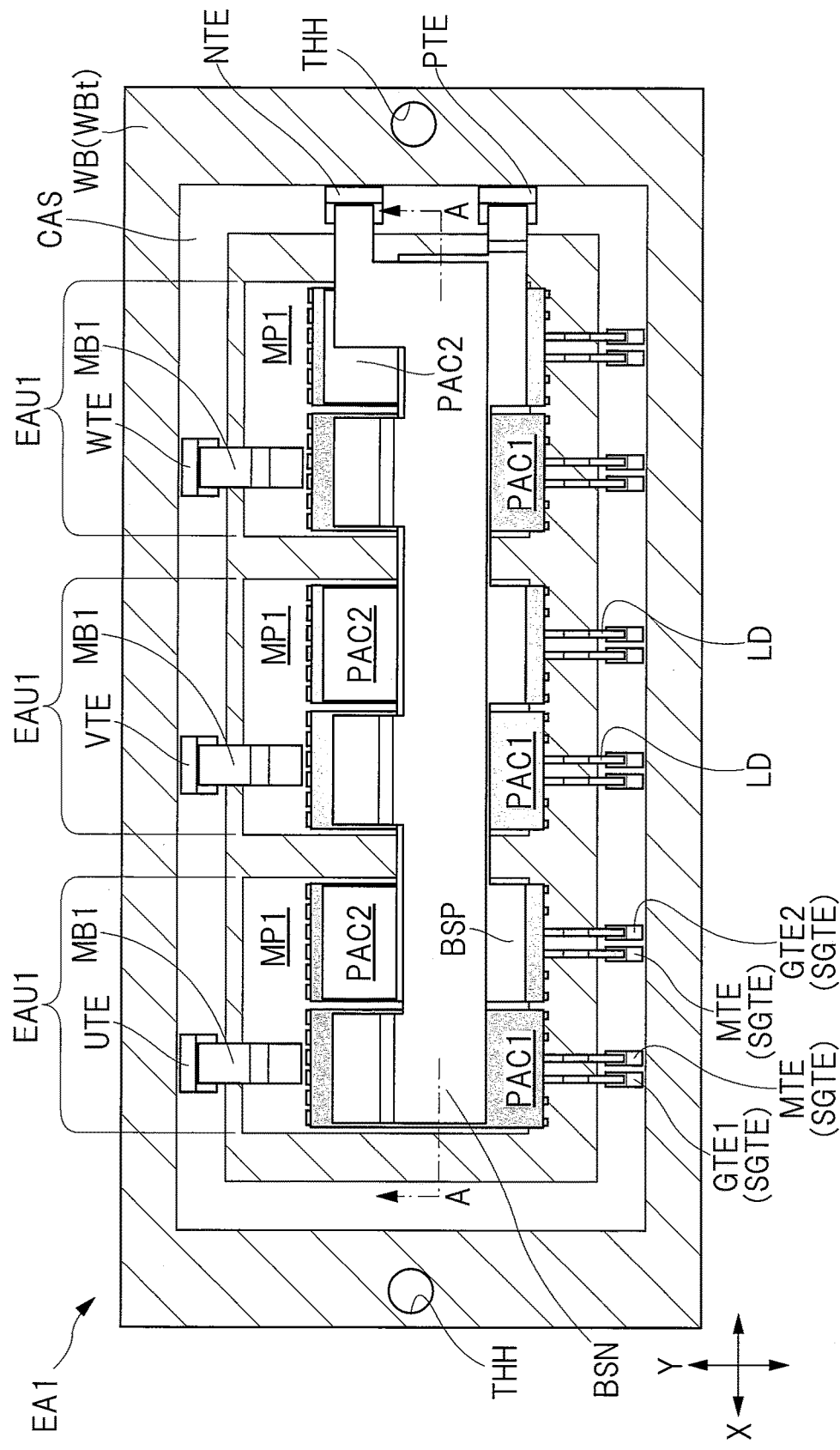
FIG. 5 is a plan view showing an internal structure of the electronic device shown in FIG. 4.

Subsequently, an example of an implementation aspect of an electronic device having the inverter circuit INV as shown in FIG. 3 will be described. FIG. 4 is a perspective view showing an appearance of an electronic device according to this first embodiment. FIG. 5 is a plan view showing an internal structure of the electronic device shown in FIG. 4. FIG. 5 is a plan view, but a substrate WB in FIG. 5 is indicated with hatching. FIG. 5 shows only a portion of a casing CAS shown in FIG. 4, a terminal UTE and the like that are external terminals being attached to the portion.

Figure 18:
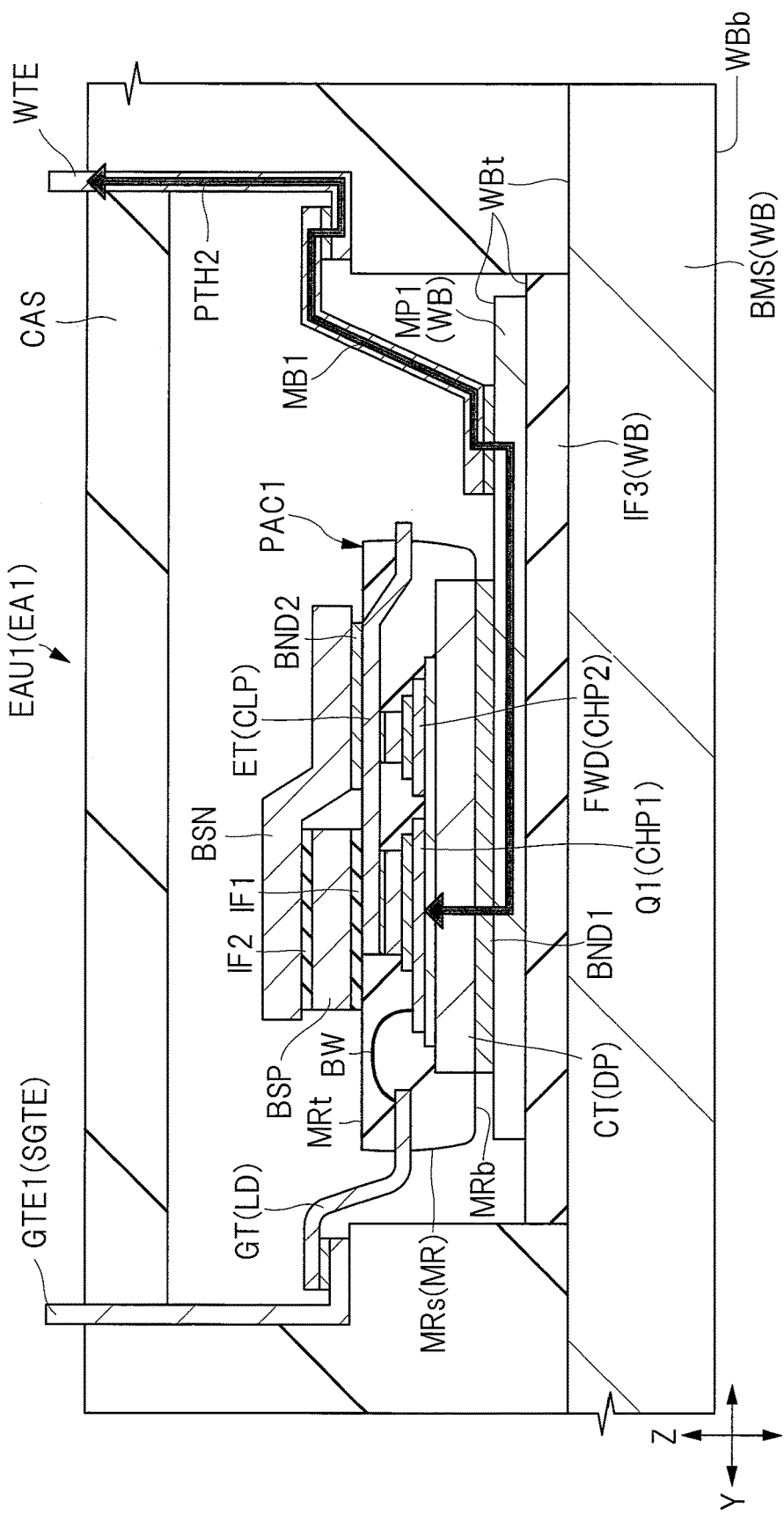
FIG. 18 is a cross-sectional view taken along line A-A of FIG. 16.

As shown in FIG. 4, an electronic device EA1 according to the present embodiment includes the casing CAS and a plurality of external terminals exposed from the casing CAS. The casing CAS is a cover member covering the substrate WB on which a plurality of semiconductor devices (semiconductor packages) PAC1 and PAC2 are mounted as shown in FIG. 5. As shown in FIG. 18 to be described later, an upper surface WBt of the substrate WB is covered with the casing CAS. The casing CAS shown in FIG. 4 and the substrate WB shown in FIG. 5 have through holes THH in such a manner that the through holes THH overlap each other. When screws (not shown) are inserted into the through holes THH, the casing CAS and the substrate WB can be fixed to each other. In the example of the present embodiment, the casing CAS has a planar shape of a rectangle, and has a long side along an X direction and a short side along a Y direction which is orthogonal to the X direction.

Multiple external terminals exposed from casing CAS include the following terminals. That is, the electronic device EA1 has a terminal PTE (positive potential terminal PT) and a terminal NTE (negative potential terminal NT). The electronic device EA1 has a terminal UTE, a terminal VTE, and a terminal WTE which are output terminals of U-phase, V-phase, and W-phase, respectively. The electronic device EA1 has a plurality of signal terminals SGTE which transmit signals to and from the semiconductor device. The plurality of signal terminals SGTE include terminals GTE1 and GTE2 which transmit gate signals to the semiconductor device. The signal terminals SGTE include a monitoring terminal MTE for outputting a signal for monitoring an operation state of a semiconductor device, such as a temperature, a voltage, and a current.

Examples of arrangement methods for arranging the plurality of external terminals include various modifications. But, in an example of the present embodiment, the plurality of external terminals are arranged as follows. That is, the terminal PTE and the terminal NTE are arranged in the Y direction along a short side of the casing CAS. The terminal UTE, the terminal VTE, and the terminal WTE are arranged in the X direction along one long side of the casing CAS. Multiple signal terminals SGTE are arranged in the X direction along the other long side of the casing CAS.

In the present application, a portion which is exposed from outside the casing CAS and is a part of a conductive member for electrically connecting the plurality of semiconductor devices mounted inside the casing CAS to an external device (for example, the three-phase induction motor MT as shown in FIG. 3) is defined as an external terminal. Therefore, each of the plurality of external terminals as shown in FIG. 5 is the conductive member derived outside the casing CAS from the portion covered with the casing CAS, but the portion covered with the casing CAS is not included in the external terminal.

As shown in FIG. 5, the electronic device EA1 includes the substrate WB. The substrate WB includes an upper surface (front surface, surface) WBt and a lower surface (back surface, surface) WBb (see FIG. 18 explained later) which is positioned opposite the upper surface WBt. The upper surface WBt of the substrate WB has a rectangular shape including a pair of long sides and a pair of short sides intersecting the pair of long sides. In the example shown in FIG. 5, the upper surface WBt of the substrate WB has two long sides extending in the X direction and two short sides extending in the Y direction. A plurality of conductor patterns MP1 are formed on the upper surface WBt of the substrate WB. The plurality of semiconductor devices PAC1 and PAC2 are mounted on the conductor pattern MP1 formed on the upper surface WBt of the substrate WB.

The electronic device EA1 of the present embodiment includes three units (electronic device units) EAU1, and each of the three units EAU1 has a rectangular shape defined by a pair of long sides extending in the Y direction and a pair of short sides extending in the X direction. The three units EAU1 respectively correspond to the legs LG1, LG2, and LG3 as shown in FIG. 1.

The three units EAU1 are arranged so as to be lined up in the X direction as shown in, for example, FIG. 5. That is, in this first embodiment, there are a plurality of units EAU1, and the plurality of units EAU1 are arranged side by side in X direction (first direction) in which the pair of short sides extend.

The semiconductor devices PAC1 and PAC2 are mounted on the three units EAU1 constituting the electronic device EA1. In other words, as shown in FIG. 5, each of the three units EAU1 has a plurality of semiconductor devices mounted thereon, and as one example in this first embodiment, two semiconductor devices are mounted on each of the units EAU1. Since the electronic device EA1 according to this first embodiment has three units EAU1, the electronic device EA1 according to this first embodiment includes a total of six semiconductor devices. The semiconductor device PAC2 mounted on each unit EAU1 shown in FIG. 5 corresponds to the switch SW1, SW3, or SW5 shown in FIG. 1. Likewise, the semiconductor device PAC1 mounted on each unit EAU1 corresponds to the switch SW2, SW4, or SW6 shown in FIG. 1.

The six semiconductor devices included in the electronic device EA1 each have a structure similar to each other although their details will be explained later. In other words, the six semiconductor devices included in the electronic device EA1 are electronic components of the same type. The semiconductor devices PAC1 and PAC2 are different in direction mounted on the conductor pattern MP1 although their details will be explained later. As described above, the semiconductor devices PAC1 and PAC2 are different in direction mounted on the conductor pattern MP1, and so bending directions of the leads LD are different from each other. However, except for the above differences, the semiconductor devices PAC1 and PAC2 have the same structure. For example, each of the semiconductor devices PAC1 and PAC2 has the transistor Q1 and diode FWD shown in FIG. 3.

Each of the three units EAU1 is connected with the terminal PTE and the terminal NTE. In a case of the present embodiment, each unit EAU1 is connected with a bus bar (conductive member, connection member, and conductor bar) BSP extending along the X direction so as to stride over the three units EAU1, and each unit EAU1 is connected via the bus bar BSP to the terminal PTE. Each unit EAU1 is connected with a bus bar BSN extending along the X direction so as to stride over the three units EAU1, and each unit EAU1 is connected via the bus bar BSN to the terminal NTE. The details of the respective structures and layouts of the bus bars BSP and BSN will be explained later.

Each unit EAU1 is connected with the terminal UTE, VTE, or WTE, which are the output terminals. Each of the unit EAU1 is connected with the plurality of signal terminals SGTE. More specifically, the semiconductor device PAC1 is connected with the terminal GTE1 and the monitoring terminal MTE, and the semiconductor device PAC2 is connected with the terminal GTE2 and the monitoring terminal MTE. A plurality of leads LD are derived from the semiconductor devices PAC1 and PAC2, and are connected with the signal terminals SGTE.

Each unit EAU1 has the conductor pattern (metal pattern) MP1 formed on the upper surface WBt of the substrate WB. The semiconductor devices PAC1 and PAC2 are mounted on the single conductor pattern MP1. In other words, the semiconductor devices PAC1 and PAC2 are electrically connected via the conductor pattern MP1. Each of the plurality of conductor patterns MP1 is connected with the terminal UTE, the terminal VTE, or the terminal WTE via a metal plate (conductive member) MB1. Namely, the semiconductor devices PAC1 and PAC2 are connected with the output terminals via the conductor patterns MP1.

Structure of Semiconductor Chip

Figure 6:
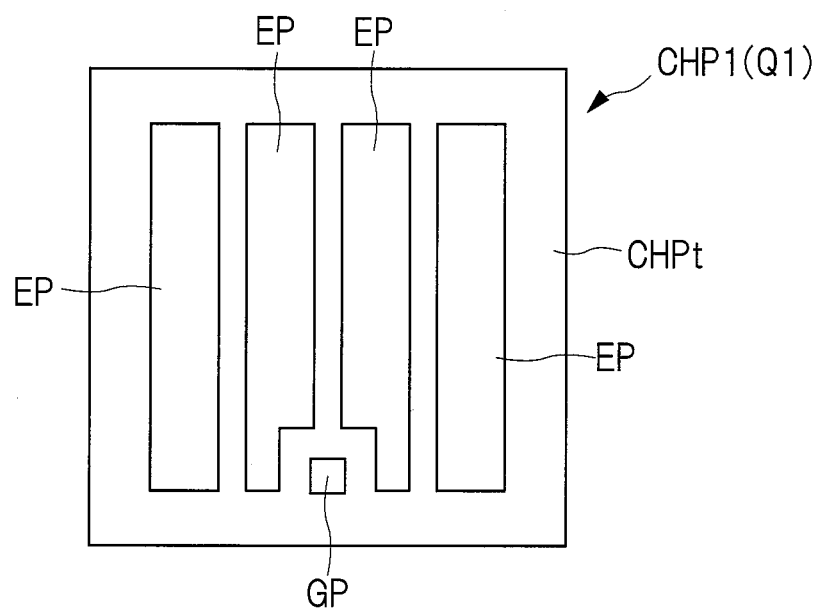
FIG. 6 is a plan view showing a shape of a front surface side of a semiconductor chip on which transistors shown in FIG. 3 are formed.
Figure 7:
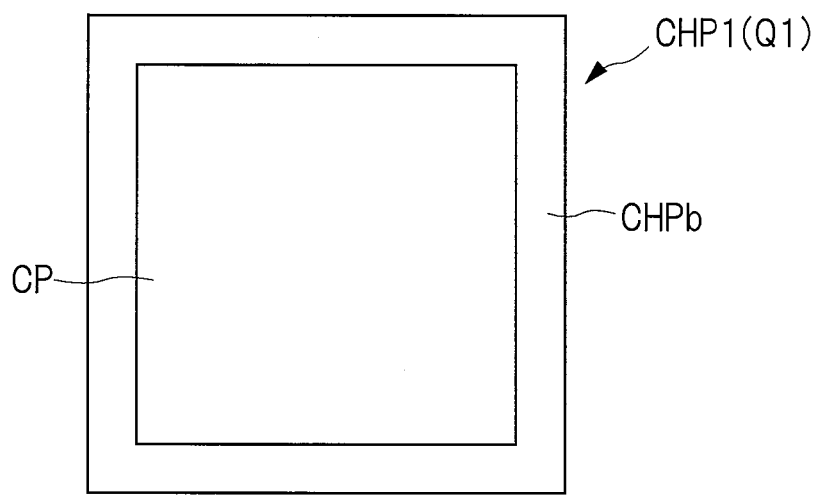
FIG. 7 is a plan view showing a back surface of the semiconductor chip shown in FIG. 6.
Figure 8:
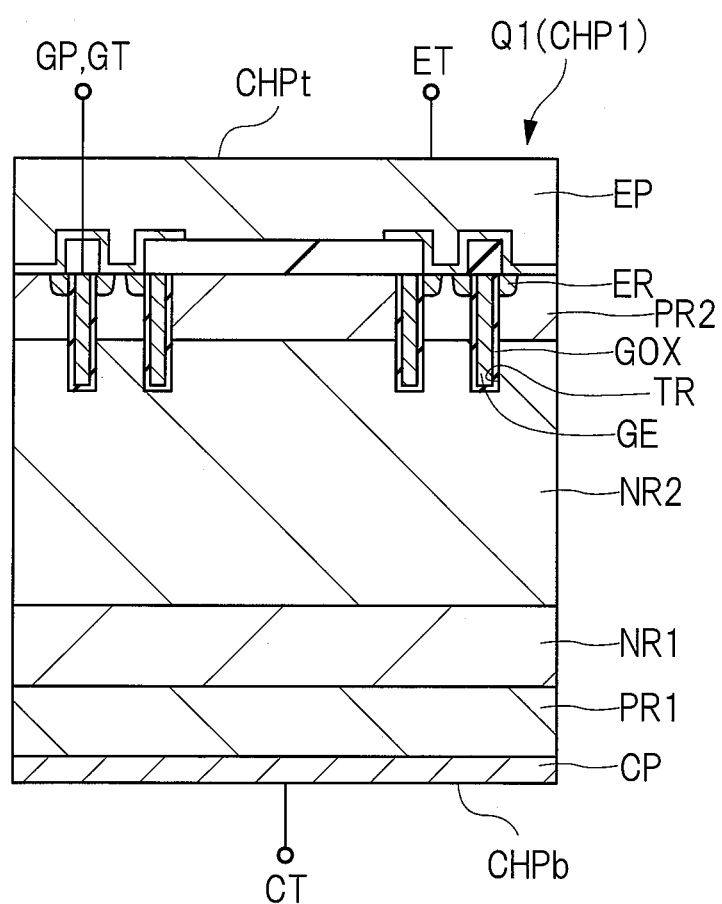
FIG. 8 is a cross-sectional view showing a structural example of a transistor included in the semiconductor chip shown in FIGS. 6 and 7.

Subsequently, a detailed structure of each member that the electronic device EA1 shown in FIG. 5 has will be described in order. First, each structure of the transistor Q1 and the diode FWD constituting the inverter circuit INV shown in FIG. 3 will be described with reference to the drawings. FIG. 6 is a plan view showing a shape of a front surface side of a semiconductor chip on which the transistor shown in FIG. 3 is formed. FIG. 7 is a plan view showing a back surface of the semiconductor chip shown in FIG. 6. FIG. 8 is a cross-sectional view showing an example of a structure of the transistor that the semiconductor chip shown in FIGS. 6 and 7 has.

In the case of the electronic device EA1 shown in FIG. 5, the transistor Q1 and the diode FWD constituting the inverter circuit INV shown in FIG. 3 are formed on semiconductor chips independent from each other. In the following description, the semiconductor chip on which the transistor Q1 is formed will be explained first, and then a semiconductor chip on which the diode FWD is formed will be explained next.

As shown in FIGS. 6 and 7, the semiconductor chip CHP1 according to this first embodiment includes a front surface (surface, upper surface, main surface) CHPt (see FIG. 6), and a back surface (surface, lower surface, main surface) CHPb (see FIG. 7) opposite the front surface CHPt. The front surface CHPt and the back surface CHPb of the semiconductor chip CHP1 are each in a rectangular shape. An area of the front surface CHPt and that of the back surface CHPb are, for example, equal.

As shown in FIG. 6, the semiconductor chip CHP1 has a gate electrode (gate electrode pad, a front surface electrode) GP, and an emitter electrode (emitter electrode pad, front surface electrode) EP that are formed on the front surface CHPt. In the example as shown in FIG. 6, one gate electrode GP and a plurality of emitter electrodes EP (four in FIG. 6) are exposed on the front surface CHPt. An exposed area of each of the emitter electrodes EP is larger than that of the gate electrode GP. The emitter electrode EP is connected with the output terminal of the inverter circuit INV (see FIG. 3) or the negative potential terminal NT (see FIG. 3) although its details will be explained later. Therefore, by increasing the size of exposed area of the emitter electrode EP, impedance of a transmission path through which a large current flows can be reduced. The plurality of emitter electrodes EP are electrically connected with each other. As a modification of FIG. 6, a single emitter electrode EP with a large area may be provided instead of the plurality of emitter electrodes EP.

As shown in FIG. 7, the semiconductor chip CHP1 has a collector electrode (collector electrode pad, back surface electrode) CP formed on the back surface CHPb. The collector electrode CP is formed on almost the entire back surface CHPb of the semiconductor chip CHP1. As can be seen by comparing FIG. 6 with FIG. 7, an exposed area of the collector electrode CP is even larger than that of the emitter electrode EP. The collector electrode CP is connected with the output terminal of the inverter circuit INV (see FIG. 3) or the positive potential terminal PT (see FIG. 3) although its details will be explained later. Therefore, by increasing the exposed area of the collector electrode CP, impedance of a transmission path through which a large current flows can be reduced.

Incidentally, in FIGS. 6 and 7, the basic configuration of the semiconductor chip CHP1 has been described, but various modifications can be applied. For example, provided may be not only the electrodes shown in FIG. 6 but also electrodes for monitoring an operation state of the semiconductor chip CHP1 or for inspecting the semiconductor chip CHP1 such as an electrode for temperature detection, an electrode for voltage detection, and an electrode for current detection. When these electrodes are provided, these electrodes are exposed on the front surface CHPt of the semiconductor chip CHP1 similarly to the gate electrode GP. These electrodes correspond to electrodes for signal transmission, and an exposed area of each of the electrodes is smaller than that of the emitter electrode EP.

The transistor Q1, which the semiconductor chip CHP1 has, has a structure as shown in, for example, FIG. 8. A $p^+$ type semiconductor region PR1 is formed on the collector electrode CP formed on the back surface CHPb of the semiconductor chip CHP1. An $n^+$ type semiconductor region NR1 is formed on the $p^+$ type semiconductor region PR1, and an $n^-$ type semiconductor region NR2 is formed on this $n^+$ type semiconductor region NR1. A p type semiconductor region PR2 is formed on the $n^-$ type semiconductor region NR2, and a trench TR is formed to penetrate through this p type semiconductor region PR2 and reach the $n^-$ type semiconductor region NR2. Furthermore, formed is an $n^+$ type semiconductor region ER which matches the trench TR and is to be an emitter region. Inside the trench TR, for example, a gate insulating film GOX made of a silicon oxide film is formed, and a gate electrode GE is formed via the gate insulating film GOX. This gate electrode GE is made of, for example, a polysilicon film, and is formed so as to fill the trench TR.

In the transistor Q1 configured as described above, the gate electrode GE is connected with the gate terminal GT (details will be described later) via the gate electrode GP shown in FIG. 6. Likewise, the $n^+$ type semiconductor region ER which is to be the emitter region is electrically connected with the emitter terminal ET (details will be described later) via the emitter electrode EP. The $p^+$ type semiconductor region PR1 which is to be a collector region is electrically connected with the collector electrode CP formed on the back surface CHPb of the semiconductor chip CHP1.

The transistor Q1 thus configured combines the high-speed switching characteristics as well as the voltage driving characteristics of the power MOSFET, and the low on-voltage characteristics of the bipolar transistor.

Incidentally, the $n^+$ type semiconductor region NR1 is called a buffer layer. When the transistor Q1 is turned OFF, this $n^+$ type semiconductor region NR1 is provided to prevent a punch-through phenomenon in which a depletion layer growing from the p type semiconductor region PR2 and the $n^-$ type semiconductor region NR2 comes into contact with the $p^+$ type semiconductor region PR1 formed below the $n^-$ type semiconductor region NR2. The $n^+$ type semiconductor region NR1 is provided for the purpose of limitation etc. of a hole injection amount from the $p^+$ type semiconductor region PR1 into the $n^-$ type semiconductor region NR2.

The gate electrode of the transistor Q1 is connected with the gate control circuit GC shown in FIG. 3. At this occasion, a signal from the gate control circuit GC is applied to the gate electrode GE (see FIG. 8) of the transistor Q1 via the gate terminal GT (see FIG. 8), so that a switching operation of the transistor Q1 can be controlled from the gate control circuit GC.

Figure 9:
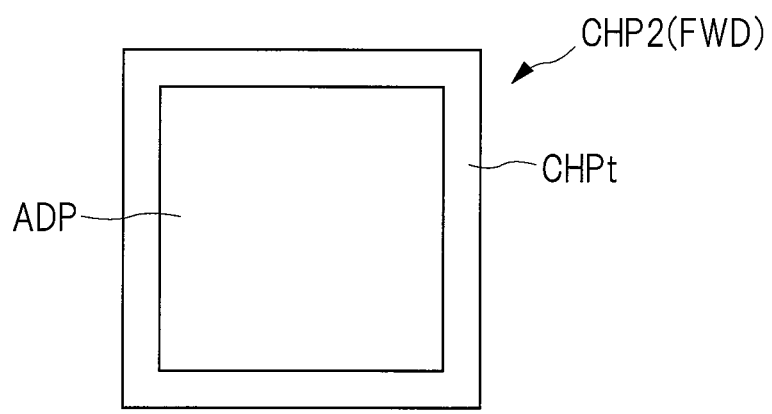
FIG. 9 is a plan view showing a shape of a front surface of a semiconductor chip in which a diode shown in FIG. 3 is formed.
Figure 10:
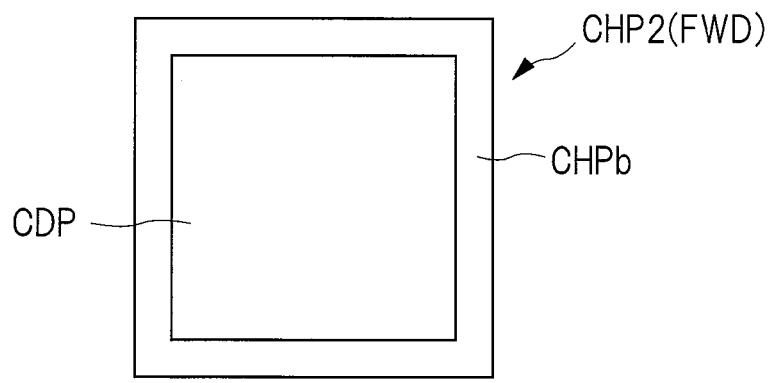
FIG. 10 is a plan view showing a back surface of the semiconductor chip shown in FIG. 9.
Figure 11:
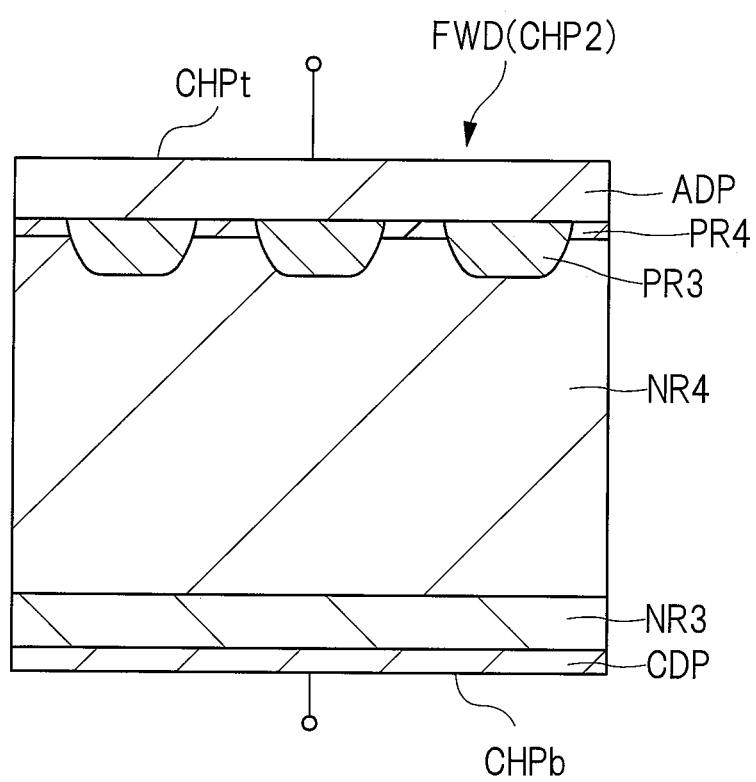
FIG. 11 is a cross-sectional view showing an example of a structure of the diode that the semiconductor chip shown in FIG. 9 and FIG. 10 has.

Subsequently, the semiconductor chip on which the diode FWD shown in FIG. 3 is formed will be described. FIG. 9 is a plan view showing a shape on the front surface side of the semiconductor chip on which the diode shown in FIG. 3 is formed. FIG. 10 is a plan view showing the back surface of the semiconductor chip shown in FIG. 9. FIG. 11 is a cross-sectional view showing an example of a structure of the diode of the semiconductor chip shown in FIGS. 9 and 10.

As shown in FIGS. 9 and 10, the semiconductor chip CHP2 according to this first embodiment includes a front surface (surface, upper surface, main surface) CHPt (see FIG. 9) and a back surface (surface, lower surface, main surface) CHPb (see FIG. 10) opposite the front surface CHPt. The front surface CHPt and the back surface CHPb of the semiconductor chip CHP2 are each in a rectangular shape. An area of the front surface CHPt and an area of the back surface CHPb are, for example, equal. As can be seen by comparing FIG. 6 with FIG. 9, the area of the front surface CHPt of the semiconductor chip CHP1 (see FIG. 6) is larger than that of the front surface CHPt of the semiconductor chip CHP2 (see FIG. 9).

As shown in FIG. 9, the semiconductor chip CHP2 has an anode electrode (anode electrode pad, front surface electrode) ADP formed on the front surface CHPt. As shown in FIG. 10, the semiconductor chip CHP2 has a cathode electrode (cathode electrode pad, back surface electrode) CDP formed on the back surface CHPb. The cathode electrode CDP is formed on the entire back surface CHPb of the semiconductor chip CHP2.

The diode FWD, which the semiconductor chip CHP2 has, has a structure as shown in, for example, FIG. 11. As shown in FIG. 11, an $n^+$ type semiconductor region NR3 is formed on the cathode electrode CDP formed on the back surface CHPb of the semiconductor chip CHP2. An $n^-$ type semiconductor region NR4 is formed on the $n^+$ type semiconductor region NR3, and p type semiconductor regions PR3 spaced apart from each other are formed on the $n^-$ type semiconductor region NR4. A $p^-$ type semiconductor region PR4 is formed between the p type semiconductor regions PR3. The anode electrode ADP is formed on the p type semiconductor regions PR3 and the $p^-$ type semiconductor areas PR4. The anode electrode ADP is made of, for example, aluminum-silicon.

According to the diode FWD configured as described above, when a positive voltage is applied to the anode electrode ADP and a negative voltage is applied to the cathode electrode CDP, a pn junction between the $n^-$ type semiconductor region NR4 and the p type semiconductor region PR3 is forward biased, so that a current flows. On the other hand, when a negative voltage is applied to the anode electrode ADP and a positive voltage is applied to the cathode electrode CDP, the pn junction between the $n^-$ type semiconductor region NR4 and the p type semiconductor region PR3 is reverse biased, so that a current does not flow. In this way, the diode FWD with a rectification function can be operated.

Configuration of Semiconductor Device

Subsequently, the configuration of the semiconductor device that constitutes the switch constituting the inverter circuit INV shown in FIG. 3 will be described with reference to the drawings. As described above, each of the plurality of units EAU1 shown in FIG. 5 has the semiconductor devices PAC1 and PAC2. However, the semiconductor devices PAC1 and PAC2 have the same configuration. Therefore, in the following description, the semiconductor devices PAC1 and PAC2 having the same configuration will be described as semiconductor devices PAC. In EA1 of the present embodiment, the semiconductor devices PAC1 and PAC2 are each mounted on the conductor pattern MP1 with their constituent elements inverted upside down although their details will be explained later. However, in the explanation below, when a top and bottom of each constituent element of the semiconductor device PAC are explained, a direction from the back surface CHPb to the front surface CHPt of the semiconductor chip CHP1 shown in FIG. 8 is defined and explained as an upper direction, and a direction from the front surface CHPt to the back surface CHPb is defined and explained as a lower direction regardless of the direction at a mounting time. The same applies to an upper surface or a lower surface explained with regard to the surface of each member.

The semiconductor device PAC according to this first embodiment is obtained by packaging a single transistor Q1 and a single diode FWD which become constituent elements of the inverter circuit INV as illustrated in FIG. 3. That is, the six semiconductor devices according to this first embodiment are used to constitute the electronic device (semiconductor module, power module) EA1 (see FIG. 5) which becomes the three-phase inverter circuit INV for driving the three-phase motor.

Figure 12:
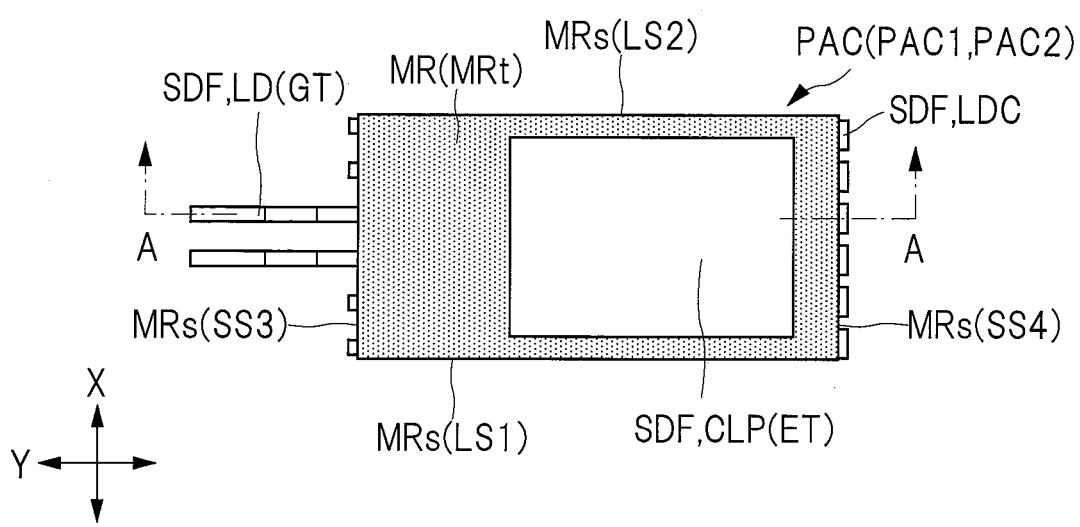
FIG. 12 is a plan view showing a shape example on a main surface side of one of the plurality of semiconductor devices shown in FIG. 5.
Figure 13:
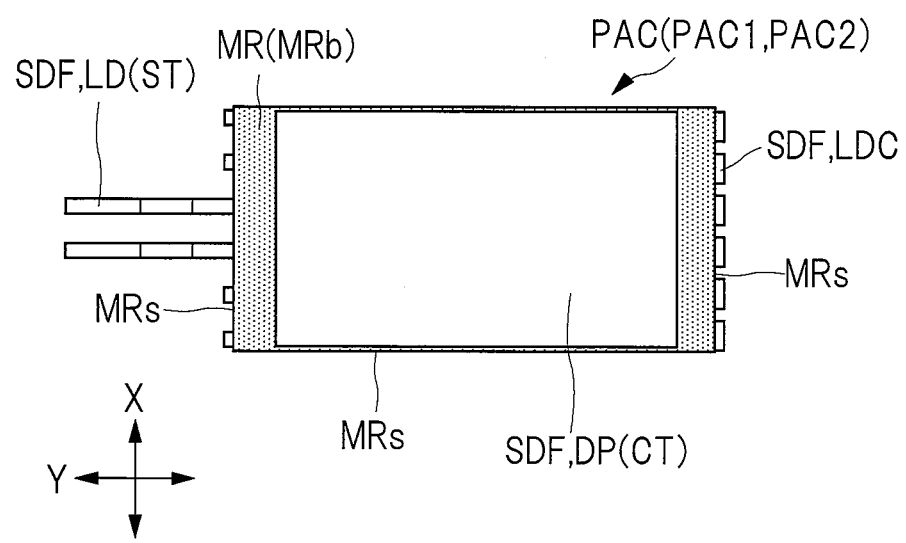
FIG. 13 is a plan view showing a shape example of a main surface opposite the semiconductor device shown in FIG. 12.
Figure 14:
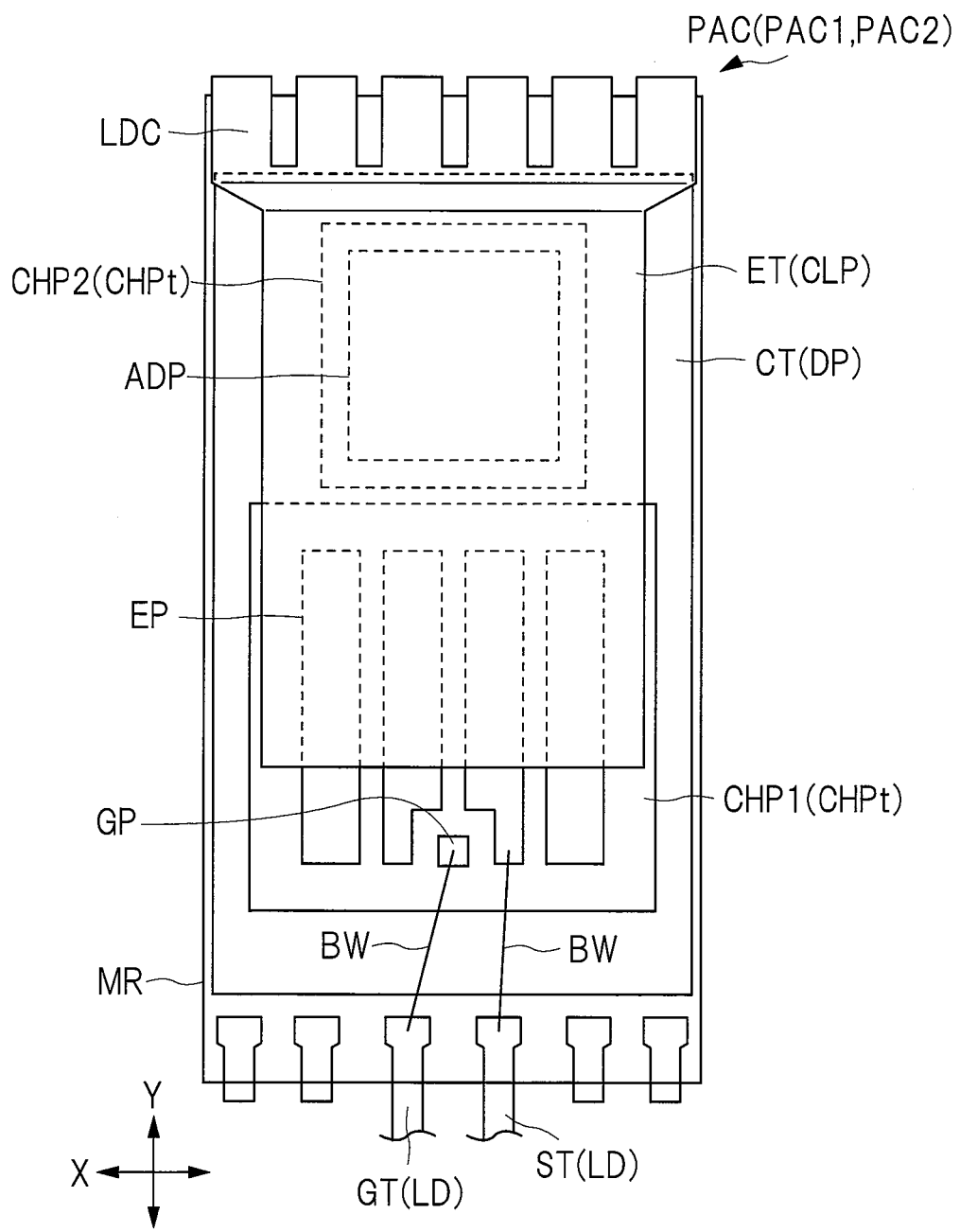
FIG. 14 is a plan view showing an internal structure of the semiconductor device shown in FIG. 12 and FIG. 13.
Figure 15:
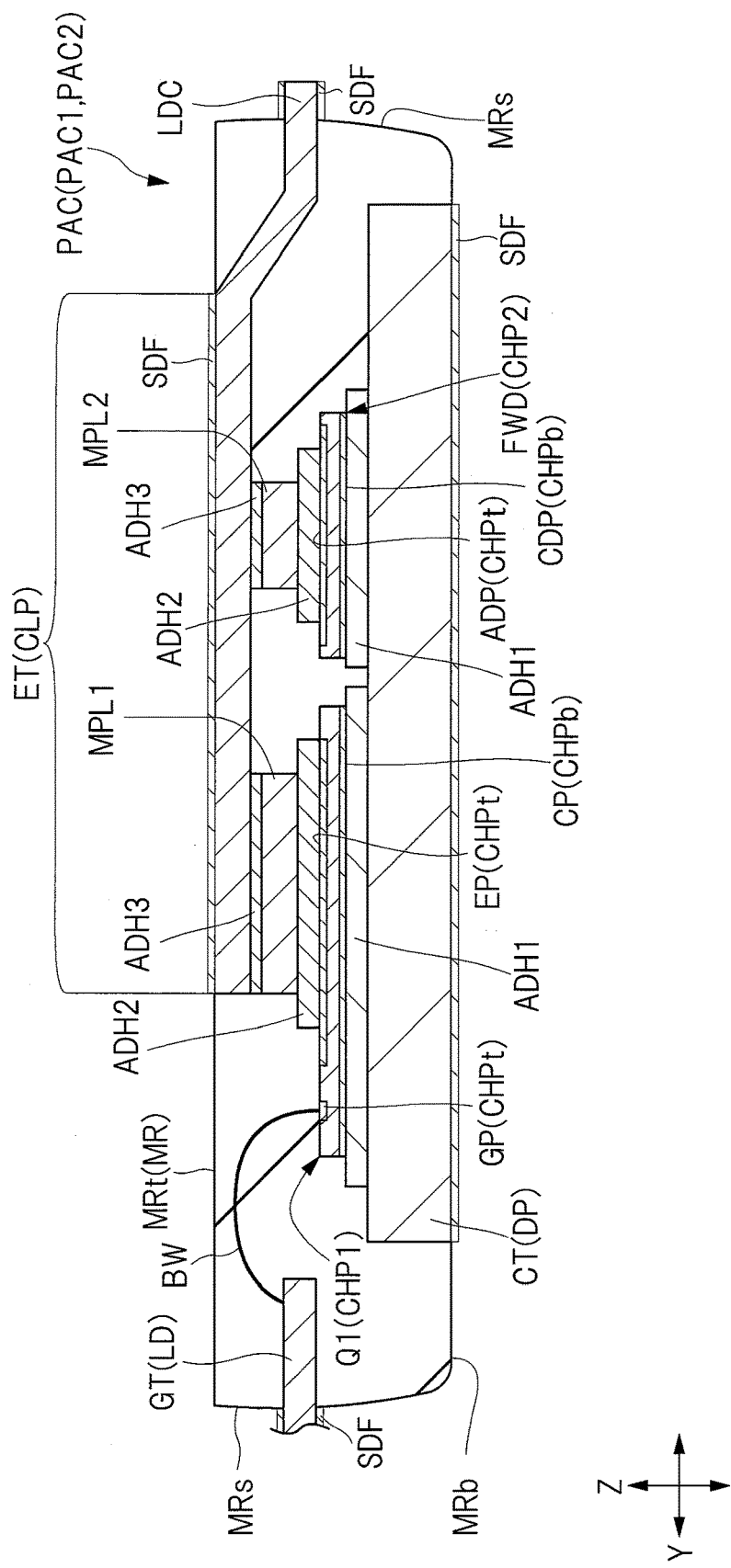
FIG. 15 is a cross-sectional view taken along line A-A of FIG. 12.

FIG. 12 is a plan view showing an example of a shape on a main surface side of one of a plurality of semiconductor devices shown in FIG. 5. FIG. 13 is a plan view showing an example of a shape of a main surface opposite the semiconductor device shown in FIG. 12. FIG. 14 is a plan view showing an internal structure of the semiconductor device shown in FIGS. 12 and 13. FIG. 15 is a cross-sectional view taken along line A-A of FIG. 12.

As shown in FIGS. 12 and 13, the semiconductor device PAC includes a main surface (upper surface, front surface) MRt (see FIG. 12), a main surface (lower surface, back surface) MRb (see FIG. 13) opposite the main surface MRt, and a sealing body (resin body) MR having a side surface MRs between the main surface MRt and the main surface MRb in a thickness direction. In a plane view, the sealing body MR is made of a rectangular shape. In the example as shown in FIG. 12, the sealing body MR includes long sides LS1 and LS2 facing each other, and short sides SS3 and SS4 which intersect with the long sides LS1 and LS2 and which face each other.

The sealing body MR is a resin that collectively seals both of the semiconductor chip CHP1 (see FIG. 15) and the semiconductor chip CHP2 CHP2 (see FIG. 15), and includes, for example, an epoxy resin material as a main component. A plurality of terminals, which the semiconductor device PAC has, are exposed from the sealing body MR. As shown in FIG. 12, the emitter terminal (package terminal, front surface terminal) ET is exposed from a main surface MRt of the sealing body MR. The emitter terminal ET is a terminal (package terminal) connected with the emitter electrode EP of the semiconductor chip CHP1 as shown in FIG. 8 which has been already explained. As shown in FIG. 13, the collector terminal (package terminal, back surface terminal) CT is exposed from a main surface MRb of the sealing body MR. As shown in FIG. 8, the collector terminal CT is a terminal (package terminal) connected with the collector electrode CP of the semiconductor chip CHP1.

As shown in FIG. 12, the gate terminal GT is exposed from a side surface MRs of the sealing body MR. The gate terminal GT is a terminal (package terminal) connected with the gate electrode GE of the semiconductor chip CHP1 as shown in FIG. 8. As shown in FIG. 13, the signal terminal ST is exposed from the side surface MRs of the sealing body MR. The signal terminal ST is a terminal that transmits a signal for monitoring the operation state of the semiconductor device. Incidentally, the gate terminal GT shown in FIG.

12 is a type of signal terminal that transmits a gate signal to the gate electrode GE shown in FIG. 8. The leads LD derived in a direction from an inside of the sealing body MR to its outside are used as the gate terminal GT and the signal terminal ST which are terminals constituting signal transmission paths. As shown in FIG. 15, the lead LD protrudes from the side surface MRs of the sealing body MR toward the outside of the sealing body MR.

A cross-sectional area of the lead LD in a boundary portion between the inside and outside of the sealing body MR is small than the exposed area of the emitter terminal ET or collector terminal CT exposed from the sealing body MR. Therefore, this is advantageous in that, even if the number of signal terminals increases, an increase in size of the semiconductor device PAC can be suppressed. On the other hand, since the cross-sectional area of the transmission path can be increased if the exposed area from the sealing body MR is large similarly to the emitter terminal ET and the collector terminal CT, there is an advantage of being capable of reducing a resistance component and an inductance component of the transmission path. Because a large current flows through the emitter terminal ET and the collector terminal CT, the resistance component and the inductance component of the emitter terminal ET and the collector terminal CT are preferably reduced as much as possible. On the other hand, a current flowing through the gate terminal GT and the signal terminal ST is relatively low. Therefore, the emitter terminal ET or the collector terminal CT through which a relatively large current flows preferably makes the exposed area from the sealing body MR larger.

Subsequently, the internal structure of the semiconductor device PAC will be described. As shown in FIGS. 14 and 15, a rectangular die pad (chip mounting portion, metal plate, tab, heat spreader) DP is disposed inside the sealing body MR. This die pad DP also functions as a heat spreader for enhancing heat radiation efficiency, and is made of, for example, a metal material whose main component is copper having a high thermal conductivity. Here, the "main component" refers to a material component which contains the largest amount of constituent materials constituting a member. For example, "material of which main component is copper" means that the material of the member contains the maximum amount of copper. An intention of using the term "main component" in the present specification is to express that, for example, the member is basically composed of copper but does not exclude a case where impurities are contained in the member.

As shown in FIG. 14, a plane area of die pad DP is larger than a total of areas of the front surface CHPt of the semiconductor chip CHP1 and the front surface CHPt of the semiconductor chip CHP2. Therefore, both of the semiconductor chips CHP1 and CHP2 can be mounted on a single die pad DP.

As shown in FIG. 15, the semiconductor chip CHP1 on which the IGBT is formed and the semiconductor chip CHP2 on which the diode is formed are mounted on the die pad DP via a conductive adhesive agent (die bonding material, conductive member, connection member, adjoining material) ADH1 made of, for example, solder or a conductive resin. At this occasion, a surface on which the semiconductor chips CHP1 and CHP2 are mounted is defined as an upper surface of the die pad DP, and a surface opposite this upper surface is defined as a lower surface. In this case, the semiconductor chips CHP1 and CHP2 are mounted on the upper surface of the die pad DP.

The semiconductor chip CHP2, on which the diode is formed, is arranged such that the cathode electrode CDP formed on the back surface of the semiconductor chip CHP2 is in contact with the upper surface of the die pad DP via the conductive adhesive agent ADH1. In this case, the anode electrode ADP formed on the front surface CHPt of the semiconductor chip CHP2 faces upward. On the other hand, the semiconductor chip CHP1, on which the IGBT is formed, is arranged such that the collector electrode CP formed on the back surface CHPb of the semiconductor chip CHP1 is in contact with a first surface of the die pad DP via the conductive adhesive agent ADH1. In this case, the emitter electrode EP and the gate electrode GP formed on the front surface CHPt of the semiconductor chip CHP1 faces upward. As described above, the collector electrode CP of the semiconductor chip CHP1 and the cathode electrode CDP of the semiconductor chip CHP2 are electrically connected via the conductive adhesive agent ADH1 and the die pad DP.

As shown in FIG. 15, the lower surface of the die pad DP is exposed from the main surface MRb of the sealing body MR, and the lower surface of this exposed die pad DP is the collector terminal CT. Therefore, the collector electrode CP of the semiconductor chip CHP1 and the cathode electrode CDP of the semiconductor chip CHP2 are electrically connected with the collector terminal CT via the conductive adhesive agent ADH1.

When the semiconductor device PACT is mounted on the substrate WB shown in FIG. 5, the lower surface of the die pad DP functions as a surface that can be electrically connected via a connection member to the conductor pattern MP1 formed on the substrate WB. In this way, when the die pad DP which is the collector terminal CT is exposed from the main surface MRb of the sealing body MR, the exposed area of the collector terminal CT can be increased as described above. Therefore, the resistance component and the inductance component of the transmission path going through the collector terminal CT can be reduced.

As shown in FIG. 15, a thickness of the die pad DP is thicker than those of the gate terminal GT and the signal terminal ST. In this case, the heat radiation efficiency of a heat radiation path going through the die pad DP can be improved.

As shown in FIG. 15, a clip (conductive member, metal plate, electrode connection member) CLP which is a conductive member is arranged on the emitter electrode EP of the semiconductor chip CHP1 and the anode electrode ADP of the semiconductor chip CHP2. In the example of the present embodiment, the clip CLP is a portion of the conductive member formed integrally with the lead LDC and exposed from the main surface MRt of the sealing body MR. Therefore, a portion of the lead LDC can be regarded as the clip CLP. However, in the present embodiment, the exposed surface exposed from the main surface MRt of the sealing body MR is used as the emitter terminal ET, and so is distinguished from the lead LDC exposed from the side surface MRs of the sealing body MR.

In the example as shown in FIG. 15, the emitter electrode EP of the semiconductor chip CHP1 is electrically connected with the clip CLP via the conductive adhesive agent ADH2, the metal plate MPL1, and the conductive adhesive agent ADH3 which are stacked in this order from an emitter electrode EP side. The anode electrode ADP of the semiconductor chip CHP2 is electrically connected with the clip CLP via the conductive adhesive agent ADH2, the metal plate MPL2, and the conductive adhesive agent ADH3 which are stacked in this order from an anode electrode ADP side.

As shown in FIG. 15, the upper surface of the clip CLP is exposed from the main surface MRt of the sealing body MR, and the exposed upper surface of the clip CLP serves as the emitter terminal ET. Therefore, the emitter electrode EP of the semiconductor chip CHP1 and the anode electrode ADP of the semiconductor chip CHP2 are electrically connected with the emitter electrode EP via the conductive adhesive agent ADH2. Thus, when the clip CLP serving as the emitter terminal ET is exposed from the main surface MRt of the sealing body MR, as described above, the exposed area of the emitter terminal ET can be increased. This makes it possible to reduce the resistance component and the inductance component of the transmission path going through the emitter terminal ET.

In the example shown in FIG. 15, since the clip CLP is formed integrally with the lead LDC, the thickness of the clip CLP is the same as those of the gate terminal GT and the signal terminal ST. On the other hand, in order to ensure a loop height of a wire BW connecting the gate electrode GP and the gate terminal GT, a space between the clip CLP and the semiconductor chip CHP1 and a space between the clip CLP and the semiconductor chip CHP2 are widened. Therefore, in a case of the semiconductor device PAC shown in FIG. 15, the metal plate MPL1 is disposed between the clip CLP and the semiconductor chip CHP1, and the metal plate MPL2 is arranged between the clip CLP and the semiconductor chip CHP1. The metal plate MPL1 is adhered to the semiconductor chip CHP1 via the conductive adhesive agent ADH2 and bonded to the clip CLP via the conductive adhesive agent ADH3. The metal plate MPL2 is adhered to the semiconductor chip CHP2 via the conductive adhesive agent ADH2 and bonded to the clip CLP via the conductive adhesive agent ADH3. Incidentally, the embodiments of the clip CLP include various modifications other than the aspect shown in FIG. 15. For example, in a case where the clip CLP and the lead LDC are separately formed as separate members, a flexibility of a design about the shape of the clip CLP becomes high. Therefore, for example, the clip CLP can be configured as a metal member obtained by integrating the clip CLP, the conductive adhesive agent ADH3, and the metal plates MPL1 and MPL2 shown in FIG. 15. In this case, the clip CLP is adhered to the semiconductor chips CHP1 and CHP2 through the conductive adhesive agent ADH2 shown in FIG. 15. A part of clip CLP may be bent, so that the metal plates MLP1 and MLP2 and the conductive adhesive agent ADH3 shown in FIG. 15 can be omitted.

Incidentally, a portion of the lead LDC protrudes outward from the side surface MRs of the sealing body MR, but its portion outside the sealing body MR is not connected with other members. In other words, the lead LDC does not have a function of a terminal (package terminal). Therefore, a modification of the present embodiment may not have the lead LDC. However, when various kinds of products are manufactured by a process of manufacturing semiconductor devices, it is preferable that a lead frame is highly versatile and a lead frame common to multiple types of products can be utilized. Therefore, when there is the lead LDC as shown in FIGS. 14 and 15, there is an advantage of improving the versatility of the lead frame.

In a case of the semiconductor device PAC, since the lead LDC does not function as a terminal, the lead LDC may not be required if the clip CLP is formed as a member separate from the lead LDC. However, when the clip CLP and the lead LDC are integrally formed in the process of manufacturing the semiconductor device PAC similarly to the present embodiment, it is easy to align the clip CLP and the semiconductor chips CHP1 and CHP2.

From the viewpoint of reducing an ON resistance of the semiconductor device PAC which is the switch element, a material having a high electric conduction rate is preferably used for the conductive adhesive agent ADH1 connected with the die pad DP; and the conductive adhesive agent ADH2 and ADH3 electrically connecting the clip CLP and the electrodes of the semiconductor chips CHP1 and CHP2. Examples of materials having the high electric conduction rate include not only solder but also a conductive resin containing a plurality of (multiple) conductive particles therein.

However, after finished as a product, the semiconductor device PAC is packaged on the substrate WB as shown in FIG. 5. In this case, a material having a high electric conduction rate such as solder and a conductive resin is also preferably used for the connection member used for connecting the semiconductor devices PAC1 and PAC2 to the substrate WB. In this case, the conductive adhesive agents ADH1, ADH2, and ADH3 shown in FIG. 15 need to have heat resistance properties against treatment temperature in packaging the semiconductor device PAC.

For example, when the semiconductor device PAC is packaged with solder, a thermal treatment (reflow) is required for connection by melting the solder. In the case where the solder used for the connection between the semiconductor device PAC and the substrate WB (see FIG. 5) and the solder used inside the above-mentioned semiconductor device PAC are the same material, the solder inside the semiconductor device PAC may be melted by the thermal treatment (reflow) at a time of packaging the semiconductor device PAC.

Therefore, when the solder is used inside the semiconductor device PAC and at the packaging time of the semiconductor device PAC, it is preferable that the solder used inside the semiconductor device PAC has a melting point higher than that used at the packaging time.

On the other hand, when conductive resin is used at the packaging time of the semiconductor device PAC, a thermal treatment (curing bake) to harden a resin component of the conductive resin becomes necessary. In general, however, curing temperature of a resin is lower than a melting point of solder. Therefore, in this case, the conductive adhesive agents ADH1 and ADH2 maybe the solder or conductive resin.

Even when the solder is used at the packaging time of the semiconductor device PAC, the conductive resin can be used as the conductive adhesive agents ADH1 and ADH2 as long as the heat resistant temperature of the resin is higher than the melting point of the solder.

As shown in FIGS. 14 and 15, the gate electrode GP is formed on the front surface of the semiconductor chip CHP1, and the gate electrode GP is electrically connected with the gate terminal GT by the wire BW which is a conductive member. The wire BW is made of a conductive member whose main component is, for example, gold, copper or aluminum.

In a plane view, the semiconductor chip CHP1 is mounted on the die pad DP so as to be positioned between the semiconductor chip CHP2 and the gate terminal GT. The semiconductor chip CHP1 is mounted on the die pad DP so that the gate electrode GP is positioned between the emitter electrode EP and the gate terminal GT. As a result, the length of the wire BW that connects the gate electrode GP and the gate terminal GT can be shortened.

In the example shown in FIG. 14, the signal terminal ST is electrically connected with the emitter electrode EP via the wire BW. In this case, the signal terminal ST can be used as a test terminal for measuring and outputting a voltage of the emitter electrode EP in a test in which a large current is passed through the transistor Q1 (see FIG. 8) of the semiconductor chip CHP1. The signal terminal ST is connected with the monitoring terminal MTE shown in FIG. 5, and outputs the detected signal outside.

As shown in FIG. 15, each of the plurality of wires BW is sealed by the sealing body MR. When the particularly easily deformed and damaged wire BW among the respective members constituting the semiconductor device PAC is packaged on the electronic device EA1 (FIG. 5) with the wire protected by the sealing body MR, handling of each of the members in being packaged onto the electronic device EA1 is improved. Therefore, assembly efficiency of the electronic device EA1 can be improved. As shown in FIG. 15, the semiconductor chip CHP1, the semiconductor chip CHP2, a portion of the die pad DP, a portion of the clip CLP, respective portions of the plural leads LD, the clip CLP, and the wire BW among parts constituting the semiconductor device PAC are sealed with, for example, a resin.

As shown in FIG. 15, portions of the clip CLP, the die pad DP, the lead LD, and the lead LDC which are exposed from the sealing body MR are covered with a metal film SDF. The metal film SDF is made of a metal material such as solder, and is formed by a plating method. When the semiconductor device PAC is packaged on the conductor pattern MP1 shown in FIG. 5 via the solder, wettability of the solder is improved by covering the exposed surfaces with the metal film SDF. This is also applicable to the clip CLP and the leads LD and LDC. In particular, when the die pad DP and the clip CLP are formed with a metal material containing copper as the main component, wettability can be greatly improved by covering the die pad DP and the clip CLP with the metal films SDF.

Configuration of Each Unit

Figure 16:
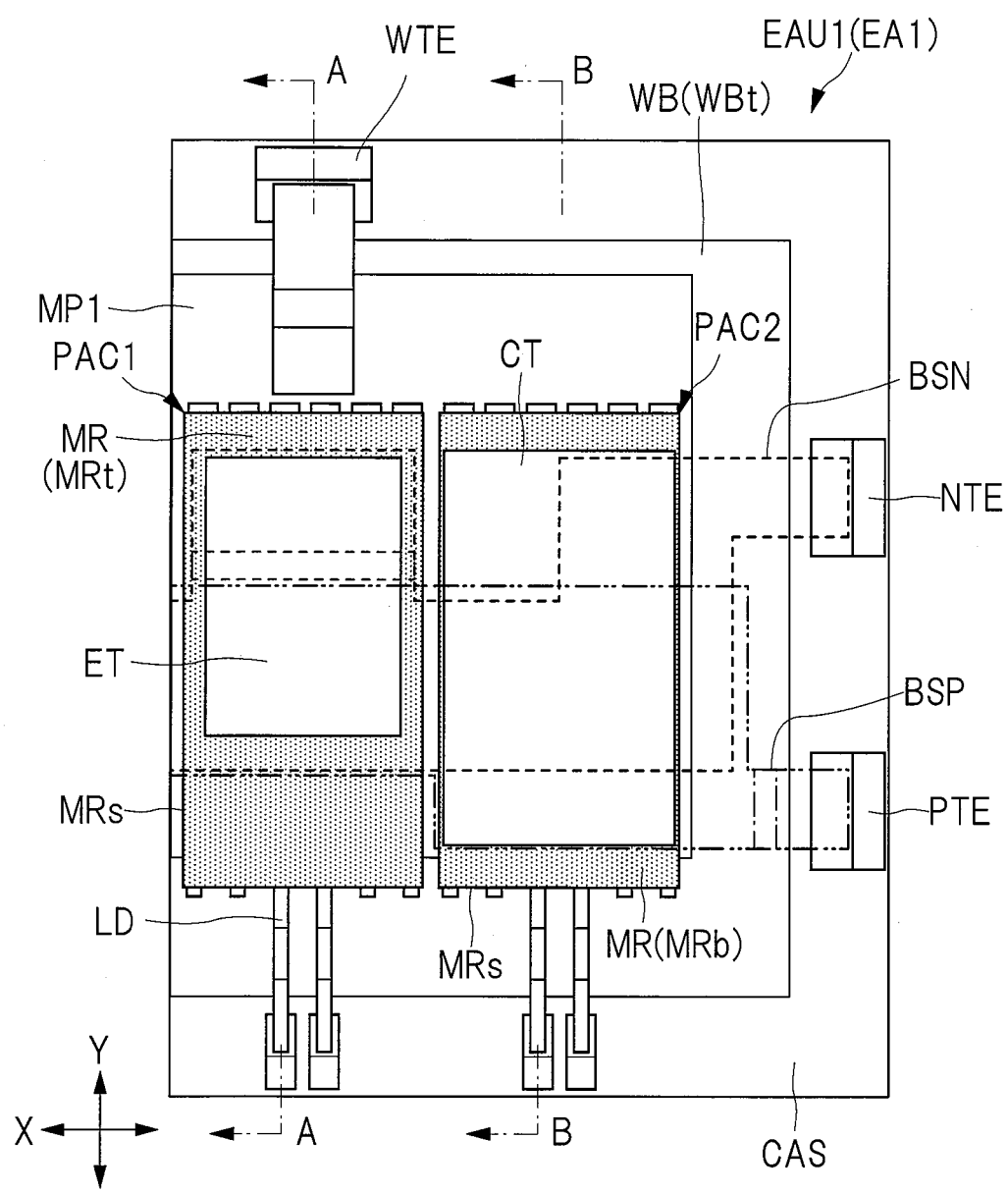
FIG. 16 is an enlarged plan view enlarging and showing one of the three units shown in FIG. 5.
Figure 17:
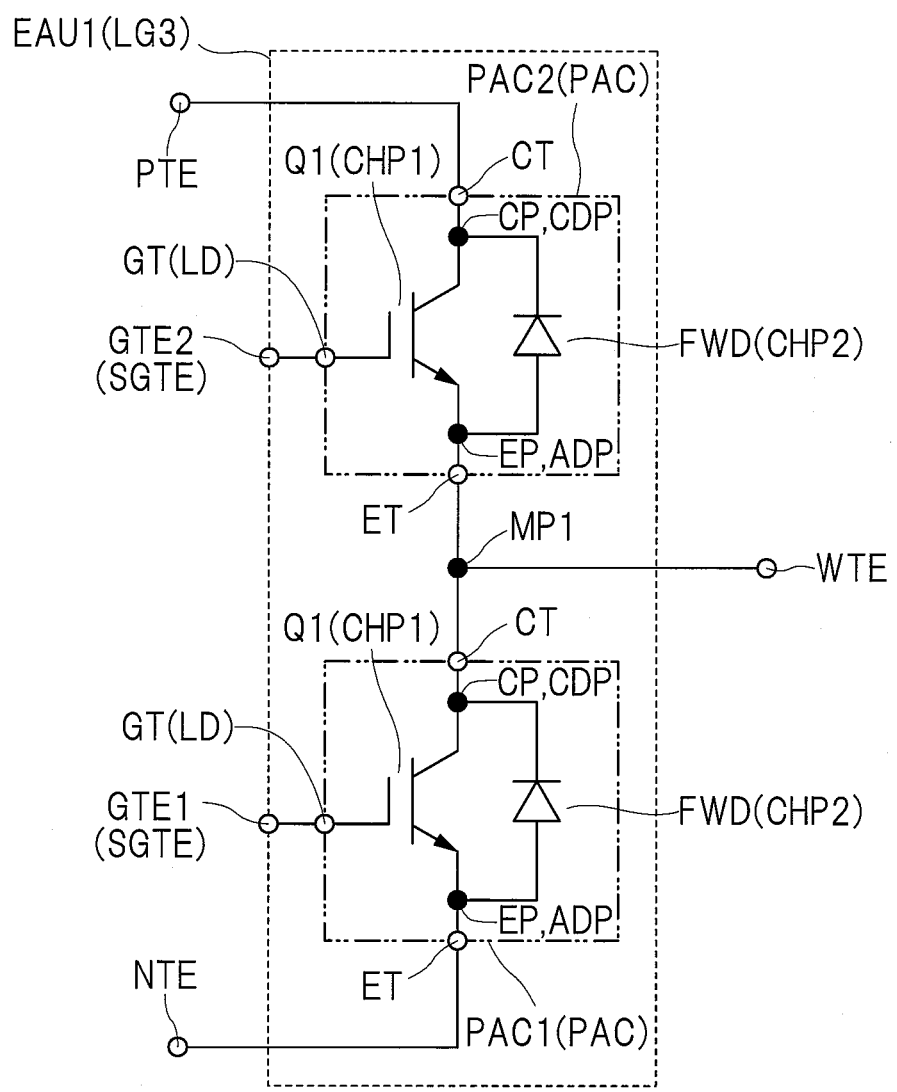
FIG. 17 is a circuit diagram showing circuit elements corresponding to the units shown in FIG. 16.
Figure 19:
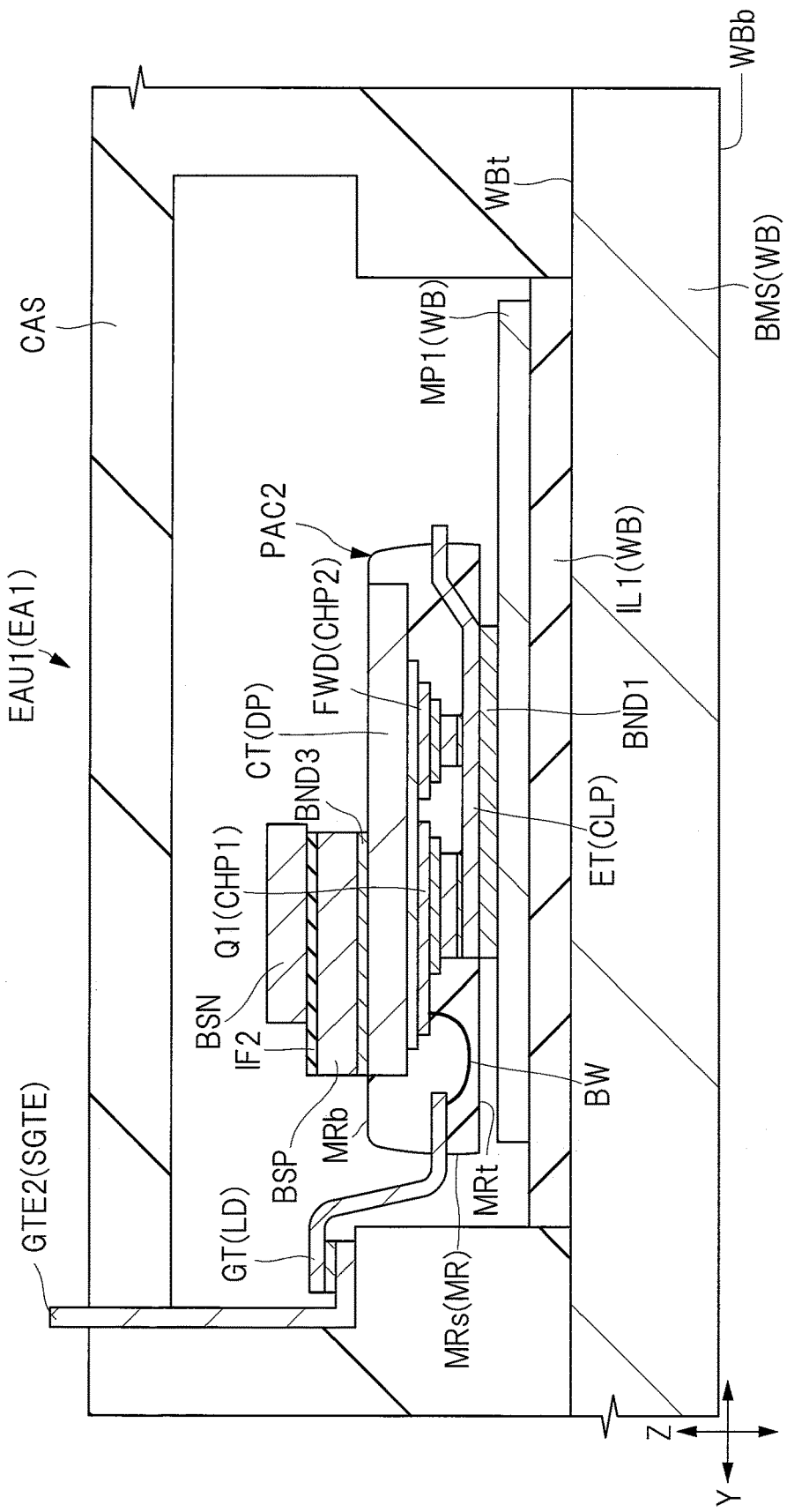
FIG. 19 is a cross-sectional view taken along line B-B of FIG. 16.
Figure 20:
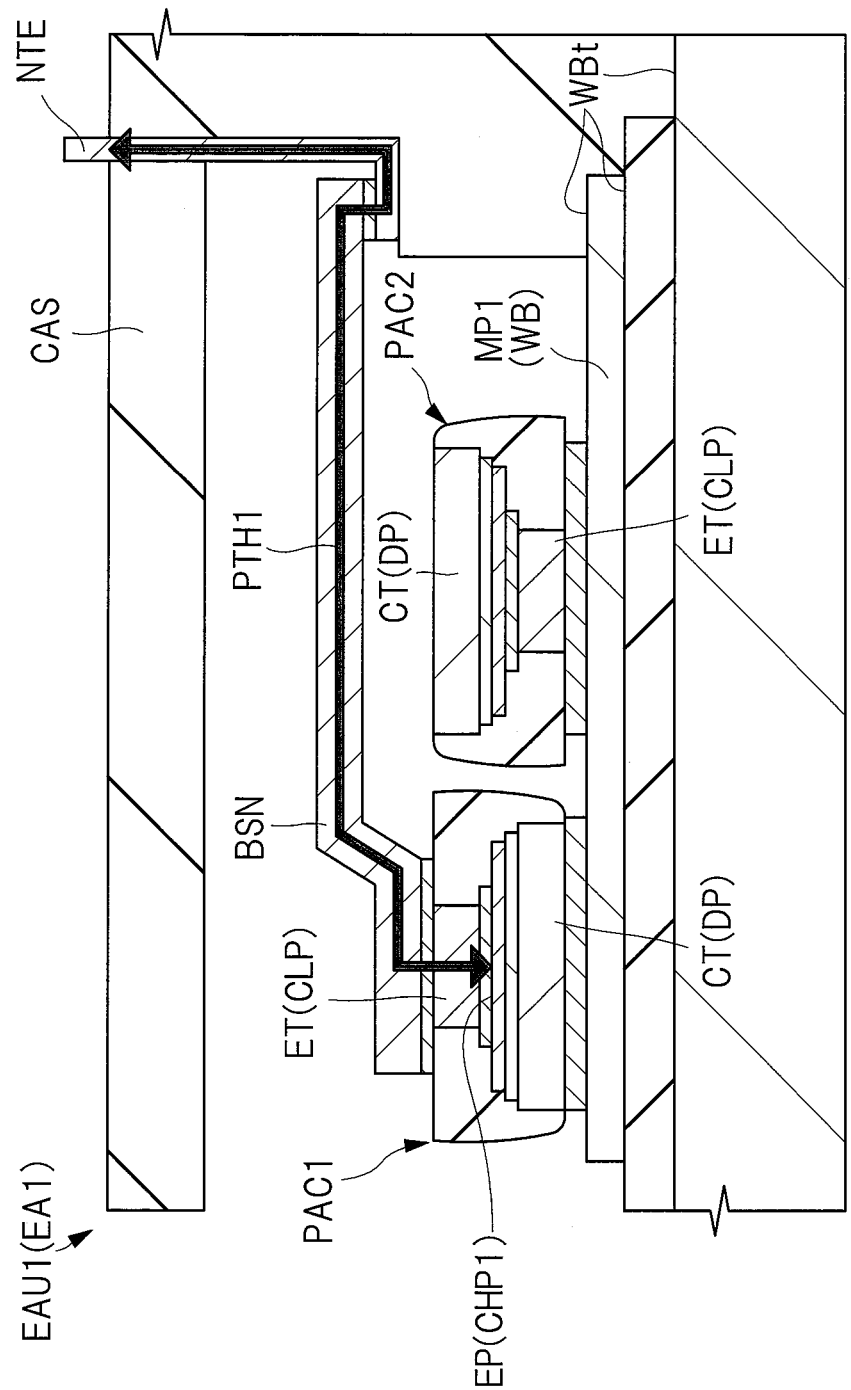
FIG. 20 is a cross-sectional view along a path that electrically connects a terminal on a low side and an electrode of the semiconductor chip.
Figure 21:
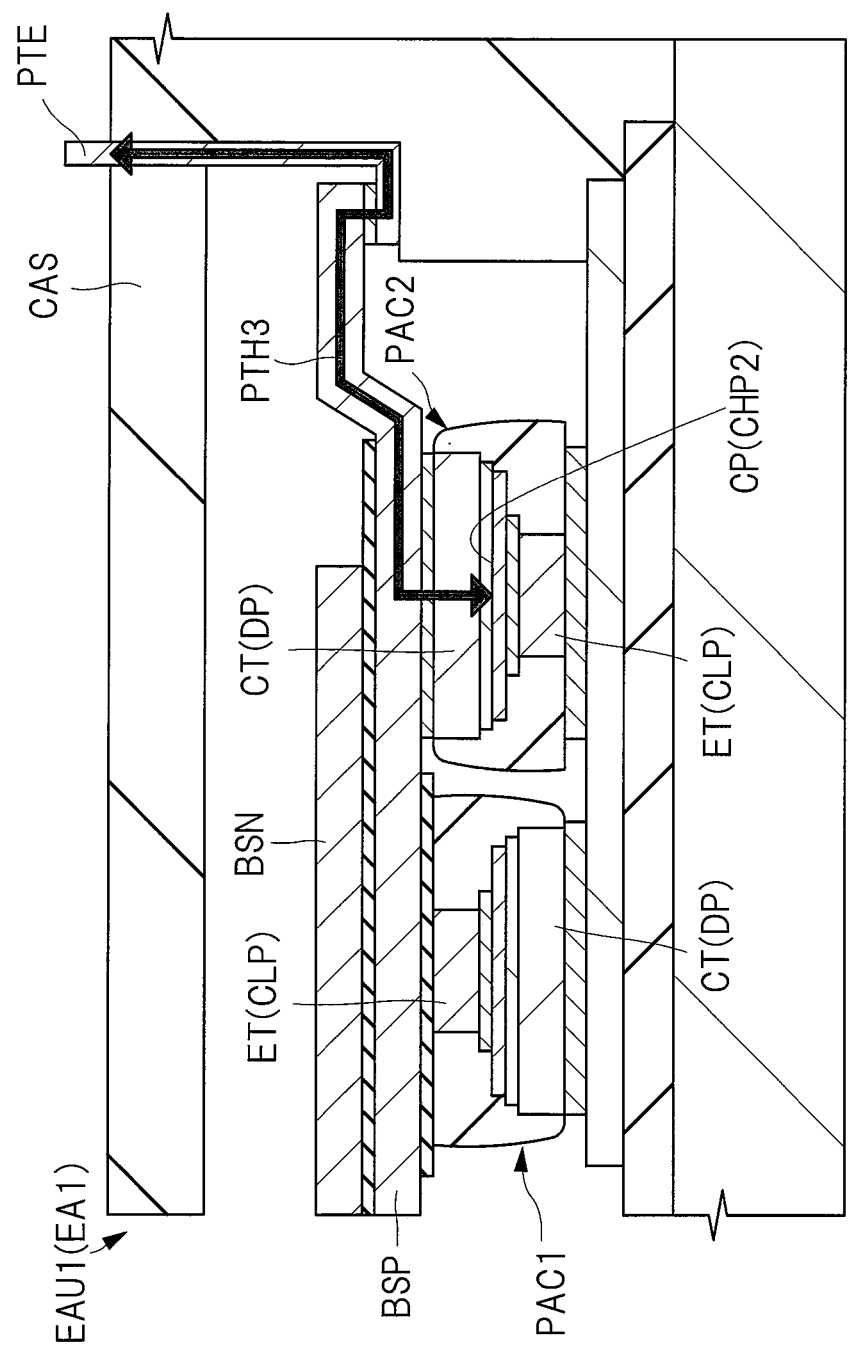
FIG. 21 is a cross-sectional view along a path that electrically connects a terminal on a high side and an electrode of the semiconductor chip.

Subsequently, a configuration of each unit shown in FIG. 5 will be described. Incidentally, since each of the three units EAU1 shown in FIG. 5 has the same structure, the unit EAU1 connected with the terminal WTE will be described as a typical example in the following description. FIG. 16 is an enlarged plan view showing one of the three units shown in FIG. 5. In FIG. 16, among the respective members shown in FIG. 5, the bus bar BSN is denoted as a dotted line, and the bus bar BSP is denoted as a two-dot chain line. FIG. 17 is a circuit diagram showing circuit elements corresponding to the units shown in FIG. 16. FIG. 18 is a cross-sectional view taken along line A-A of FIG. 16. FIG. 19 is a cross-sectional view taken along line B-B of FIG. 16. FIGS. 20 and 21 are cross-sectional views taken along a path that electrically connects the high side or the low side terminal and the electrode of the semiconductor chip. In FIGS. 18, 20, and 21, a transmission path electrically connecting the electrode of the semiconductor chip and the terminal WTE, NTE or PTE is schematically shown by using double arrows from its start point to its end point.

As shown in FIG. 16, the unit EAU1 of the electronic device EA1 has the conductor pattern MP1 formed on the upper surface WBt of the substrate WB. The unit EAU1 of the electronic device EA1 has the semiconductor devices PAC1 and PAC2.

As shown in FIG. 17, each of the semiconductor devices PAC1 and PAC2 has the semiconductor chip CHP1 having the transistor Q1 and the semiconductor chip CHP2 including the diode FWD. The semiconductor devices PAC1 and PAC2 each have the emitter terminal ET connected with the emitter electrode EP of the semiconductor chip CHP1 and the anode electrode ADP of the semiconductor chip CHP2, and the collector terminal CT connected with the collector electrode CP of the semiconductor chip CHP1 and the cathode electrode CDP of the semiconductor chip CHP2. Each of the semiconductor devices PAC1 and PAC2 has the gate terminal GT connected with the gate electrode GP (see FIG. 15) of the semiconductor chip CHP1 via the wire BW (see FIG. 15).

The emitter electrode EP of the semiconductor chip CHP1 in the semiconductor device PAC1 is electrically connected with the terminal NTE via the emitter terminal ET. In FIG. 20, the transmission path electrically connecting the emitter electrode EP of the semiconductor device PAC1 and the terminal NTE is denoted as a double arrow and illustrated as a path PTH1. The collector electrode CP of the semiconductor chip CHP1 in the semiconductor device PAC1 shown in FIG. 17 is electrically connected with the terminal WTE via the collector terminal CT. In FIG. 18, the transmission path electrically connecting the collector electrode CP (see FIG. 17) of the semiconductor device PAC1 and the terminal WTE is denoted as a double arrow and illustrated as a path PTH2.

The collector electrode CP of the semiconductor chip CHP1 in the semiconductor device PAC2 shown in FIG. 17 is electrically connected with the terminal PTE via the collector terminal CT. In FIG. 21, the transmission path electrically connecting the collector electrode CP of the semiconductor device PAC2 and the terminal PTE is denoted as a double arrow and illustrated as a path PTH3. The emitter electrode EP of the semiconductor chip CHP1 in the semiconductor device PAC2 is electrically connected with the terminal WTE via the emitter terminal ET and the conductor pattern MP1.

The collector terminal CT of the semiconductor device PAC1 and the emitter terminal ET of the semiconductor device PAC2 are electrically connected with each other via the conductor pattern MP1. In other words, the collector electrode CP of the semiconductor device PAC1 and the emitter electrode EP of the semiconductor device PAC2 are electrically connected with each other via the conductor pattern MP1. When the inverter circuit INV described with reference to FIG. 1 is caused to operate, the semiconductor device PAC2 operates as the switch SW5 for a high side shown in FIG. 1, and the semiconductor device PAC1 operates as the switch SW6 for a low side shown in FIG. 1.

The gate terminal GT of the semiconductor device PAC1 shown in FIG. 18 has a bent portion outside the sealing body MR and is connected with the terminal GTE1 without interposing the substrate WB. In other words, the gate electrode GP (see FIG. 15) of the semiconductor chip CHP1 in the semiconductor device PAC1 is connected with the terminal GTE1 without interposing the substrate WB. The lead LD which is the gate terminal GT of the semiconductor device PAC1 is folded in a thickness direction of the electronic device EA1 (Z direction shown in FIG. 18) so that the tip of the lead LD closer to the main surface MRt than the main surface MRb of the sealing body MR.

Likewise, the gate terminal GT of the semiconductor device PAC2 shown in FIG. 19 has a bent portion outside the sealing body MR and is connected with the terminal GTE2 without interposing the substrate WB. In other words, the gate electrode GP (see FIG. 15) of the semiconductor chip CHP1 in the semiconductor device PAC2 is connected with the terminal GTE2 without interposing the substrate WB. The lead LD which is the gate terminal GT of the semiconductor device PAC2 is folded in the thickness direction (Z direction shown in FIG. 19) of the electronic device EA1 so that the tip of the lead LD is closer to the main surface MRb than the main surface MRt of the sealing body MR.

The bending directions of the leads LD shown in FIGS. 18 and 19 can be expressed as follows. That is, the gate terminal GT of the semiconductor device PAC1 shown in FIG. 18 has the bent portion that bends in a direction from the main surface MRb side to the main surface MRt side with respect to the thickness direction of the sealing body MR. The gate terminal GT of the semiconductor device PAC2 shown in FIG. 19 has a bent portion that bends in a direction from the main surface MRt side to the main surface MRb side. In this way, the semiconductor devices PAC1 and PAC2 are different in bending direction of the lead LD which is the gate terminal GT.

According to a modification to the present embodiment, a conductor pattern (wiring pattern) for connecting the gate terminal GT to the substrate WB is formed, and thereby the gate terminal GT may be connected via its conductor pattern to each of the terminals GTE1 and GTE2 which are external terminals. However, if the gate terminal GT is connected with the terminals GTE1 and GTE2 without passing through the substrate WB as shown in the present embodiment, a transmission path of a gate signal can be shortened. In the case where the gate terminal GT is connected with the terminals GTE1 and GTE2 without passing through the substrate WB, an area of the substrate WB can be reduced, which is advantageous from the viewpoint of reduction in a size of the electronic device EA1.

The main surface MRb of the sealing body MR in the semiconductor device PAC1 shown in FIG. 18 faces the upper surface WBt of the substrate WB. The die pad DP exposed from the main surface MRb of the sealing body MR in the semiconductor device PAC1 is electrically connected with the conductor pattern MP1 via a connection member (conductive member, conductive adhesive agent, and adjoining material) BND1.

The clip CLP exposed from the main surface MRt of the sealing body MR in the semiconductor device PAC1 is electrically connected with the bus bar BSN via a connection member (conductive member, conductive adhesive agent, clip bond material, adjoining material) BND2. The clip CLP of the semiconductor device PACT is electrically connected with the terminal NTE (see FIG. 16) via the bus bar BSN. The bus bars BSN and BSP are bar-shaped conductive members placed in a path that electrically connects a terminal of the semiconductor device and an external terminal of the electronic device, and are configured to reduce transmission loss of the path PTH1 shown in FIG. 20 and the path PTH3 shown in FIG. 21. For example, the bus bars BSN and BSP are each made of a material having a high electric conduction rate. An example of a material having a high electric conduction rate include, for example, a metal material containing copper (Cu) as a main component or a metal material containing aluminum (Al) as a main component. For example, a cross-sectional area of the transmission path of each of the bus bars BSN and BSP is larger than, for example, that of a member such as the lead LD.

Incidentally, a part of the clip CLP of the semiconductor device PAC1 and a part of the bus bar BSP are faced to each other. However, an insulating film IF1 is placed between the bus bar BSP and the clip CLP of the semiconductor device PAC1. Therefore, the clip CLP of the semiconductor device PAC1 and the bus bar BSP are insulated from each other. A part of the bus bar BSN and a part of the bus bar BSP are faced to each other. However, an insulating film IF2 is placed between the bus bars BSN and BSP. Therefore, the bus bars BSN and BSP are isolated from each other.

The main surface MRt of the sealing body MR in the semiconductor device PAC2 shown in FIG. 19 faces the upper surface WBt of the substrate WB. The clip CLP exposed from the main surface MRt of the sealing body MR in the semiconductor device PAC2 is electrically connected with the conductor pattern MP1 via the connection member BND1.

The die pad DP exposed from the main surface MRb of the sealing body MR in the semiconductor device PAC2 is electrically connected with the bus bar BSP via a connection member (conductive member, conductive adhesive agent, and adjoining material) BND3. The die pad DP of the semiconductor device PAC2 is electrically connected with the terminal PTE (see FIG. 16) via the bus bar BSP. Incidentally, a part of the die pad DP in the semiconductor device PAC2 and a part of the bus bar BSN are faced to each other. However, an insulating film IF2 is placed between the die pad DP of the semiconductor device PAC2 and the bus bar BSN. Therefore, the die pad DP of the semiconductor device PAC2 and the bus bar BSN are insulated from each other.

Similarly to the conductive adhesive agents ADH1 and ADH2 described with reference to FIG. 15, each of the connection members BND1 and BND2 shown in FIG. 18 and the connection member BND3 shown in FIG. 19 is a conductive material such as solder or a conductive resin.

Here, various performance improvement requests for an electronic device equipped with an inverter circuit such as an electronic device EA1 include a request for reducing an inductance and impedance of a transmission path connecting a transistor operating as a switch to an external terminal. In particular, among the transmission paths shown in FIG. 17, a path connecting the transistor Q1 and the terminal PTE to which a relatively high potential is supplied (path PTH3 shown in FIG. 21), and a path connecting the transistor Q1 and the terminal NTE to which a relatively low potential is supplied (path PTH1 shown in FIG. 20) can reduce a loss of an input voltage by reducing the inductance. Among the transmission paths shown in FIG. 17, a path connecting the transistor Q1 and the terminal WTE that is an output terminal (path PTH2 shown in FIG. 18) can reduce a loss of output power by reducing the inductance and the impedance. In other words, the above three paths can improve the power conversion efficiency by reducing the inductance and the impedance in the transmission path.

When an electronic device is made by applying a package mounting method as in this first embodiment for mounting, on the substrate, a plurality of semiconductor packages (semiconductor devices) in which semiconductor chips are resin-sealed, it is understood that the power conversion efficiency can be improved by devising a composition and a layout of the semiconductor packages. For example, a case where elongated conductive members like the leads LD shown in FIG. 16 are used as the emitter terminals ET of the semiconductor devices PAC1 and PAC2 shown in FIG. 17 will be hereinafter considered as a comparison with the present embodiment.

When the elongated conductive member such as the lead LD is utilized as the emitter terminal ET, a resistance component(s) in the transmission path can be reduced by increasing the number of leads LD connected with the same emitter electrode. This corresponds to, for example, a case where the lead LDC shown in FIGS. 14 and 15 is used as the emitter terminal. However, in view of the inductance component in the transmission path, it is preferable that the emitter terminal ET is not divided into plural parts. When the conductive member such as the lead LD is used as the emitter terminal ET, a degree of flexibility in a position of the emitter terminal is restricted due to restriction in a manufacturing process of the semiconductor device. In this case, when the emitter terminal ET of the semiconductor device PAC2 and the collector terminal CT of the semiconductor device PAC1 are connected as shown in FIG. 17, a length of a connection wiring is easy to be great.

As described above, in the case of the electronic device EA1 according to this first embodiment, the surface of the clip CLP exposed from the sealing body MR is used as the emitter terminal ET and the surface of the die pad DP exposed from the sealing body MR is used as the collector terminal CT. For this reason, as shown in FIGS. 12 and 13, the areas of the emitter terminal ET and the collector terminal CT of the semiconductor device PAC can be increased.

The main surface MRb of the sealing body MR in the semiconductor device PAC1 shown in FIG. 18 faces the conductor pattern MP1 of the substrate WB. The main surface MRt of the sealing body MR in the semiconductor device PAC2 shown in FIG. 19 faces the conductor pattern MP1 of the substrate WB. In other words, the semiconductor devices PAC1 and PAC2 are mounted on the substrate WB with their thickness indirections opposing each other. In this case, the emitter terminal ET of the semiconductor device PAC1 shown in FIG. 18 and the collector terminal CT of the semiconductor device PAC2 shown in FIG. 19 are each exposed from the surfaces opposing the surfaces facing the substrate WB.

Therefore, an area (connection area) of a connection portion (connection interface of the connection member BND2 shown in FIG. 18) between the emitter terminal ET of the semiconductor device PAC1 and the bus bar BSN disposed on the semiconductor device PAC1 shown in FIG. 18 can be enlarged. An area (connection area) of a connection portion (connection interface of the connection member BND3 shown in FIG. 19) between the collector terminal CT of the semiconductor device PAC2 and the bus bar BSP provided on the semiconductor device PAC2 shown in FIG. 19 can be enlarged.

The bus bars BSN and BSP are located on each of the semiconductor devices PAC1 and PAC2, and therefore the bus bars BSN and BSP are restricted less in layout than the lead LD passing through the side surface MRs of the sealing body MR. Therefore, each of the bus bars BSN and BSP can increase the cross-sectional area of the transmission path. For example, the thicknesses of the bus bars BSN and BSP are thicker than that of the lead LD. In the example shown in FIGS. 18 and 19, the thicknesses of the bus bars BSN and BSP are thicker than that of a member constituting the terminal WTE. However, as a modification, the thickness of the member constituting the terminal WTE may be equal to or more than those of the bus bars BSN and BSP. For example, widths of the bus bars BSN and BSP (a length in a direction orthogonal to an extending direction) are wider than that of the lead LD. The widths of the bus bars BSN and BSP are not constant, but the widths of the bus bars BSN and BSP are wider than that of the lead LD also at their narrowest parts.

Thus, the bus bar BSN can easily increase the cross-sectional area of the transmission path, and so if an area of a connection portion between the emitter terminal ET of the semiconductor device PAC1 and the bus bar BSN as shown in FIG. 18 can be increased, the inductance of the transmission path (a portion of the path PTH1) extending from the terminal NTE to the emitter terminal ET of the semiconductor device PAC1 shown in FIG. 20 can be reduced. The bus bar BSP can easily increase the cross-sectional area of the transmission path, and so if an area of a connection portion between the collector terminal CT of the semiconductor device PAC2 and the bus bar BSP shown in FIG. 19 can be increased, the inductance of the transmission path (a portion of the path PTH3) extending from the terminal PTE to the collector terminal CT of the semiconductor device PAC2 as shown in FIG. 21 can be reduced.

The configuration of the electronic device EA1 according to this first embodiment can also be expressed as follows. That is, an elongated conductive member like the lead LD shown in FIG. 16 is not interposed between the terminal PTE and the collector electrode CP of the transistor Q1 in the semiconductor device PAC2 as shown in FIG. 17. Therefore, reduced can be an inductance component(s) in a potential supply path (path PTH3 shown in FIG. 21) which supplies a relatively high potential to the high side switch. An elongated conductive member like the lead LD shown in FIG. 16 is not interposed between the terminal NTE and the emitter electrode EP of the transistor Q1 in the semiconductor device PAC1 shown in FIG. 17. Therefore, reduced can be an inductance component(s) in a potential supply path (path PTH1 shown in FIG. 20) which supplies a relatively low potential to the low side switch.

In the case of the electronic device EA1 according to this first embodiment, each of the collector terminal CT of the semiconductor device PAC1 and the emitter terminal ET of the semiconductor device PAC2 is connected via the connection member BND1 on one conductor pattern MP1. As shown in FIG. 18, the conductor pattern MP1 is connected with the terminal WTE which is an output terminal. In other words, according to this first embodiment, an elongated conductive member like the lead LD shown in FIG. 16 is not interposed in a path that electrically connects the emitter electrode EP of the transistor Q1 in the semiconductor device PAC2 and the conductor pattern MP1 shown in FIG. 17, and a path that electrically connects the collector electrode CP of the transistor Q1 in the semiconductor device PAC1 and the conductor pattern MP1 shown in FIG. 17. Therefore, reduced can be an inductance component in the path (path PTH2 shown in FIG. 18) connecting the terminal WTE, which is an output terminal, and the transistor Q1. In this case, as described above, a loss of power that is outputted can be reduced, and therefore the power conversion efficiency of the inverter circuit can be improved.

In this first embodiment, each of the bus bars BSN and BSP shown in FIG. 6 is electrically separated from all conductor patterns including the conductor pattern MP1 provided on the substrate WB. In other words, each of the bus bars BSN and BSP is connected with the terminal NTE or PTE without passing through the substrate WB. In the thickness direction (Z direction shown in FIG. 18) of the electronic device EA1, the bus bar BSN is located between the emitter terminal ET of the semiconductor device PAC1 and the terminal NTE (see FIG. 4). In the thickness direction (Z direction shown in FIG. 19) of the electronic device EA1, the bus bar BSP is located between the collector terminal CT of the semiconductor device PAC2 and the terminal PTE (see FIG. 4).

As shown in FIG. 20, when the path PTH1 electrically connecting the emitter electrode EP of the semiconductor device PAC1 and the terminal NTE does not pass through the substrate WB, a wiring path distance of the path PTH1 can be shortened, so that the inductance component in the path PTH1 can be reduced. For example, in the case of this first embodiment, the path distance of the path PTH1 is shorter than that of the path PTH2 that electrically connects the collector electrode CP (see FIG. 7) of the semiconductor device PAC1 and the terminal WTE shown in FIG. 18.

As shown in FIG. 21, in the case where the path PTH3 electrically connecting the collector electrode CP of the semiconductor device PAC2 and the terminal PTE does not pass through the substrate WB, a wiring path distance of the path PTH3 can be reduced, so that the inductance component in the path PTH3 can be reduced. For example, in this first embodiment, the path distance of the path PTH3 is shorter than that of the path PTH2 which electrically connects the collector electrode CP (see FIG. 7) of the semiconductor device PACT and the terminal WTE shown in FIG. 18.

As shown in FIG. 18, the substrate WB, which the electronic device EA1 according to this first embodiment has, is a substrate called an insulated metal substrate (IMS). The substrate WB which is an insulated metal substrate includes: a base material BMS containing metal such as aluminum as a main component; an insulating film IF3 on one surface (upper surface WBt) of the base material BMS; and a conductor pattern MP1 on the insulating film IF3. The insulating film IF3 is an organic insulating film whose main component is a resin material such as an epoxy type resin, and the thickness of the insulating film IF3 is thinner than that of the base material BMS. In FIG. 18, the thickness of the insulating film IF3 is equal to or less than $1/3$ and equal to or more than $1/4$ of the thickness of the base material BMS, but may be equal to or less than $1/10$ of the thickness of the base material BMS. Use of an insulated metal substrate as the substrate WB of the electronic device EA1 according to this first embodiment is preferable for the following reasons.

Although not shown in the drawings, a so-called ceramic substrate in which a conductor pattern MP1 is formed on an upper surface of a ceramic base material can be used in a modification to the substrate WB shown in FIG. 18. However, in a case of the ceramic substrate, a difference between linear expansion coefficients of the ceramic base material and the conductor pattern MP1 is large. Therefore, when a temperature cycle load is applied to the ceramic substrate, a stress caused by the difference between the linear expansion coefficients is applied to an interface between the base material and the conductor pattern MP1, and the conductor pattern MP1 may be peeled off. A magnitude of this stress increases in proportion to the area of the conductor pattern MP1. Namely, if the ceramic substrate is applied, there is a fear of the conductor pattern MP1 peeling off from the base material when the area of the conductor pattern MP1 is large.

In the case of the substrate WB which is an insulated metal substrate, the conductor pattern MP1 is a metal film made of a metal material whose main component is, for example, copper. Therefore, there is a great difference between the linear expansion coefficients of the insulating film IF3 and the conductor pattern MP1. However, the insulating film IF3 is adhered to between the base material BMS made of sufficiently thick metal and the conductor pattern MP1. Therefore, even if a temperature cycle load is applied to the insulated metal substrate, the stress generated due to the above-mentioned difference between the linear expansion coefficients can be reduced. Accordingly, even if the area of the conductor pattern MP1 is large, the conductor pattern MP1 is difficult to peel off from the insulating film IF3. In other words, when the insulated metal substrate is used as the substrate WB, the area of the conductor pattern MP1 can be increased.

As mentioned above, in this first embodiment, the conductor pattern MP1 constitutes a portion of the transmission path connected with the WTE which is an output terminal. Therefore, when the area of the conductor pattern MP1 is increased, the cross-sectional area of the path PTH2 shown in FIG. 18 can be increased. In other words, when the insulated metal substrate is used as the substrate WB, the inductance component of the path PTH2 can be reduced.

Figure 22:
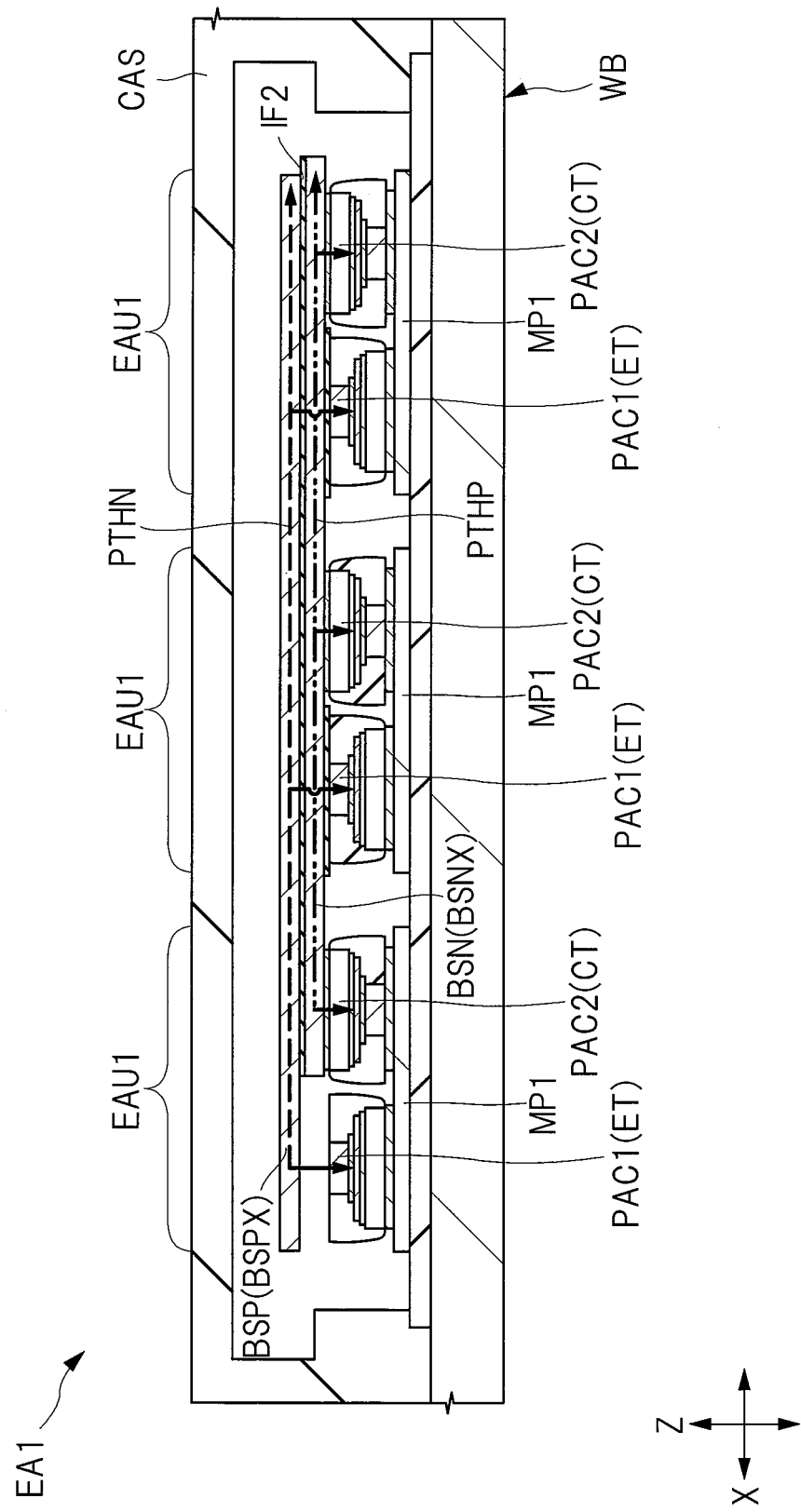
FIG. 22 is a cross-sectional view taken along line A-A of FIG. 5.

FIG. 22 is a cross-sectional view taken along line A-A of FIG. 5. In FIG. 22, a supply path of a low side potential supplied to the bus bar BSN is schematically indicated by a broken line, and a supply path of a high side potential supplied to the bus bar BSP is schematically indicated by a two-dot chain line.

Since the electronic device EA1 according to this first embodiment has the three-phase inverter circuit as described above, the electronic device EA1 includes the three units EAU1 as shown in FIGS. 5 and 22. The three units EAU1 are arranged so as to line up along the X direction. Each unit EAU1 has the semiconductor device PAC1 connected with the bus bar BSN and the semiconductor device PAC2 connected with the bus bar BSN.

The bus bar BSN has a portion BSNX extending along the X direction and is connected with the emitter terminal ET of the semiconductor device PAC1 that each unit EAU1 (see FIG. 22) has. The bus bar BSP has a portion BSPX extending along the X direction and is connected with the collector terminal CT of the semiconductor device PAC2 that each unit EAU1 (see FIG. 22) has.

As shown in FIGS. 21 and 22, in a plane view, the portion BSNX of the bus bar BSN (see FIG. 22) and the portion BSPX of the bus bar BSP (see FIG. 22) overlap each other. In other words, in the thickness direction, the portion BSNX of the bus bar BSN and the portion BSPX of the bus bar BSP face each other. When the portion BSNX of the bus bar BSN and the portion BSPX of the bus bar BSP overlap each other as described above, this is advantageous in the following points. That is, when the portions BSNX and BSPX overlap each other as shown as the paths PTHN and PTHP in FIG. 22, the respective paths PTHN and PTHP are in states of extending in parallel along the X direction. A separation distance between the paths PTHN and PTHP is defined by the thicknesses of the bus bar BSP, the bus bar BSN, and the insulating film IF2, and has a substantially constant value. In other words, the portions BSNX and BSPX are arranged in states substantially parallel to each other. In this case, coupling occurs between the paths PTHN and PTHP, and the inductance of each path can be reduced by an influence of this coupling.

Incidentally, "Substantially constant" or "substantially parallel" mentioned above is not limited to "constant" or "parallel" in a strict sense. As long as a potential relation between the above paths is a range in which an effect of reducing the inductance is obtained by generating the coupling between the paths PTHN and PTHP, some errors can be reduced as "substantially constant" or "substantially parallel".

The effect of reducing the inductance due to parallel of the paths PTHN and PTHP can be obtained even in a case of, for example, a single-phase inverter constituted by the single unit EAU1 shown in FIG. 22. However, the above inductance reduction effect improves as a parallel distance of the paths PTHN and PTHP parallel extending becomes longer. Therefore, the effect is particularly significant when the above potential relation is applied to the electronic device EA1 in which the three units EAU1 are arranged side by side along the X direction as shown in the present embodiment.

As shown in FIG. 21, in a plane view, each of the plural semiconductor devices PAC1 and the plural semiconductor devices PAC2 are alternately arranged along the X direction so that the semiconductor devices PAC1 and PAC2 are adjacent to each other. Therefore, from the viewpoint of maximizing an area of a connection portion between the bus bar BSP and the semiconductor device PAC2 and an area of a connection portion between the bus bar BSN and the semiconductor device PAC1, the portions BSNX and BSPX are preferably arranged at positions not overlapping the plural semiconductor devices PAC1 and the plural semiconductor devices PAC2.

However, in this first embodiment, as shown in FIG. 21 and FIG. 22, in the plan view, the portion BSNX of the bus bar BSN (see FIG. 22) and the portion BSPX of the bus bar BSP (see FIG. 22) overlap the plural semiconductor devices PAC1 and the plural semiconductor devices PAC2. In this case, since extension distances of the bus bars BSN and BSP can be shortened, the size of the electronic device EA1 can be reduced.

When the single terminal NTE and the single terminal PTE are provided as shown in FIG. 5, the distances of the paths PTHN and PTHP shown in FIG. 22 may be long depending on a position of the unit EAU1. For example, regarding the unit EAU1 which is arranged at the position farthest from the terminals PTE and NTE among the three units shown in FIG. 5, distances of the paths PTHN and PTHP shown in FIG. 22 are longer than those of the other units EAU1.

Therefore, the thicknesses of the portion BSNX of the bus bar BSN and the portion BSPX of the bus bar BSP are preferably thick enough to compensate for the reduction in the inductance by elongating the distances of the paths PTHN and PTHP. In the example shown in FIG. 22, the thicknesses of the portions BSNX and BSPX are each thicker than that of the conductor pattern MP1.

Manufacturing Method of Semiconductor Device

Figure 23:
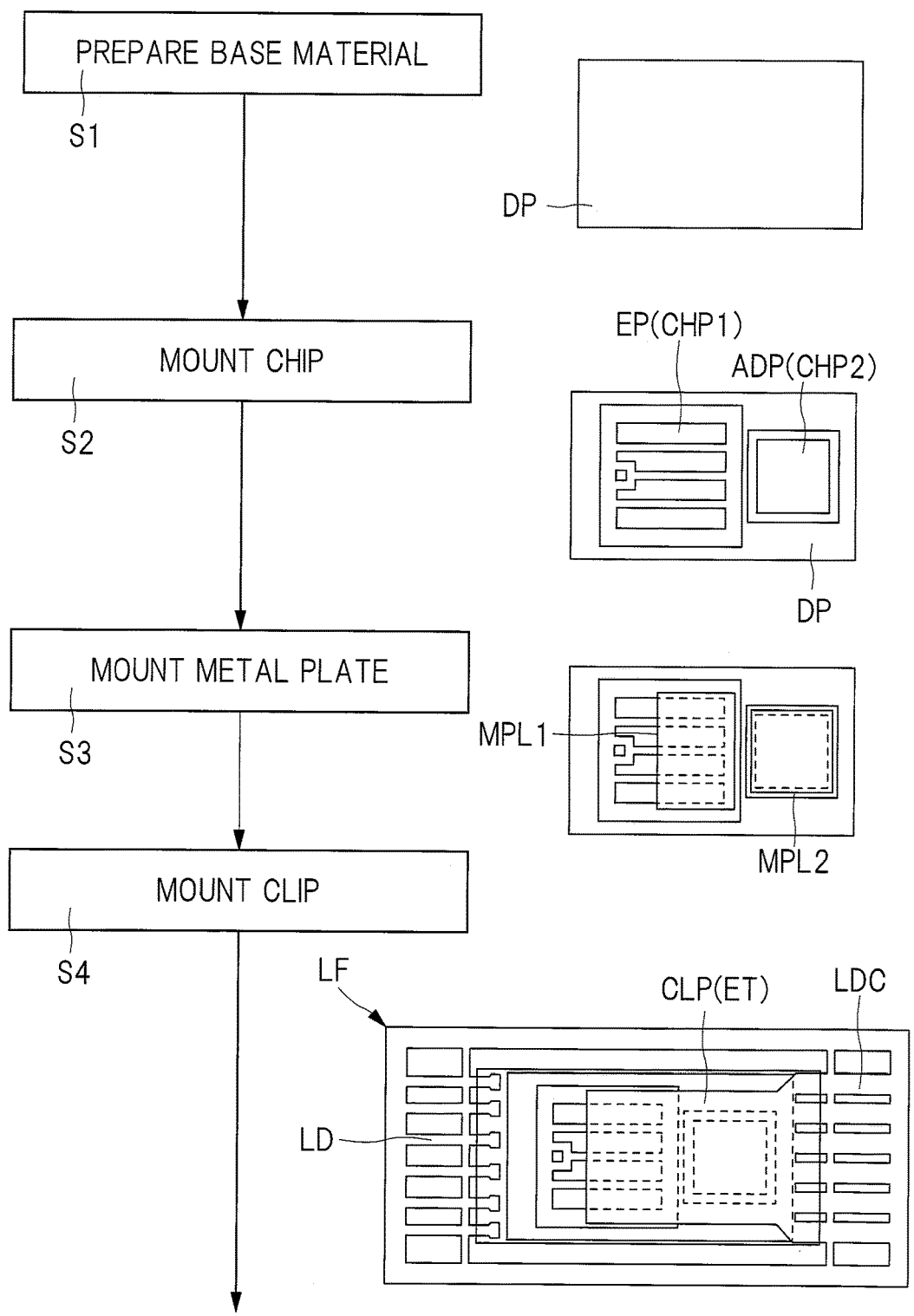
FIG. 23 is an explanatory diagram showing an assembling flow of the semiconductor device shown in FIG. 14 and FIG. 15.
Figure 24:
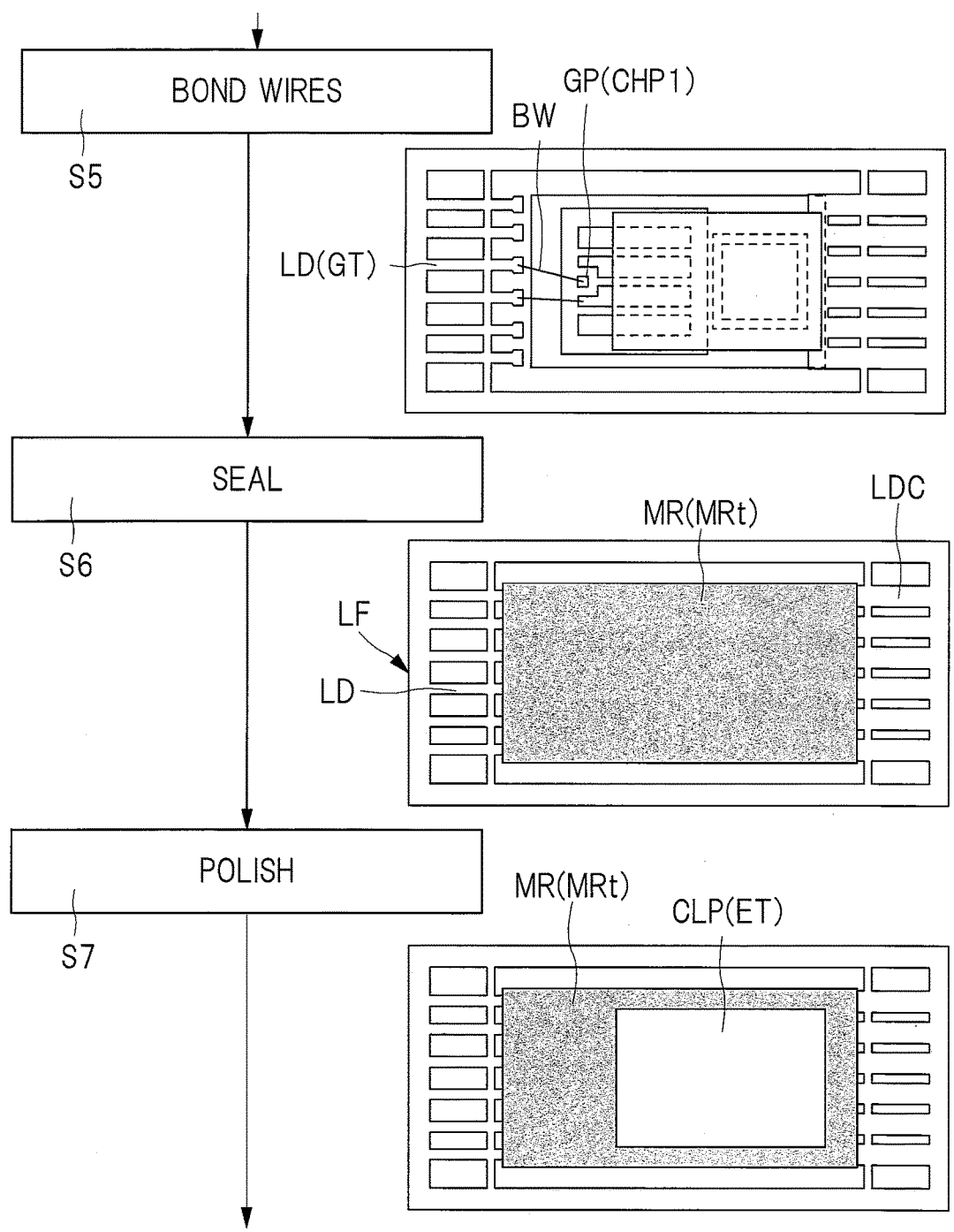
FIG. 24 is an explanatory diagram showing an assembly flow of the semiconductor device subsequent to FIG. 23.
Figure 25:
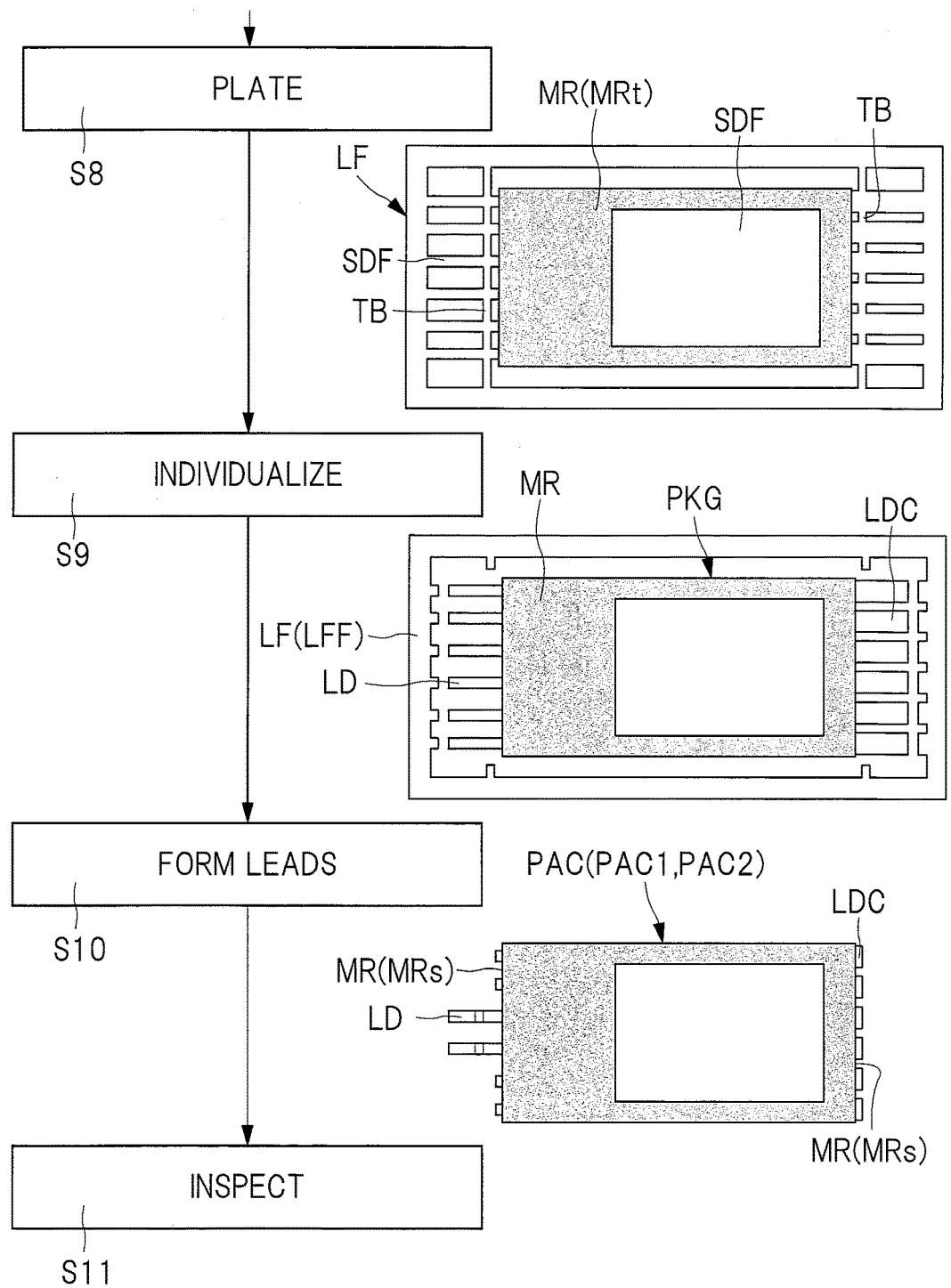
FIG. 25 is an explanatory diagram showing an assembly flow of the semiconductor device subsequent to FIG. 24.

Subsequently, a manufacturing method of the semiconductor devices PAC1 and PAC2 mounted on the electronic device EA1 shown in FIG. 5 will be described. However, as described above, the semiconductor devices PAC1 and PAC2 have similar configurations. For this reason, in the following explanation about the manufacturing method of the semiconductor devices PAC1 and PAC2, portions common to each other will be described as a semiconductor device PAC. FIGS. 23, 24, and 25 are explanatory views showing an assembly flow of the semiconductor device shown in FIGS. 14 and 15. Incidentally, in FIGS. 23 to 25, a plan view illustrating an overview of each step is attached in proximity to each step. The following explanation will be given by referring to, in principle, the plan views shown in FIGS. 23 to 25, and the already explained figures (for example, FIGS. 14, 15, and the like).

Preparation of Base Material

First, in step S1 (base-material preparation process) shown in FIG. 23, the die pad DP which is the base material for mounting the semiconductor chip is prepared. Incidentally, in a case where the die pad DP is formed integrally with the lead frame LF (see a plan view of step S3) as a modification to the present embodiment, a lead frame LF in which a die pad DP and a plurality of leads LD are integrally formed may be prepared in step S1.

As shown in FIG. 15, a thickness of the die pad DP according to the present embodiment is thicker than those of the lead LD and the lead LDC. In this case, radiation efficiency of a heat radiation path going through the die pad DP can be improved. However, since the thickness of the die pad DP is thicker than that of the lead LD, the die pad DP is manufactured as a member independent from the lead frame LF (see FIG. 23). Therefore, in the case of the present embodiment, in step S1, the die pad DP which is a chip mounting portion is prepared. The die pad DP is made of a metal material containing, for example, copper as a main component.

Chip Mounting

Subsequently, in step S2 (chip mounting process) shown in FIG. 23, the semiconductor chips CHP1 and CHP2 are mounted on the die pad DP. As shown in FIG. 15, in this process, the semiconductor chip CHP1 is mounted via the conductive adhesive agent ADH1 so that the collector electrode CP formed on the back surface CHPb of the semiconductor chip CHP1 and the die pad DP face each other. The semiconductor chip CHP2 is mounted via the conductive adhesive agent ADH1 so that the cathode electrode CDP formed on the back surface CHPb of the semiconductor chip CHP2 and the die pad DP face each other.

In this process, a paste-like conductive adhesive agent ADH1 is placed on a planned region (chip mounting region) of mounting the semiconductor chip CHP1 and a planned region (chip mounting region) of mounting the semiconductor chip CHP2. Thereafter, the semiconductor chips CHP1 and CHP2 are each mounted on the die pad DP with the respective back surface CHPb (see FIGS. 7 and 10) sides of the semiconductor chips CHP1 and CHP2 pressed to the conductive adhesive agent ADH1.

Incidentally, when solder is used for each of the conductive adhesive agents ADH1, ADH2, and ADH3 shown in FIG. 15, a thermal treatment (reflow) is not performed in step S2, but a reflow is performed after the clip mounting process shown in step S4. On the other hand, when a conductive resin in which metal particles such as silver (Ag) are contained in a thermosetting resin is used for each of the conductive adhesive agents ADH1, ADH2, and ADH3, a thermal treatment (curing bake) at a temperature at which the conductive adhesive agent ADH1 is cured may be performed in step S2. Even when a conductive resin is used for each of the conductive adhesive agents ADH1, ADH2, and ADH3, curing bake may be performed after the clip mounting process shown as step S4.

When solder having higher melting points in an order of the conductive adhesive agents ADH1, ADH2, and ADH3 is used, a reflow can also be performed in this process. However, after the reflow, it is necessary to perform a cleaning process and remove a residual(s) of a flux component(s). Therefore, from the viewpoint of improving the manufacturing efficiency, it is better to reduce the number of times of the reflow.

Metal Plate Mounting

Subsequently, in step S3 (metal-plate mounting process) shown in FIG. 23, the metal plate MPL1 is mounted on the semiconductor chip CHP1, and the metal plate MPL2 is mounted on the semiconductor chip CHP2. More specifically, the metal plate MPL1 is mounted on the emitter electrode EP of the semiconductor chip CHP1 via the conductive adhesive agent ADH2 (see FIG. 15). The metal plate MPL2 is mounted on the anode electrode ADP of the semiconductor chip CHP2 via the conductive adhesive agent ADH2.

In this process, the paste-like conductive adhesive agent ADH2 is placed on each of the emitter electrode EP of the semiconductor chip CHP1, and the anode electrode ADP of the semiconductor chip CHP2. Thereafter, the metal plates MPL1 and MPL2 are mounted by pressing one surface of each of the metal plates MPL1 and MPL2 against the conductive adhesive agent ADH2.

It has already been explained that timing for performing the thermal treatment (reflow or curing bake) is different depending on the respective materials used for the conductive adhesive agents ADH1, ADH2, and ADH3 shown in FIG. 15. Since this is also applicable to this process, repeated explanation thereabout will be omitted.

This process is a process to be performed along with formation of the clip CLP integrally with the lead frame LF. This process can be omitted if the clip CLP is formed separately from the lead frame LF. In a case where bending work is subjected to a portion of the clip CLP and the metal plates MPL1 and MPL2 are not used, this process can be omitted.

Mounting of Clip

Subsequently, in step S4 (clip mounting process) shown in FIG. 23, the clip CLP is mounted on the semiconductor chips CHP1 and CHP2. More specifically, the clip CLP is mounted on the metal plates MPL1 and MPL2 via the conductive adhesive agent ADH3 (see FIG. 15).

In this process, first, the paste-like conductive adhesive agent ADH3 is placed on the upper surface of each of the metal plates MPL1 and MPL2. Thereafter, the lead frame LF in which the clip CLP and the plurality of leads LD are integrally formed is prepared, and the lower surface of the clip CLP is aligned so as to cover the front surfaces CHPt of the semiconductor chips CHP1 and CHP2 (see FIGS. 6 and 9). When the clip CLP is formed integrally with the lead frame LF as shown in the present embodiment, the lead frame LF and the die pad DP (or the lead frame and the semiconductor chip) are aligned, so that the plurality of leads LD and the clip CLP can be easily aligned.

Then, the lower surface of the clip CLP is pressed against the conductive adhesive agent ADH3 to mount the clip CLP onto the semiconductor chips CHP1 and CHP2.

The clip CLP is formed integrally with the lead frame LF having the plurality of leads LD. Therefore, in this process, the plurality of leads LD are placed around the die pad DP. This process can also be considered as a lead-frame mounting process. Incidentally, when both of the clip CLP and the die pad DP are formed separately from the lead frame LF, the lead frame LF is preferably bonded and fixed to one of the die pad DP and the clip CLP in advance.

Wire Bond

Subsequently, in step S5 (wire bond process) shown in FIG. 24, the gate electrode GP of the semiconductor chip CHP1 and the lead LD which is the gate terminal GT are electrically connected via a wire BW. In this process, the emitter electrode EP shown in FIG. 14 and the lead LD which is the signal terminal ST are electrically connected via the wire BW.

In this process, for example, one end of the wire BW is connected with the electrode (the gate electrode GP or the emitter electrode EP) of the semiconductor chip CHP1, and then a wire loop is formed. Thereafter, the wire BW is connected with a part (bonding area) of the lead LD, and then the wire is cut. As a result, the wire BW shown in FIG. 15 is obtained.

The method of electrically connecting the electrode of the semiconductor chip CHP1 and the lead LD includes various modifications. For example, instead of the wire BW, a connection may be made via a belt-shaped metal ribbon.

Sealing

Figure 26:
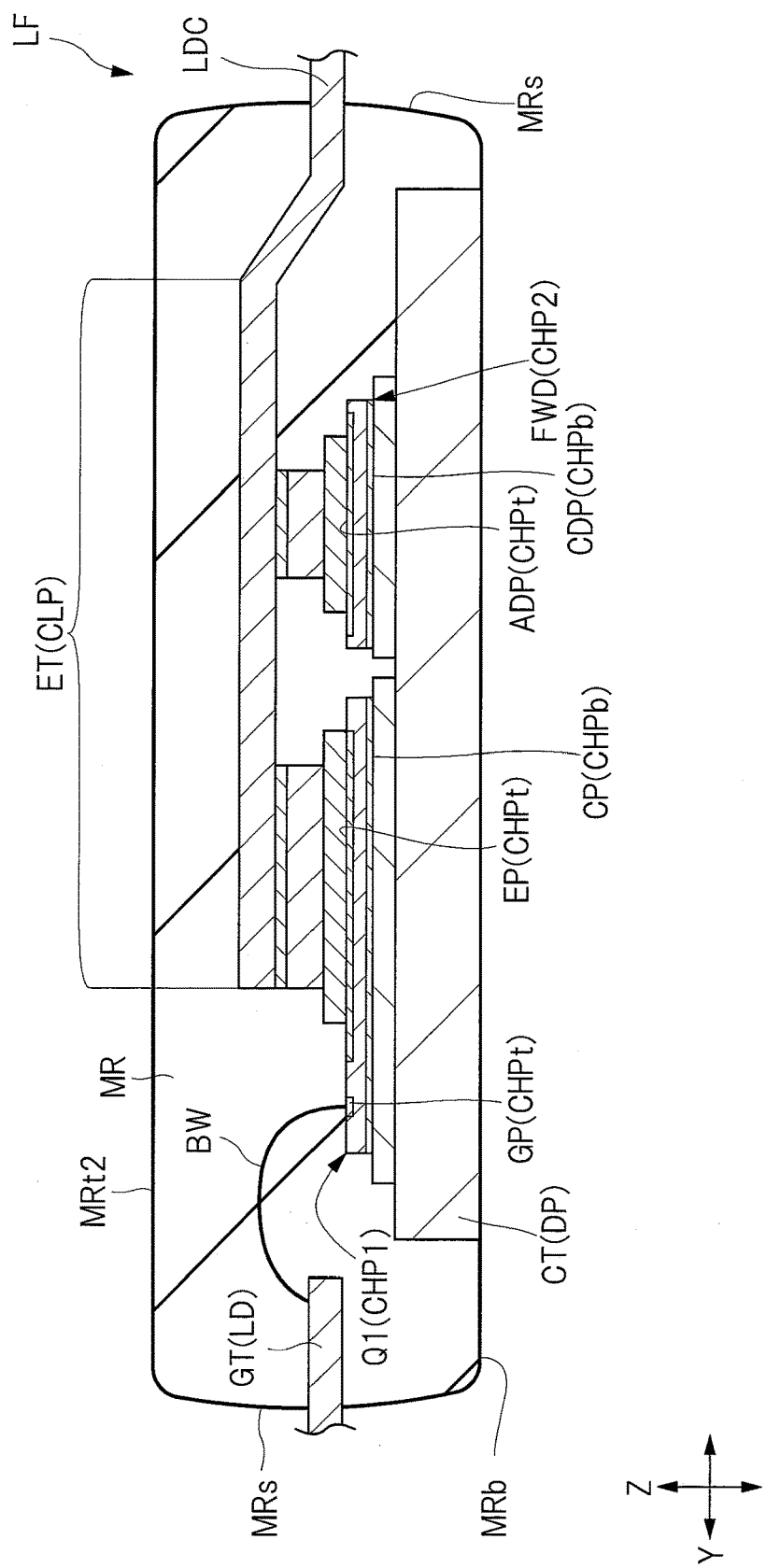
FIG. 26 is an enlarged cross-sectional view showing a state in which a sealing body for sealing the semiconductor chip is formed in a sealing process shown in FIG. 24.

Subsequently, in step S6 (sealing process) shown in FIG. 24, the semiconductor chips CHP1 and CHP2, and the wire BW are sealed with a resin. FIG. 26 is an enlarged cross-sectional view showing a state in which a sealing body for sealing a semiconductor chip is formed in the sealing process shown in FIG. 24.

In the present embodiment, in the sealing process, the sealing body MR is formed by, for example, a transfer mold method. In the transfer mold method, a resin is press-fitted into a cavity of a molding die (not shown) with the lead frame LF fixed in the molding die. The resin that constitutes the sealing body MR contains, for example, an epoxy type thermosetting resin as a main component and contains, for example, filler particles such as silica. When a resin is filled in the cavity of the molding die, a shape of the sealing body MR shown in FIGS. 24 and 26 is obtained. If the resin in the molding die is heated, and a part of the resin hardens to some extent, the lead frame LF can be removed from the molding die. After the lead frame is taken out from the molding die, the lead frame is further heated in a heating furnace (baking furnace) and the resin is in a final cure state (a cured state in which the whole of thermosetting resin components becomes cured). As a result, the sealing body MR as shown in FIG. 26 is obtained.

Meanwhile, after this process and before a polishing process shown in FIG. 24 is performed, the clip CLP is sealed with the sealing body MR as shown in FIG. 26. The upper surface MRt2 of the sealing body MR is a surface different from the main surface MRt shown in FIG. 15. On the other hand, the die pad DP is exposed from the main surface MRb of the sealing body MR. As a modification to the present embodiment, the sealing body MR may be formed so that the clip CLP is exposed from the sealing body MR in the sealing process.

The sealing of the clip CLP with a resin in the sealing process similarly to the present embodiment is advantageous in the following points. That is, in order to expose the upper surface of the clip CLP by the sealing process, the resin is press-fitted in a state where a portion of the cavity in the molding die (or a portion of a resin tape attached to the cavity) is brought into contact with the clip CLP. At this occasion, if a distance from a vertex of a wire loop of the wire BW to the cavity is short, there is a fear of the wire BW being deformed due to an influence of pressure of the supplied resin. The thickness of the semiconductor device can be reduced by reducing, in its thickness direction, a difference in height between the vertex of the wire loop of the wire BW and the upper surface of the clip CLP.

When the clip CLP is sealed by the sealing body MR in the sealing process as shown in the present embodiment, the vertex of the wire loop of the wire BW can be sufficiently separated from the cavity even if the height difference between the vertex of the wire loop and the upper surface of the clip CLP is small. Therefore, this can suppress deformation of the wire BW in the sealing process. However, when the wire BW is not used, or the height difference described above is, for example, sufficiently ensured and a possibility that the wire BW is deformed is small, the upper surface of clip CLP may be exposed in this process.

There is no reason as described above about the main surface MRb side of the sealing body MR. Therefore, in this process, the sealing body MR is formed so that the lower surface of the die pad DP is exposed from the main surface MRb of the sealing body MR as shown in FIG. 26.

Polishing

Subsequently, in step S7 (polishing process) shown in FIG. 24, an upper surface (main surface) MRt2 positioned opposite the main surface MRb (see FIG. 26) of the sealing body MR is polished, and the upper surface of the clip CLP is exposed from the main surface MRt of the sealing body MR.

In this process, the upper surface MRt2 side of the sealing body MR shown in FIG. 26 is mechanically polished using, for example, a whetstone. Incidentally, a polishing method includes various modifications, and not only a mechanical polishing method but also a chemical mechanical polishing (CMP) method may be performed. As a result of this process, as shown in FIG. 15, the upper surface of the clip CLP is exposed from the main surface MRt of the sealing body MR.

Incidentally, as mentioned above, this process can be omitted if the sealing body MR is formed so that the upper surface of the clip CLP is exposed from the sealing body MR in the sealing process.

Plating

Subsequently, in step S8 (plating process) shown in FIG. 25, as shown in FIG. 15, metal films are formed on the upper surface of the clip CLP exposed from the sealing body MR, the lower surface of the die pad DP exposed from the sealing body MR, and exposed portions of the leads LD and LDC exposed from the sealing body MR.

In this process, the lead frame LF (see FIG. 25) is immersed in a plating solution (omitted in Figures) which is an electrolytic solution containing, for example, a solder material, and a current flows through the lead frame LF regraded as a cathode electrode. As a result, the metal film SDF is selectively formed on the metal portion of the lead frame LF exposed from the sealing body MR which is made of a resin.

For example, when the solder is used as the connection member BND1 in mounting the semiconductor device PAC on the electronic device EA1 shown in FIG. 18, the metal film SDF formed by this process has a function of improving wettability of the solder. When the connection member BND1 is the solder, the metal film SDF and the connection member BND1 in melt and unite with each other. When the connection member BND1 is a conductive resin, the metal film SDF may not be formed.

Individualization

Subsequently, in step S9 (individualization process) shown in FIG. 25, a package for each sealing body MR is cut and separated from a frame portion LFF of the lead frame LF. Incidentally, FIGS. 23 to 25 show an example in which one package PKG is formed in one lead frame. The semiconductor device PAC can be actually manufactured in a manner shown in FIGS. 23 to 25. However, from the viewpoint of improving the manufacturing efficiency, a plurality of packages PKG are acquired from one lead frame LF in many cases. In this case, the plurality of packages PKG are separated from each other and individualized by separating the packages PKG from the frame portion LFF of the lead frame.

In this process, one portion of each of the plurality of leads LD and LDC is cut on its frame portion LFF side. In this process, tie bars TB, which connect the plural leads LD and the plural leads LDC with one another and are connected with the frame portion LFF, are cut. As a result, the package PKG is separated from the frame portion LFF and each of the plural leads LD and the plural leads LDC are separated from one another.

Incidentally, in FIG. 25, the individualization process and a lead formation process are shown separately, but the individualization process and the lead formation process may be collectively performed.

Lead Formation

Subsequently, in step S10 (lead formation process) shown in FIG. 25, the bending work is subjected to the plurality of leads LD, and a shape of the lead LD of the semiconductor device PAC1 shown in FIG. 18 or a shape of the lead LD of the semiconductor device PAC2 shown in FIG. 19 is obtained. A bending direction of the lead LD is as follows.

That is, the lead LD of the semiconductor device PAC1 shown in FIG. 18 is bent in a thickness direction of the semiconductor device PAC1 so that the tip of the lead LD is closer to the main surface MRt than the main surface MRb of the sealing body MR. The lead LD of the semiconductor device PAC2 shown in FIG. 19 is bent in a thickness direction of the semiconductor device PAC2 so that the tip of the lead LD is closer to the main surface MRb than the main surface MRt of the sealing body MR.

In the present embodiment, an unused lead(s) LD of the plural leads LD is (are) cut in the vicinity of the side surface MRs of the sealing body MR. In the present embodiment, the plural leads LDC are not used as the terminals of the semiconductor device PAC. Therefore, the plural leads LDC are cut in the vicinity of the side surface MRs of the sealing body MR.

Inspection

Subsequently, in step S11 (inspection process) shown in FIG. 25, necessary tests such as appearance inspection and electrical tests are performed onto the semiconductor device PAC. As a result of inspection, a semiconductor device PAC determined to have passed the test is packaged on the electronic device EA1 shown in FIG. 5. Alternatively, when the electronic device EA1 is assembled in another place, the semiconductor device PAC determined to have passed the test is shipped as a product.

Second Embodiment

Figure 27:
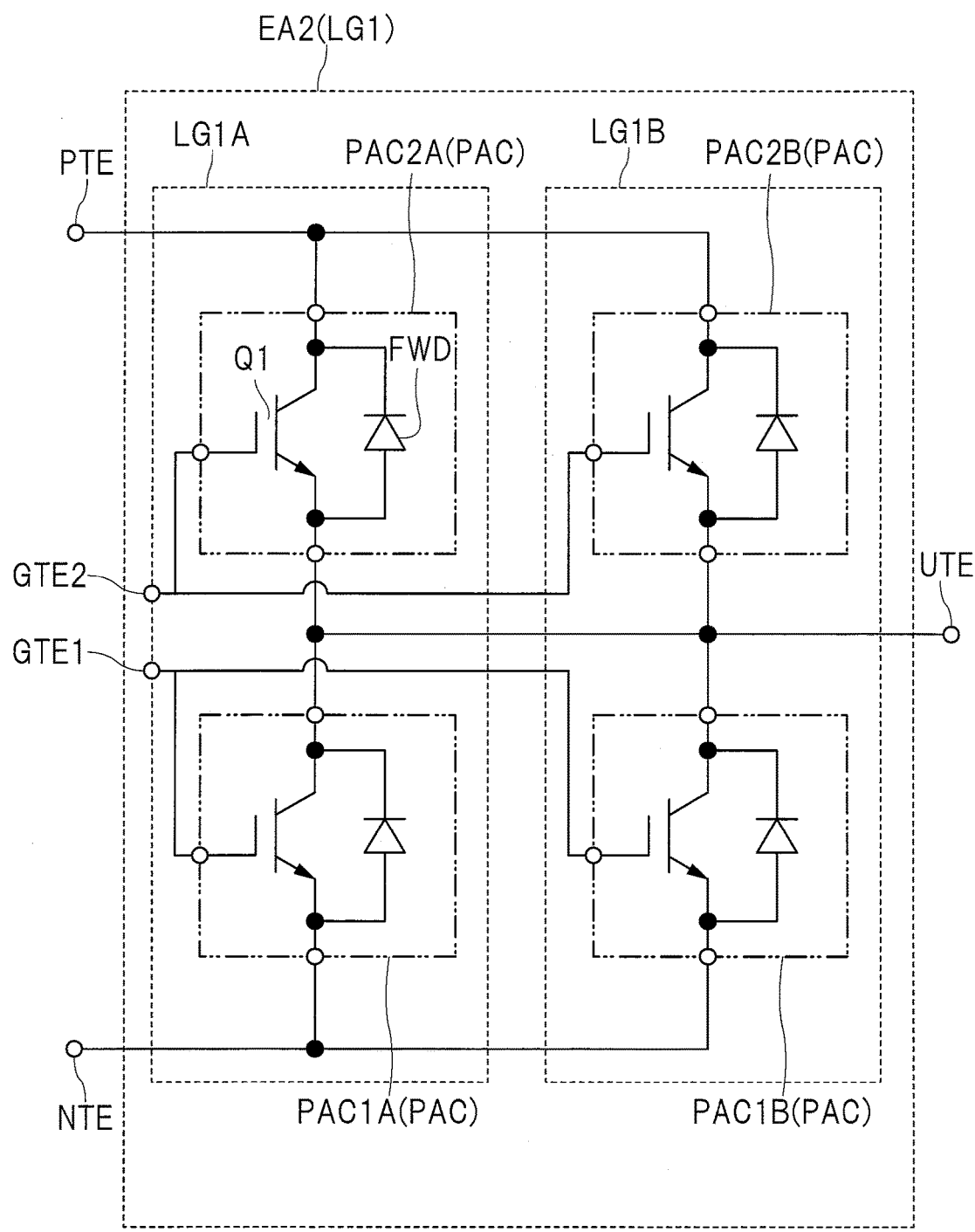
FIG. 27 is a circuit diagram showing an example of a circuit configuration of an electronic device according to a second embodiment.

Subsequently, an embodiment of an electronic device having a single-phase inverter circuit constituting any one of the legs LG1, LG2, and LG3 described with reference to FIG. 3 will be described as the second embodiment. FIG. 27 is a circuit diagram showing a configuration example of a circuit of the electronic device of this second embodiment. In FIG. 27, by paying attention to the leg LG1, which is one of the legs LG1 to LG3 of the inverter circuit INV as shown in FIG. 3, an example in which the leg LG1 is constituted by unit legs LG1A and LG1B is shown. Incidentally, in this second embodiment, a difference between the first and second embodiments will be mainly explained, and explanation overlapping with the explanation about the first embodiment will be basically omitted.

For example, just like the inverter circuit INV as shown in FIG. 3, each of the legs LG1 to LG3 in a generally-available inverter circuit is constituted by a single upper arm and a single lower arm. However, depending on a value of a current flowing through the inverter circuit, the current may be beyond a permissible amount of currents flowing through the upper and lower arms. Therefore, in this second embodiment, for example, an electronic device EA2 incorporated in the inverter circuit in which each of the legs LG1 to LG3 is constituted by a plurality of upper arms and a plurality of lower arms will be picked up and explained in view of the large current flowing through the inverter circuit.

A circuit that the electronic device EA2 shown in FIG. 27 has constitutes a portion corresponding to the leg LG1 shown in FIG. 3, but is different in that the unit legs LG1A and LG1B are included in the leg LG1. In the case of the electronic device EA2, the unit legs LG1A and leg LG1B are connected in parallel, and so even if a large current flows through the leg LG1, the current can be distributed to the unit legs LG1A and LG1B. That is, the electronic device EA2 is configured to allow a larger current to flow than the unit EAU1 shown in FIG. 27.

Packaging Aspect of Electronic Device

Figure 28:
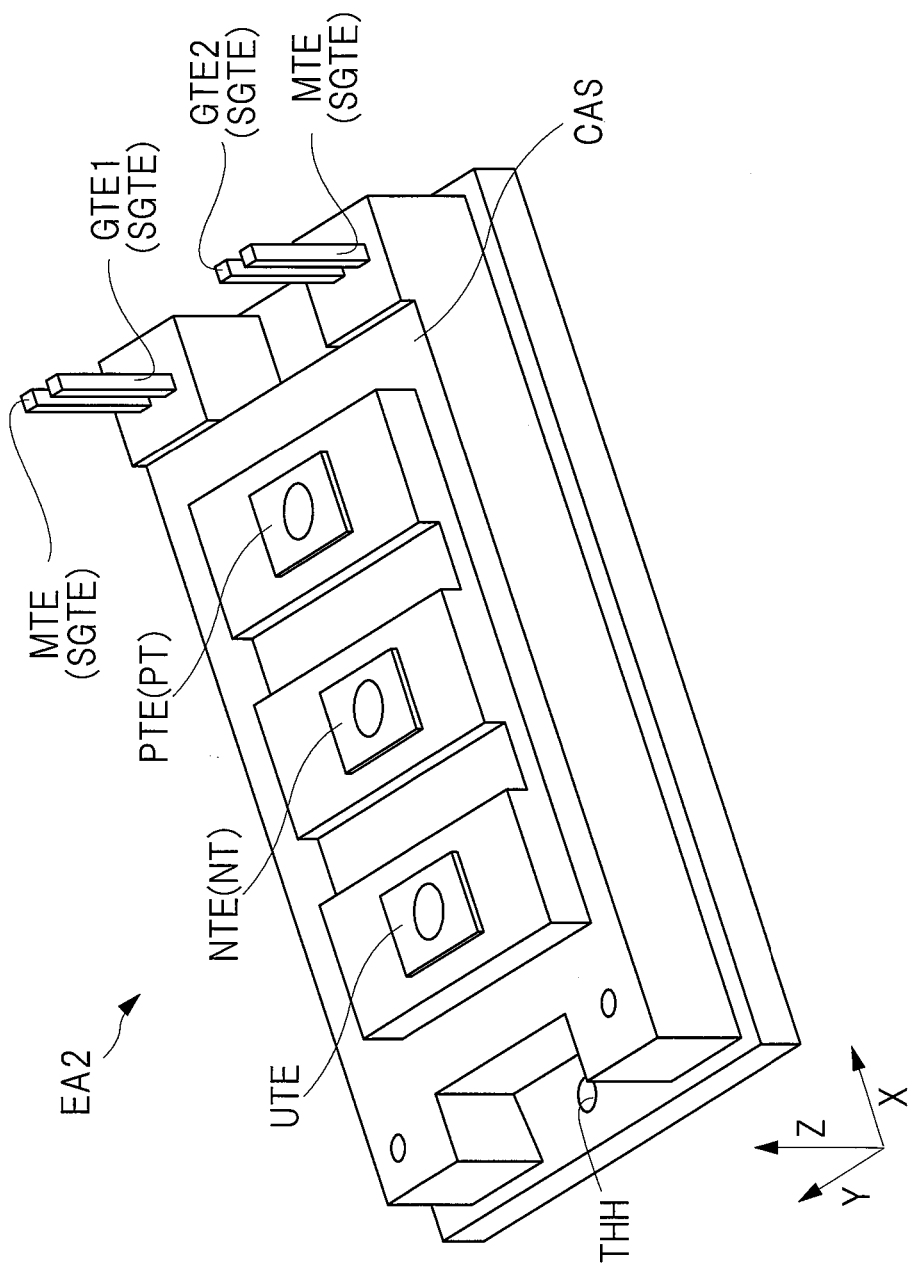
FIG. 28 is a perspective view showing an external appearance shape of the electronic device shown in FIG. 27.
Figure 29:
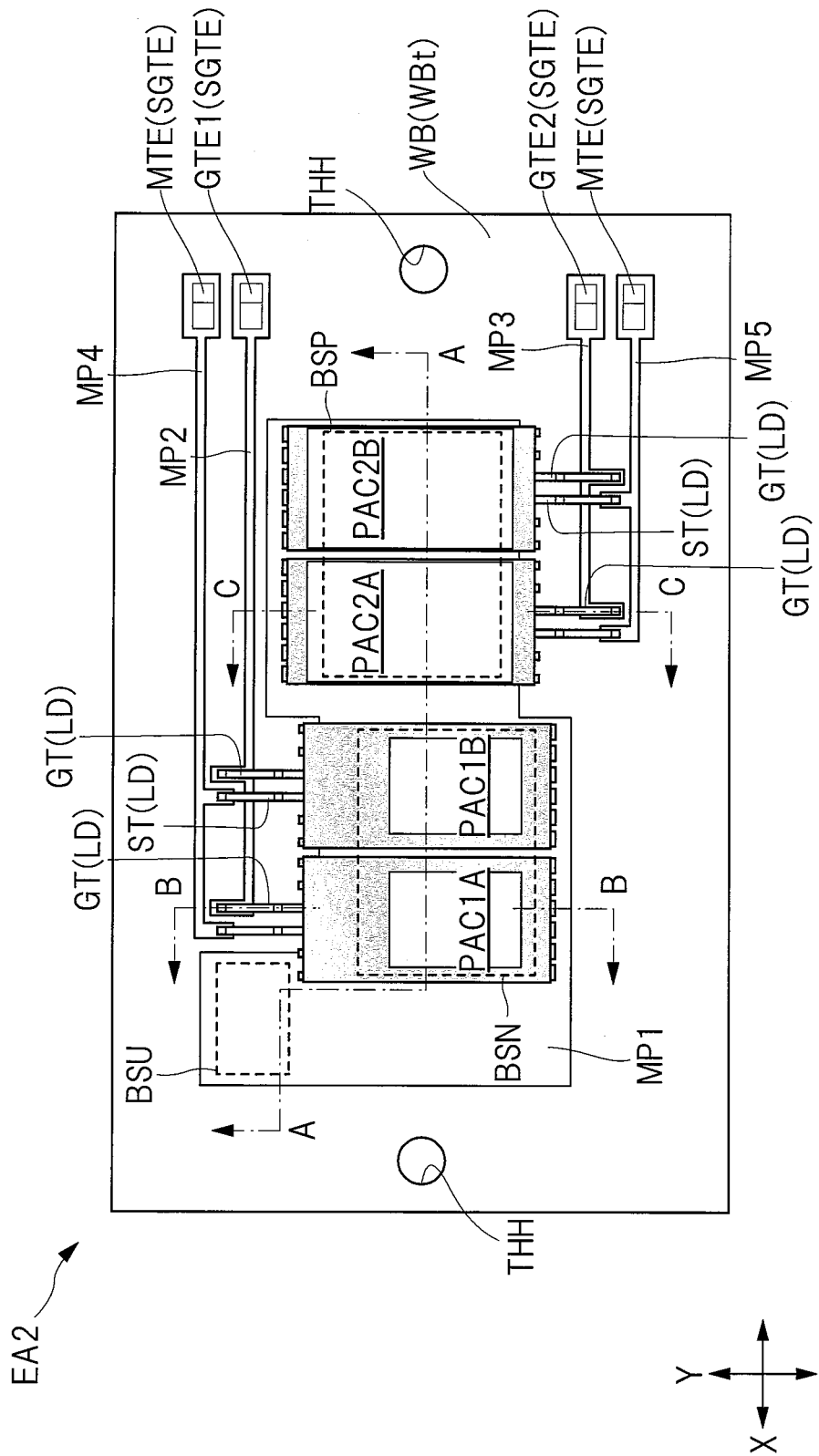
FIG. 29 is a plan view showing an internal structure of the electronic device shown in FIG. 28.
Figure 30:
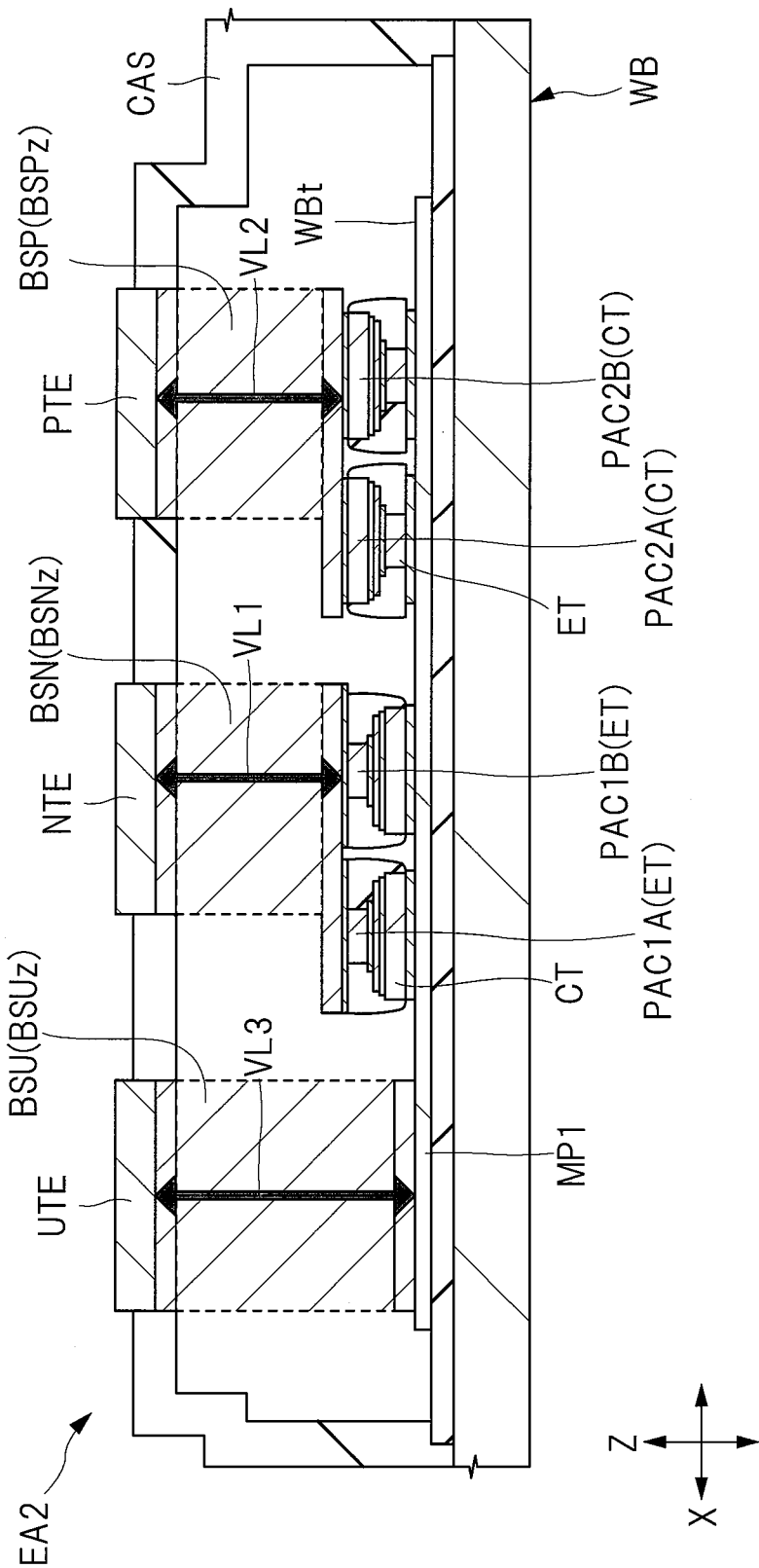
FIG. 30 is a cross-sectional view taken along line A-A in FIG. 29.
Figure 31:
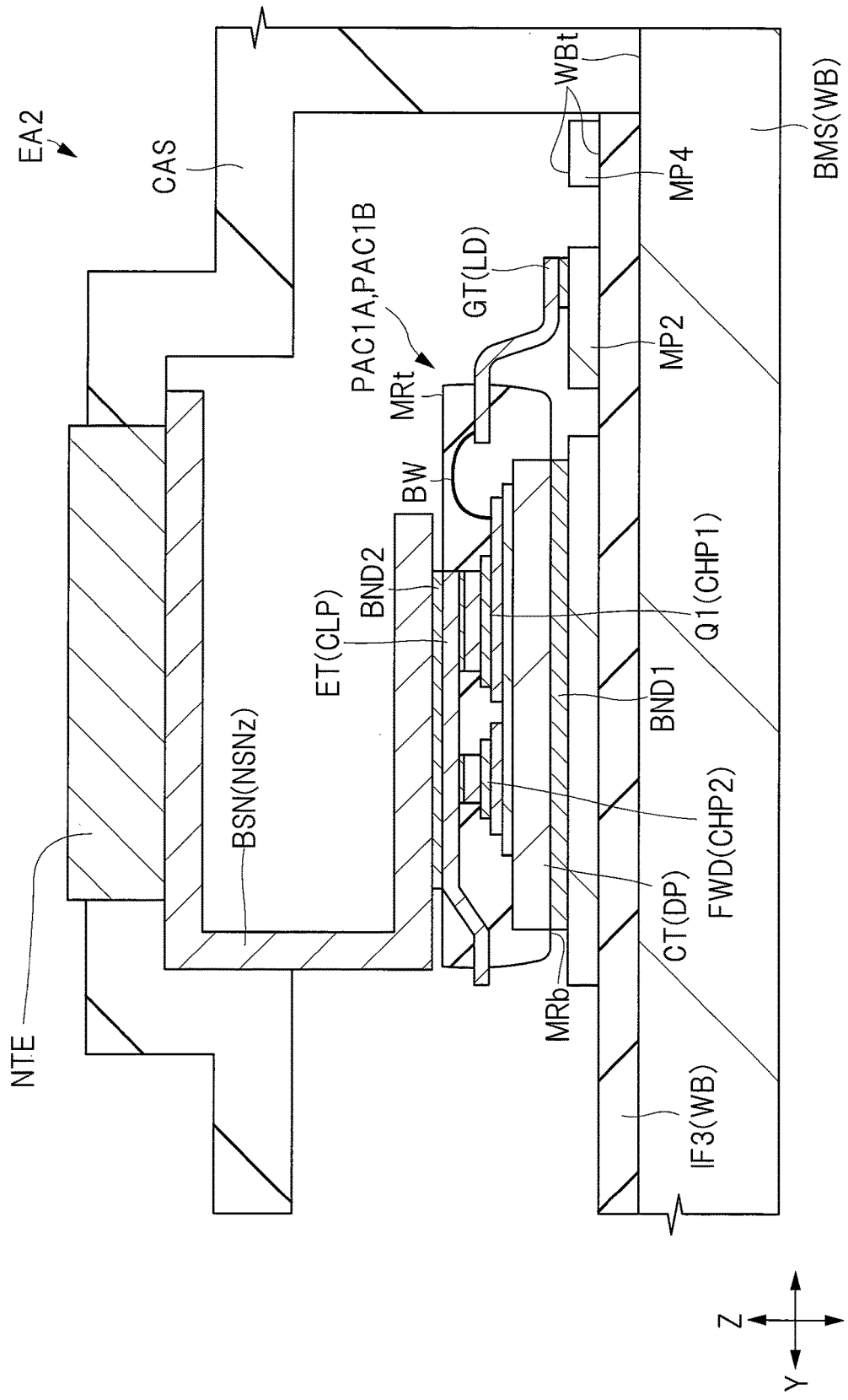
FIG. 31 is a cross-sectional view taken along line B-B in FIG. 29.

Subsequently, a packaging aspect of an electronic device corresponding to the circuit shown in FIG. 27 will be described. FIG. 28 is a perspective view showing an external appearance shape of the electronic device shown in FIG. 27. FIG. 29 is a plan view showing an internal structure of the electronic device shown in FIG. 28. In FIG. 29, each of the bus bars BSU, BSN, and BSP is denoted as a dotted line. FIG. 30 is a cross-sectional view taken along line A-A in FIG. 29. In FIG. 30, portions of the bus bars BSU, BSN, and BSP (portions extending in the thickness direction of the electronic device) are denoted as dotted lines. FIG. 31 is a cross-sectional view taken along line B-B in FIG. 29. FIG. 32 is a cross-sectional view taken along line C-C in FIG. 29.

As shown in FIG. 28, the electronic device EA2 according to the present embodiment has a rectangular flat surface shape and has a casing CAS from which a plurality of external terminals are exposed. The plurality of external terminals exposed from the casing CAS include the following terminals. That is, the electronic device EA1 has a terminal PTE and terminal NTE. For example, the electronic device EA2 has a terminal UTE which is a U-phase output terminal. The terminals UTE, NTE, and PTE are arranged alongside at a center portion of the casing CAS along an X direction in a plane view. As shown in FIG. 30, the terminals UTE, NTE, and PTE are located at portions of the casing CAS covering the upper surface WBt of the substrate WB.

The electronic device EA2 has a plurality of signal terminals SGTE which transmit signals between the semiconductor device and the device EA2. The plurality of signal terminals SGTE include terminals GTE1 and GTE2 which transmit gate signals to the semiconductor device. Further, the plural signal terminals SGTE each include, for example, a monitoring terminal MTE that outputs a signal for monitoring an operating state of the semiconductor device, such as temperature and a voltage, or a current. In the plan view, the plural signal terminals SGTE are arranged alongside along one short side of the casing CAS (along Y direction).

As shown in FIG. 29, the semiconductor devices PAC1A, PAC1B, PAC2A, and PAC2B are mounted on the upper surface WBt of the substrate WB. Each of the four semiconductor devices PAC1A, PAC1B, PAC2A, and PAC2B has a similar structure, and has the transistor Q1 and the diode FWD shown in FIG. 27. The semiconductor devices PAC1A and PAC2A constitute the unit leg LG1A shown in FIG. 27, and the semiconductor devices PAC1B and PAC2B constitute the unit leg LG1B shown in FIG. 27.

The semiconductor devices PAC1A and PAC1B are arranged adjacently to each other along the X direction. As shown in FIG. 30, the emitter terminals ET of the semiconductor devices PAC1A and PAC1B are electrically connected with each other via the bus bar BSN and are electrically connected with the terminal NTE. On the other hand, the collector terminals CT of the semiconductor devices PAC1A and PAC1B are electrically connected with each other via the conductor pattern MP1 and are electrically connected with the terminal UTE via the conductor pattern MP1 and bus bar BSU.

The semiconductor devices PAC2A and PAC2B are arranged adjacently to each other along the X direction. The collector terminals CT of the semiconductor devices PAC2A and PAC2B are electrically connected with each other via the bus bar BSP and are electrically connected with the terminal PTE. On the other hand, the emitter terminals ET of the semiconductor devices PAC2A and PAC2B are electrically connected with each other via the conductor pattern MP1 and are electrically connected with the terminal UTE via the conductor pattern MP1 and the bus bar BSU.

By arrangement as shown in FIG. 27, configured is an inverter circuit in which the unit legs LG1A and LG1B are electrically connected parallel to each other.

As shown in FIG. 29, the plurality of leads LD that each of the semiconductor devices PAC1A, PAC1B, PAC2A, and PAC2B has are connected with the conductor pattern MP2, MP3, MP4, or MP5 formed on the upper surface WBt of the substrate WB. More specifically, the gate terminal GT of the semiconductor device PAC1A and the gate terminal GT of the semiconductor device PAC1B are electrically connected with the terminal GTE1 via a conductor pattern (wiring pattern) MP2 extending along the X direction in the plan view. In other words, each of the gate terminals GT has a bent portion outside the sealing body MR and is connected with the terminal GTE1 via the substrate WB. The gate terminal GT of the semiconductor device PAC2A and the gate terminal GT of the semiconductor device PAC2B are electrically connected with the terminal GTE2 via a conductor pattern (wiring pattern) MP3 extending along the X direction in the plan view. In other words, each of the gate terminals GT has a bent portion outside the sealing body MR and is connected with the terminal GTE2 via the substrate WB.

The signal terminal ST of the semiconductor device PAC1A and the signal terminal ST of the semiconductor device PAC1B are electrically connected with the monitoring terminal MTE via a conductor pattern (wiring pattern) MP4 extending along the X direction in the plan view. The signal terminal ST of the semiconductor device PAC2A and the signal terminal ST of the semiconductor device PAC2B are electrically connected with the monitoring terminal MTE via a conductor pattern (wiring pattern) MP5 extending along the X direction in the plan view.

When the lead LD is connected with the conductor pattern of the substrate WB just like the electronic device EA2, the bending direction of the lead LD is different from those of the semiconductor devices PAC1 and PAC2 described in the above first embodiment. That is, as shown in FIG. 31, the leads LD that the semiconductor devices PAC1A and PAC1B have are folded in the thickness direction of the electronic device EA2 (Z direction shown in FIG. 31) so that the tip of the lead LD is closer to the main surface MRb than the main surface MRt of the sealing body MR. As shown in FIG. 32, the leads LD that the semiconductor devices PAC2A and PAC2B have are folded in the thickness direction of the electronic device EA2 (Z direction shown in FIG. 32) so that the tip of the lead LD is closer to the main surface MRt than the main surface MRb of the sealing body MR.

The electronic device EA1 in the second embodiment is different from the electronic device EA1 described in the first embodiment in the following points.

As shown in FIGS. 30 and 31, the bus bar BSN of the electronic device EA2 has a portion BSNz extending, in the thickness direction (Z direction) of the electronic device EA2 and from portions connected with the emitter terminals ET of the semiconductor devices PAC1A and PAC1B toward a portion connected with the terminal NTE. As shown in FIGS. 30 and 32, the bus bar BSP of the electronic device EA2 has a portion BSPz extending in the thickness direction (Z direction) of the electronic device EA2 and from portions connected with the collector terminals CT of the semiconductor devices PAC1A and PAC1B toward a portion connected with the terminal PTE. As shown in FIG. 30, the bus bar (conductive member, connection member, and conductor bar) BSU of the electronic device EA2 has a portion BSUz extending in the thickness direction (Z direction) of the electronic device EA2 and from a portion connected with the conductor pattern MP1 toward a portion connected with the terminal UTE.

As described above, each of the bus bars BSN, BSP, and BSU has the portion extending in the thickness direction of the electronic device EA2, so that the bus bars can be extended to positions close to the external terminals. As described in the first embodiment above, the bus bars BSN and BSP (and BSU) are bar-shaped conductive members placed in a path that electrically connects the terminal of the semiconductor device and the external terminal of the electronic device, and are conductor bars (conductive members) each having a path cross-sectional area sufficient for reducing the transmission loss. Therefore, in the case of the electronic device EA2, the transmission loss can be further reduced as compared with the electronic device EA1 described in the first embodiment.

As shown in FIG. 30, each of an extension distance VL1 of the bus bar BSN in the Z direction (thickness direction of the electronic device EA2) and an extension distance VL2 of the bus bar BSP in the Z direction is shorter than an extension distance VL3 of the bus bar BSU in the Z direction. Therefore, the electronic device EA2 can particularly reduce the inductance of the path connected with the terminal NTE and that of the path connected with the terminal PTE.

First Modification

In the foregoing, the invention made by the inventors of the present invention has been concretely described based on the embodiments. However, it is needless to say that the present invention is not limited to the foregoing embodiments and various modifications and alterations can be made within the scope of the present invention. Incidentally, several modification examples also in the above embodiments have been described, but typical modification examples except for the modification examples described in the above embodiments will be described below.

For example, in the first and second embodiments described above, an example using the IGBT as the transistor Q1 constituting the switching element has been described. However, as a modification, a power MOSFET may be used as the switching element of the inverter circuit. In the case of the power MOSFET, a body diode which is a parasitic diode is formed in the semiconductor element constituting the transistor. This body diode performs a function of the diode (freewheel diode) FWD shown in FIGS. 17 and 27. Therefore, if a semiconductor chip having a power MOSFET is used, a body diode is built in the semiconductor chip. Accordingly, when the power MOSFET is used, only one semiconductor chip may be mounted inside a single semiconductor device (semiconductor package).

In the case where the power MOSFET is used as the switching element of the inverter circuit, the first and second embodiments can be applicable thereto by replacing a portion described as "emitter" with "source", and a portion described as "collector" with "drain". Therefore, repeated descriptions thereabout will be omitted.

Second Modification

For example, in the first and second embodiments, the electronic devices having the external terminals different in shape have been described. There are various modifications about the shapes and the layouts of the external terminals of the electronic device. Therefore, the shapes of the external terminals described in the above first and second embodiments are merely an example, and is not limited thereto. For example, as a modification to the above first and second embodiments, if a portion of the bus bar BSN or BSP penetrates through the casing CAS and is exposed outside, the exposed portion can be used as an external terminal. Further, as a modification to the first and second embodiments, if a portion of the lead LD of the semiconductor device penetrates through the casing CAS and is exposed outside, the exposed portion can be used as an external terminal.

Third Modification

For example, in the above first and second embodiments, the embodiment in which the clip CLP is used as the emitter terminal ET and the die pad DP is used as the collector terminal CT has been described. However, there are various modifications about the structures and the shapes of the emitter terminal ET and the collector terminal CT. For example, the upper surface of the metal plate MPL1 shown in FIG. 15 may be exposed from the main surface MRt of the sealing body MR and used as the emitter terminal. Additionally, the emitter electrode EP of the semiconductor chip CHP1 may be exposed from the main surface MRt of the sealing body MR and used as the emitter terminal.

However, from the viewpoint of increasing the exposed area of the emitter terminal, the clip CLP is preferably used as the emitter terminal as described in the first embodiment.

Fourth Modification

For example, in the above first and second embodiments, the electronic device in which the bus bar is connected with the terminal of the semiconductor device and the substrate WB is covered with the casing has been described. However, there are various modifications about the aspects of the electronic devices. For example, before the plurality of semiconductor devices are mounted on the substrate WB and have not yet been covered with the casing CAS, the electronic device may be sipped as a product. Further, before the bus bar is connected with the semiconductor device, the electronic device may be shipped as a product. In this case, as shown in FIG. 20, the collector terminal CT of the semiconductor device PAC1 and the emitter terminal ET of the semiconductor device PAC2 are electrically connected with each other via the conductor pattern MP1. Therefore, the inductance of the path that electrically connects the collector terminal CT of the semiconductor device PAC1 and the emitter terminal ET of the semiconductor device PAC2 can be reduced.

Fifth Modification

For example, various modifications have been described above, but the modifications described above can be combined with and applied to each other.

What is claimed is:

1. An electronic device comprising:
   a casing;
   first, second, third, and fourth external terminals exposed from the casing;
   a substrate including a first surface and a first conductor pattern formed on the first surface;
   a first semiconductor device mounted on the first surface of the substrate; and
   a second semiconductor device mounted on the first surface of the substrate,
   wherein each of the first and second semiconductor devices comprises:
     a first semiconductor chip having a power transistor, and including a first front surface, a first front surface electrode formed on the first front surface, a second front surface electrode formed on the first front surface, a first back surface opposite the first front surface, and a first back surface electrode formed on the first back surface;
     a first terminal electrically connected with the first front surface electrode of the first semiconductor chip;
     a second terminal facing the first front surface of the first semiconductor chip, and electrically connected with the second front surface electrode of the first semiconductor chip;
     a third terminal facing the first back surface of the first semiconductor chip, and electrically connected with the first back surface electrode of the first semiconductor chip; and
     a sealing body including a first main surface, a second main surface opposite the first main surface, and a side surface between the first main surface and the second main surface, and sealing the first semiconductor chip,
   wherein the first terminal protrudes outside from the side surface of the sealing body,
   wherein the second terminal is exposed from the first main surface of the sealing body,
   wherein the third terminal is exposed from the second main surface of the sealing body,
   wherein the second main surface of the sealing body of the first semiconductor device faces the first surface of the substrate,
   wherein the first main surface of the sealing body of the second semiconductor device faces the first surface of the substrate,
   wherein the first back surface electrode of the first semiconductor device is electrically connected with the second front surface electrode of the second semiconductor device via the third terminal of the first semiconductor device and the first conductor pattern formed on the first surface of the substrate,
   wherein the first front surface electrode of the first semiconductor device is electrically connected with the first external terminal via the first terminal of the first semiconductor device,
   wherein the first front surface electrode of the second semiconductor device is electrically connected with the second external terminal via the first terminal of the second semiconductor device,
   wherein the second front surface electrode of the first semiconductor device is electrically connected with the third external terminal via the second terminal of the first semiconductor device and a first conductor bar arranged on the first main surface of the sealing body of the first semiconductor device, and
   wherein the first back surface electrode of the second semiconductor device is electrically connected with the fourth external terminal via the third terminal of the second semiconductor device and a second conductor bar arranged on the second main surface of the sealing body of the second semiconductor device.

2. The electronic device according to claim 1,
   wherein the casing includes a fifth external terminal, and
   wherein the first conductor pattern is connected with the fifth external terminal.

3. The electronic device according to claim 2,
   wherein a path distance of a first path electrically connecting the third external terminal and the second front surface electrode of the first semiconductor device is shorter than a path distance of a second path electrically connecting the fifth external terminal and the first back surface electrode of the first semiconductor device.

4. The electronic device according to claim 2,
   wherein a path distance of a third path electrically connecting the fourth external terminal and the second front surface electrode of the second semiconductor device is shorter than a path distance of a second path electrically connecting the fifth external terminal and the first back surface electrode of the first semiconductor device.

5. The electronic device according to claim 1,
   wherein each of the first and second conductor bars is electrically separated from all of conductor patterns including the first conductor pattern formed on the first surface of the substrate.

6. The electronic device according to claim 1,
   wherein the first surface of the substrate is covered with the casing.

7. The electronic device according to claim 1,
   wherein the first terminal of the first semiconductor device is connected with the first external terminal without interposing the substrate, and
   wherein the first terminal of the second semiconductor device is connected with the second external terminal without interposing the substrate.

8. The electronic device according to claim 7,
   wherein the first terminal of the first semiconductor device has, in a thickness direction of the sealing body, a bent portion that bends from a side of the second main surface toward a side of the first main surface, and wherein the first terminal of the second semiconductor device has, in the thickness direction of the sealing body, a bent portion that bends from the side of the first main surface toward the side of the second main surface.

9. The electronic device according to claim 1, wherein the substrate includes: a base material made of metal, an insulating film lying on one surface of the base material and having a thickness thinner than a thickness of the base material; and the first conductor pattern lying on the insulating film.

10. The electronic device according to claim 1, wherein each of the first and second semiconductor devices includes a second semiconductor chip, the second semiconductor chip having a second front surface, a third front surface electrode formed on the second front surface, a second back surface opposite the second front surface, and a second back surface electrode formed on the second back surface, wherein the second front surface electrode of the first semiconductor chip and the third front surface electrode of the second semiconductor chip are electrically connected via the second terminal, and wherein the first back surface electrode of the first semiconductor chip and the second back surface electrode of the second semiconductor chip are electrically connected via the third terminal.

11. The electronic device according to claim 1, wherein first, second, and third units arranged along a first direction in a plane view are mounted on the substrate, wherein each of the first, second, and third units includes the first and second semiconductor devices, wherein the first conductor bar includes a first portion extending along the first direction, and is connected with the second terminal of the first semiconductor device of the first unit, the second terminal of the first semiconductor device of the second unit, and the second terminal of the first semiconductor device of the third unit, and wherein the second conductor bar includes a second portion extending along the first direction, and is connected with the third terminal of the second semiconductor device of the first unit, the third terminal of the second semiconductor device of the second unit, and the third terminal of the second semiconductor device of the third unit.

12. The electronic device according to claim 11, wherein the first portion of the first conductor bar and the second portion of the second conductor bar overlap each other in a plane view.

13. The electronic device according to claim 12, wherein each of the first portion of the first conductor bar and the second portion of the second conductor bar is disposed in a plane view at a position overlapping each of the plural first semiconductor devices and the plural second semiconductor devices, and wherein each of a plurality of the first semiconductor devices and a plurality of the second semiconductor devices are arranged such that the first and second semiconductor devices are alternately adjacent to each other along the first direction.

14. The electronic device according to claim 11, wherein a thickness of each of the first portion of the first conductor bar and the second portion of the second conductor bar is thicker than a thickness of the first conductor pattern.

15. The electronic device according to claim 1, wherein the first surface of the substrate is covered with the casing, wherein the third and fourth external terminals are arranged in a portion that covers the first surface of the substrate on the casing, wherein the first conductor bar has a portion extending in a thickness direction of the electronic device from a connection portion with the second terminal of the first semiconductor device toward a connection portion with the third external terminal, and wherein the second conductor bar has a portion extending in the thickness direction of the electronic device from a connection portion with the third terminal of the second semiconductor device toward a connection portion with the fourth external terminal.

16. The electronic device according to claim 15, wherein the casing has a fifth external terminal, wherein the first conductor pattern has a third conductor bar that electrically connects the first conductor pattern and the fifth external terminal, and wherein the third conductor bar has a portion extending in the thickness direction of the electronic device from a connection portion with the first conductor pattern toward a connection portion with the fifth external terminal.

17. The electronic device according to claim 16, wherein each of an extension distance of the first conductor bar and an extension distance of the second conductor bar is shorter than an extension distance of the third conductor bar.

18. An electronic device comprising:

a substrate including a first surface and a first conductor pattern formed on the first surface;

a first semiconductor device mounted on the first surface of the substrate; and a second semiconductor device mounted on the first surface of the substrate, wherein each of the first and second semiconductor devices comprises:

a first semiconductor chip having a power transistor, a first front surface, a first front surface electrode formed on the first front surface, a second front surface electrode formed on the first front surface, a first back surface opposite the first front surface, and a first back surface electrode formed on the first back surface;

a first terminal electrically connected with the first front surface electrode of the first semiconductor chip;

a second terminal facing the first front surface of the first semiconductor chip, and electrically connected with the second front surface electrode of the first semiconductor chip;

a third terminal facing the first back surface of the first semiconductor chip, and electrically connected with the first back surface electrode of the first semiconductor chip; and a sealing body including a first main surface, a second main surface opposite the first main surface, and a side surface between the first main surface and the second main surface, and sealing the first semiconductor chip, wherein the first terminal protrudes outside from the side surface of the sealing body, wherein the second terminal is exposed from the first main surface of the sealing body, wherein the third terminal is exposed from the second main surface of the sealing body, wherein the second main surface of the sealing body of the first semiconductor device faces the first surface of the substrate, wherein the first main surface of the sealing body of the second semiconductor device faces the first surface of the substrate, wherein the first back surface electrode of the first semiconductor device is electrically connected with the second front surface electrode of the second semiconductor device via the third terminal of the first semiconductor device and the first conductor pattern formed on the first surface of the substrate, and wherein each of the second terminal of the first semiconductor device and the third terminal of the second semiconductor device is electrically separated from all of conductor patterns including the first conductor pattern, and the second terminal of the first semiconductor device and the third terminal of the second semiconductor device are electrically separated from each other.

* * * * *